(12) United States Patent
Asayama et al.

(10) Patent No.: US 8,339,300 B2
(45) Date of Patent: *Dec. 25, 2012

(54) DIGITAL-TO-ANALOG CONVERTER, ANALOG-TO-DIGITAL CONVERTER, AND SEMICONDUCTOR DEVICE

(75) Inventors: Go Asayama, Kanagawa (JP); Noriyuki Fukushima, Kanagawa (JP); Yoshikazu Nitta, Kanagawa (JP); Yoshinori Muramatsu, Kanagawa (JP); Kiyotaka Amano, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/098,206

(22) Filed: Apr. 29, 2011

(65) Prior Publication Data

US 2011/0205097 A1   Aug. 25, 2011

Related U.S. Application Data

(63) Continuation of application No. 12/426,731, filed on Apr. 20, 2009, now Pat. No. 7,936,294, which is a continuation of application No. 11/974,266, filed on Oct. 12, 2007, now Pat. No. 7,522,082, which is a continuation of application No. 11/526,512, filed on Sep. 25, 2006, now Pat. No. 7,324,033.

(30) Foreign Application Priority Data

Sep. 26, 2005   (JP) ................................ 2005-277190

(51) Int. Cl.
H03M 1/66 (2006.01)
(52) U.S. Cl. .......................... 341/145; 341/144; 341/155

(58) Field of Classification Search .................. 341/118, 341/144, 145, 155, 172, 150, 153
See application file for complete search history.

(56) References Cited

U.S. PATENT DOCUMENTS

| 4,498,141 A | 2/1985 | Cooper |
|---|---|---|
| 4,868,571 A | 9/1989 | Inamasu |
| 5,914,682 A | 6/1999 | Noguchi |
| 6,268,817 B1 | 7/2001 | Min et al. |
| 6,411,237 B1 | 6/2002 | Lautzenhiser |
| 6,906,653 B2 | 6/2005 | Uno |

FOREIGN PATENT DOCUMENTS

| JP | 05-191290 | 7/1993 |
|---|---|---|
| JP | 11-017545 | 1/1999 |
| JP | 2000-152082 | 5/2000 |
| JP | 2002-232291 | 8/2002 |

*Primary Examiner* — Jean B Jeanglaude
(74) *Attorney, Agent, or Firm* — Robert J. Depke; Rockey, Depke & Lyons, LLC

(57) ABSTRACT

A DA conversion device includes the following elements. A higher-bit current source cell portion includes uniformly weighted higher-bit current source cells to generate an identical constant current. A lower-bit current source cell portion includes a lower-bit current source cells that are weighted to generate 1/two-to-the-power-of-certain-numbers constant currents. A constant current source selection controller includes a lower-bit controller having a scaler that uses clocks scaled down to 1/two-to-the-power-of-certain-numbers to select the lower-bit current source cells, and a higher-bit controller having shift registers and using a signal indicating a carry bit or a borrow bit used in the lower-bit controller to sequentially activate shift outputs of the shift registers, and uses the shift outputs to select the higher-bit current source cells. Constant current outputs of the selected current source cells are added and output so that an output current corresponding to the digital input signal is obtained.

9 Claims, 17 Drawing Sheets

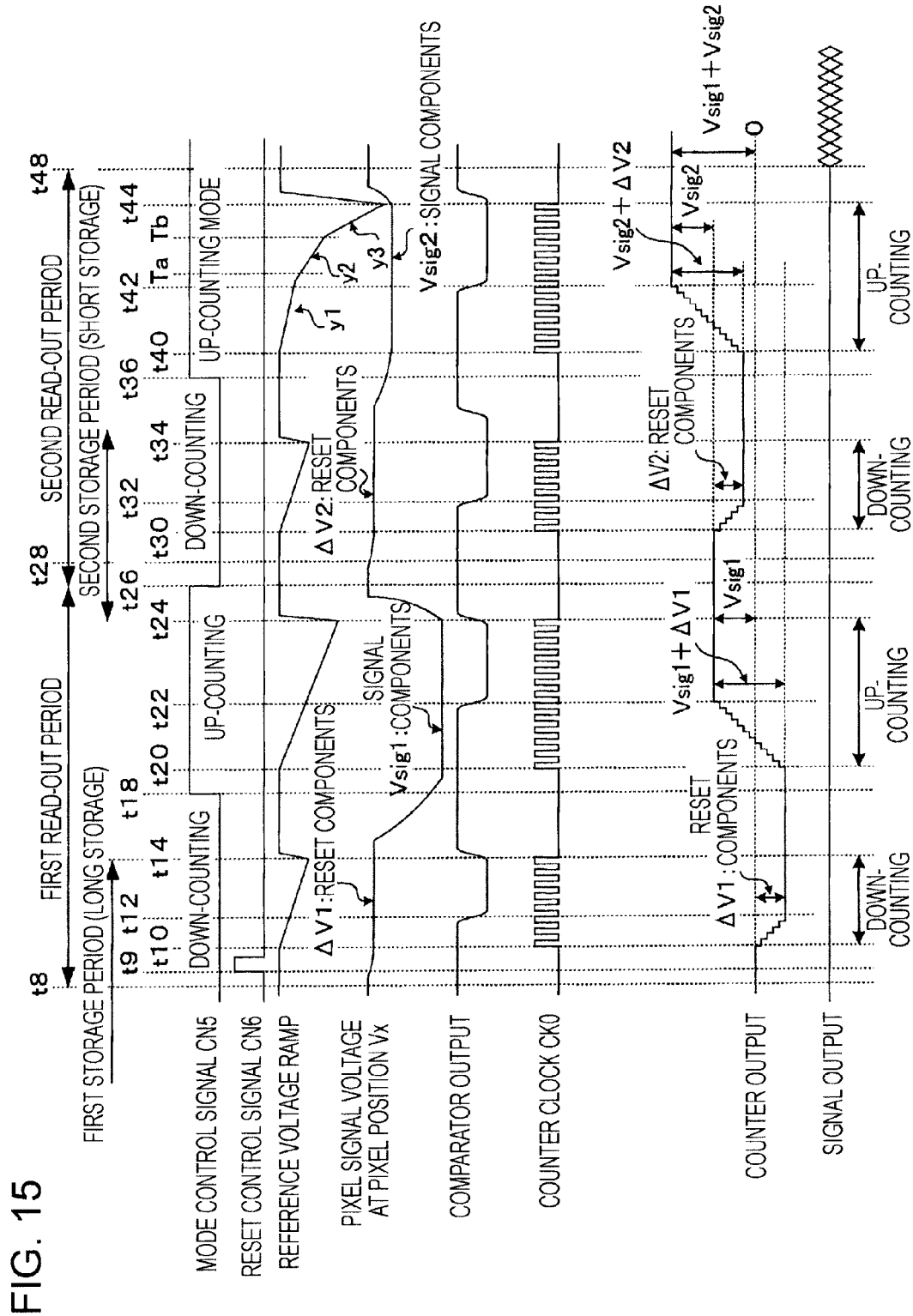

DIGITAL-TO-ANALOG CONVERTER, ANALOG-TO-DIGITAL CONVERTER, AND SEMICONDUCTOR DEVICE

CROSS REFERENCES TO RELATED APPLICATIONS

The subject matter of application Ser. No. 12/426,731 is incorporated herein by reference. The present application is a continuation of U.S. application Ser. No. 12/426,731, filed Apr. 20, 2009, now U.S. Pat. No. 7,936,294, issued May 3, 2011, which is a continuation of U.S. application Ser. No. 11/974,266, filed Oct. 12, 2007, now U.S. Pat. No. 7,522,082, issued Apr. 21, 2009, which is a continuation of Ser. No. 11/526,512, filed Sep. 25, 2006, now U.S. Pat. No. 7,324,033, issued Jan. 29, 2008, which claims priority to Japanese Patent Application JP 2005-277190 filed in the Japanese Patent Office on Sep. 26, 2005, the entire contents of which are incorporated herein by reference.

BACKGROUND OF THE INVENTION

1. Field of the Invention

The present invention relates to a digital-to-analog (DA) converter for converting digital signals into analog signals, an analog-to-digital (AD) converter including this DA converter, and a semiconductor device, such as an imaging device. More particularly, the invention relates to a DA conversion mechanism using a current source cell matrix including an array-structured current source cells.

2. Description of the Related Art

Various DA converters for converting digital signals into analog signals are used in electronic apparatuses.

Physical-quantity-distribution detecting semiconductor devices including a plurality of unit elements (for example, pixels) which are disposed in a line or a matrix and which are responsive to electromagnetic waves, such as light or radiation, input from an external source are used in various fields.

For example, in the field of video equipment, charge-coupled device (CCD), metal oxide semiconductor (MOS), or complementary metal-oxide semiconductor (CMOS)-type solid-state imaging devices for detecting light, which is one example of physical quantities, are used. Such imaging devices read a physical quantity distribution obtained by converting light into an electric signal by using the unit elements (pixels in the solid-state imaging apparatuses). In the solid-state imaging devices, "solid-state" means that the imaging devices are formed of semiconductor.

One type of solid-state imaging device is an amplifying solid-state imaging device including active pixel sensors (APS), which are also referred to as "gain cells", each active pixel sensor using an amplifying transistor in an image signal generator for generating pixel signals in accordance with signal charge generated by a charge generator. Many CMOS-type solid-state imaging devices have this type of structure.

In such an amplifying solid-state imaging device, to read out pixel signals to the exterior from the imaging device, address control is performed on a pixel portion including a plurality of unit pixels so that pixel signals can be selected from the corresponding unit pixels. That is, the amplifying solid-state imaging device is one example of address-control solid-state imaging device.

For example, in an amplifying solid-state imaging device, which is one type of X-Y address solid-state imaging device including unit pixels disposed in a matrix, MOS active elements (MOS transistors) are used for forming the pixels so that the pixels have an amplifying function by themselves. That is, signal charge (photoelectrons) stored in photodiodes, which are photoelectric transducers, is amplified by the active elements and is read as image information.

In this type of X-Y address solid-state imaging device, many pixel transistors are disposed in a two-dimensional matrix to form a pixel portion. Signal charge corresponding to incident light is stored line by line or pixel by pixel, and current or voltage signals in accordance with the stored signal charge are sequentially read out from the individual pixels by addressing. In most of the MOS (including CMOS)-type solid-state imaging devices, unit pixels are accessed line by line and pixel signals in one line are read out from the pixel portion to the exterior. In some of the MOS (or CMOS)-type solid-state imaging devices, analog pixel signals read out from the pixel portion are converted into digital signals by an AD converter before being output to the exterior (see, for example, Japanese Unexamined Patent Application Publication Nos. 2000-152082 and 2002-232291).

As disclosed in the above-described publications, there are various methods for performing AD conversion in terms of the circuit scale, processing speed, and resolution. One of the AD conversion methods is so-called "single-slope-integrating or ramp-signal-comparison AD conversion method". In this method, an analog unit signal is compared with a reference signal which varies monotonously and used for digital signal conversion, and simultaneously with this comparison operation, counting is started. Then, based on the count value when the comparison operation is finished, a digital signal is obtained. In this type of AD conversion method, a DA converter is sometimes used for generating the reference signal.

There are also various methods for performing DA conversion in terms of the circuit scale, processing speed, and resolution. In one of the DA conversion methods, many current source cells weighted with predetermined current values are used, and among those current source cells, predetermined current source cells are selected based on a multi-bit digital input signal, and then, constant current outputs of the selected current source cells are added to each other. As a result, an analog current output corresponding to a digital input signal can be obtained.

In this type of DA converter, various modes can be employed in selecting current source cells corresponding to a digital input signal. One mode is a decoding mode (see Japanese Unexamined Patent Application Publication No. 5-191290). In the decoding mode, many current source cells uniformly weighted with a predetermined current value are used, and a multi-bit digital input signal is decoded into a decimal number. Then, current source cells are selected in accordance with the decimal number. Another mode is a binary mode in which a plurality of current source cells for outputting currents weighted with two to the power of certain numbers (or 1/two-to-the-power-of-certain-numbers) are used, and current source cells in accordance with the bit value of a multi-bit digital input signal are selected. Another mode is a composite mode (see Japanese Unexamined Patent Application Publication No. 11-17545). In the composite mode, a multi-bit digital input signal is divided into higher bits and lower bits, and the decoding mode is applied to the higher bits and the binary mode is applied to the lower bit.

In the composite mode, in the case of the higher bits, many current source cells uniformly weighted with a predetermined current value are prepared, and then, the higher bits of the multi-bit digital input signal are decoded into a decimal number, and the decimal number is latched. Then, current source cells are selected in accordance with the decimal number. In the case of the lower bits, many current source cells uniformly weighted with 1/two-to-the-power-of-certain-numbers of the current value weighted for the current source cells corresponding to the higher bits are prepared, and then, the lower bits of the multi-bit digital input signal are latched. Then, current source cells are selected in accordance with the lower bits. Subsequently, by adding the output currents of the current source cells selected for the higher bits and the lower bits on the basis of the latched values, an analog current output corresponding to the digital input signal value can be obtained. For the decoding of the higher bits, full decoding is performed.

SUMMARY OF THE INVENTION

In the known composite mode, however, higher bits subjected to the full decoding mode and lower bits subjected to the binary mode are operated independently. Even if the latching timing is the same between the higher bits and the lower bits, if a digital signal is input at high speed, it becomes difficult to perform decoding and latching reliably and speedily to select current source cells even though the full decoding mode and the binary mode are operated at the same time. The reason for this is that, in particular, the full decoding mode is not suitable for high speed, and as a result, glitch or erroneous coding occurs and it is difficult to obtain stable analog signals.

It is thus desirable to provide a DA conversion mechanism that can solve the problem of the occurrence of glitch or erroneous coding, for example, a DA conversion mechanism suitable for generating a reference signal which monotonously varies and which is used for single-slope integrating AD conversion method.

In an embodiment of the present invention, as in the invention disclosed in Japanese Unexamined Patent Application Publication No. 11-17545, a digital input is first divided into higher bits and lower bits, and then, the selection of current source cells is controlled for each of the higher bits and the lower bits. Accordingly, in a higher-bit current source cell portion controlled by a higher-bit controller, a plurality of higher-bit current source cells that are uniformly weighted to generate an identical constant current are disposed. In a lower-bit current source cell portion controlled by a lower-bit controller, a plurality of lower-bit current source cells that generate bit-weighted constant currents are disposed.

The lower-bit controller includes a scaler that performs a scaling operation, i.e., a binary counter operation, based on an input count clock and that uses clocks scaled down to 1/two-to-the-power-of-certain-numbers obtained by the scaling operation as a selection control signal to select the lower-bit current source cells weighted with the corresponding current values. The higher-bit controller includes the same number of shift registers as the number of higher-bit current source cells and uses, as a shift clock, a signal indicating a carry bit or a borrow bit used in the scaling operation controlled by the lower-bit controller to sequentially activate shift outputs of the shift registers, and uses the shift outputs as a selection control signal to select the higher-bit current source cells.

The lower-bit controller performs the scaling operation based on the count clock, and the higher-bit controller performs the shift operation by using, as a shift clock, a signal indicating a carry bit or a borrow bit generated while the scaling operation is performed. Accordingly, the lower-bit controller and the higher-bit controller perform the operations, not independently, but cooperatively (synchronously). Then, the higher-bit controller can reliably select the current source cells corresponding to the subsequent bit data.

With this configuration, the occurrence of glitch or erroneous coding, which would be caused by the independent operation of higher bits subjected to the decoding mode and lower bits subjected to the binary mode, can be prevented. As a result, it is possible to provide a DA conversion device suitable for single-slope-integrating AD conversion that requires a reference signal presenting monotonous changing characteristics.

BRIEF DESCRIPTION OF THE DRAWINGS

FIG. 15 illustrates gamma correction by changing the slope of a reference signal to increase the dynamic range.

DESCRIPTION OF THE PREFERRED EMBODIMENTS

An embodiment of the present invention is described in detail below with reference to the accompanying drawings in the context of a CMOS-type imaging device, which is an example of an X-Y address solid-state imaging device. A description is given below, assuming that all pixels used in the CMOS-type imaging device are NMOS or PMOS pixels.

The CMOS-type imaging device is an example only, and the type of device used in the following embodiment is not restricted to a MOS imaging device, and the following embodiment is applicable to all physical-quantity-distribution detecting semiconductor devices including a plurality of unit elements which are disposed in a line or matrix and which are responsive to electromagnetic waves, such as light or radiation, input from an external source.

Configuration of Solid-State Imaging Device

Figure 1:
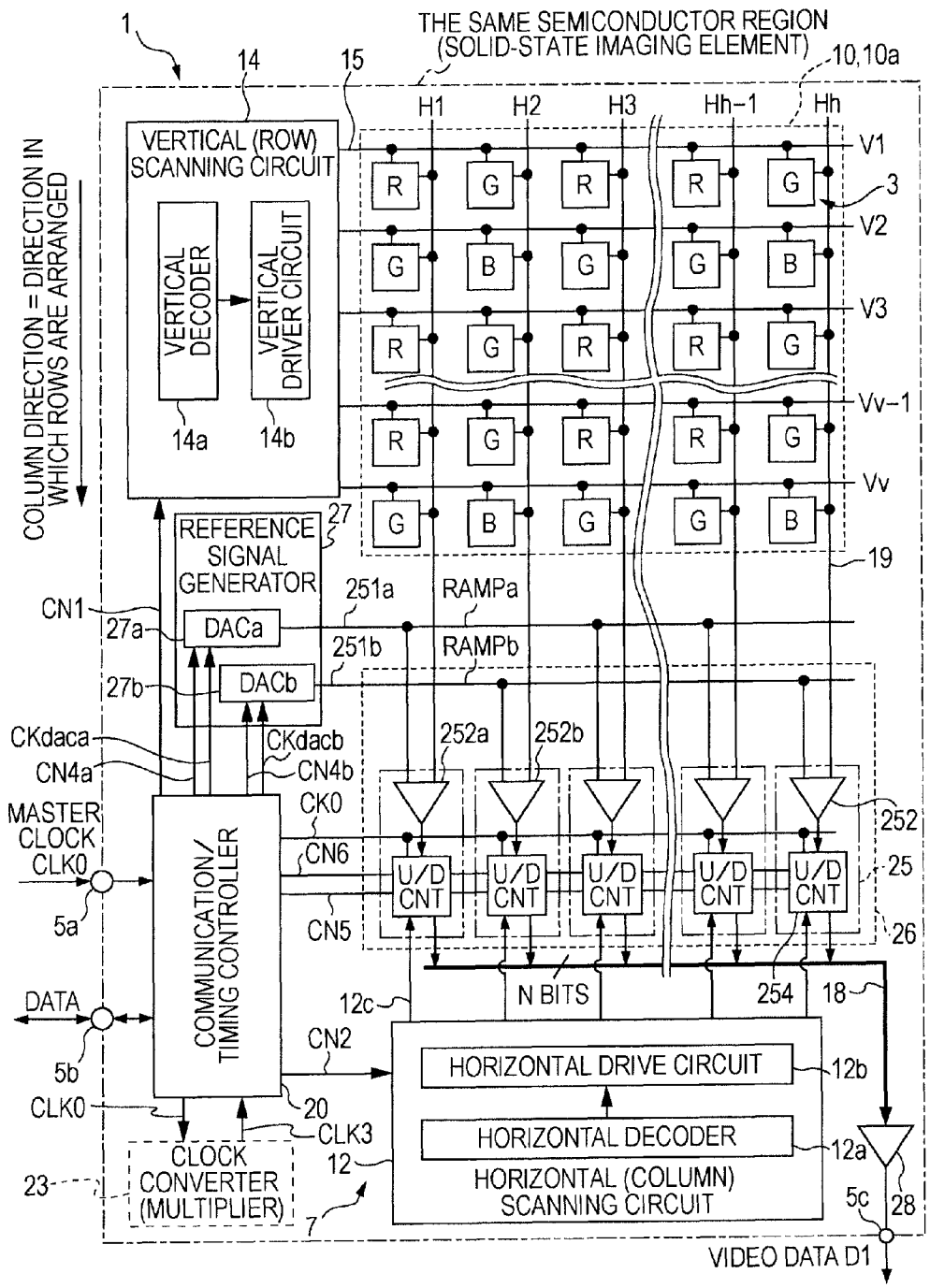
FIG. 1 is a schematic diagram illustrating a CMOS-type solid-state imaging device according to an embodiment of the present invention.

FIG. 1 is a schematic diagram illustrating a CMOS-type solid-state imaging device (CMOS-type image sensor) 1, which serves as a semiconductor device according to an embodiment of the present invention.

The solid-state imaging device 1 includes a two-dimensional-matrix pixel portion 10. In the pixel portion 10, a plurality of pixels having photodetectors (which serve as a charge generator) that output signals in accordance with the quantity of incident light are disposed in rows and columns, i.e., in a matrix form. A signal output from each pixel serves as a voltage signal. The solid-state imaging device 1 also includes correlated double sampling (CDS) processing functions and AD converters, which are disposed in parallel in the column direction.

More specifically, a plurality of CDS processing functions and AD converters are provided substantially parallel with vertical signal lines 19. When viewed from the top of the solid-state imaging device 1, the plurality of CDS processing functions and AD converters may be disposed only at one edge (output side at the bottom in FIG. 1) of the pixel portion 10, or may be disposed both at one edge (output side at the bottom in FIG. 1) and at the other edge (output side at the top in FIG. 1) of the pixel portion 10. If the CDS processing functions and AD converters are disposed at both the edges of the pixel portion 10, it is preferable that horizontal scanners for reading in the row direction (horizontal scanning) are also disposed at both the edges and are operated independently.

A typical form of arranging CDS processing functions and AD converters is a column type in which a plurality of CDS processing functions and AD converters are provided in a column region disposed at the output side of the imaging portion 10, one CDS processing function and one AD converter being provided for each vertical column, and signals are sequentially read out to the output side. Alternatively, a CDS processing function and an AD converter may be assigned to a plurality of adjacent (for example, two) vertical signal lines (vertical columns) 19, or a CDS processing function and an AD converter may be assigned to N vertical signal lines 19 in every N signal lines 19 (N is a positive integer).

In any form other than the column type, a plurality of vertical signal lines 19 (vertical columns) use the common CDS processing function and the common AD converter. Accordingly, a changeover circuit (switch) is provided for switching pixel signals for a plurality of columns output from the pixel portion 10 to be supplied to a common CDS processing function and a common AD converter. It may be necessary to provide a memory for storing output signals depending on the processing of a subsequent stage.

In any form other than the column type, by applying one CDS processing function and one AD converter to a plurality of vertical signal lines (vertical columns) 19, signal processing can be performed on pixel signals column by column after the pixel signals are read from the pixel columns. Accordingly, compared with performing similar signal processing in each unit pixel, the configuration of a unit pixel can be simplified, and thus, a multi-pixel, smaller, and less expensive image sensor can be implemented.

Additionally, pixel signals for one row can be simultaneously processed in a plurality of column-parallel-structured signal processors (CDS processing functions and AD converters) disposed. Accordingly, compared with a case where pixel signals are processed by a single CDS processing function or a single AD converter in an output circuit or outside the imaging device, the signal processors can be operated at lower speed, which is advantageous in terms of the power consumption, band performance, noise, etc. In other words, if the power consumption and band performance are the same, the entire imaging sensor can be operated at higher speed.

The column type, which can operate at a lower speed, is advantageous in terms of the power consumption, band performance, noise, etc. Additionally, the provision of a changeover circuit (switch) is not necessary. In the following description, it should be assumed that the column type is used unless otherwise stated.

The solid-state imaging device 1 includes, as shown in FIG. 1, the pixel portion (imaging portion) 10 in which a plurality of unit pixels 3 formed generally in the shape of a square are disposed in rows and columns (i.e., in a matrix), a drive controller 7, a column processor 26, a reference signal generator 27 that supplies an AD conversion reference signal to the column processor 26, and an output circuit 28. The drive controller 7, the column processor 26, the reference signal generator 27, and the output circuit 28 are disposed outside the pixel portion 10.

If necessary, at the stage before or after the column processor 26, an auto gain control (AGC) circuit having a signal amplifying function may be provided in the same semiconductor region as the column circuit 26. If AGC is performed before the column processor 26, analog amplification is employed, and if AGC is performed after the column processor 26, digital amplification is employed. If an n-bit digital signal is directly amplified, the grayscale may be impaired. Accordingly, it is preferable that analog amplification is conducted first, and then, the amplified signal is converted into a digital signal.

The drive controller 7 includes control circuit functions of sequentially reading signals from the pixel portion 10. More specifically, the drive controller 7 includes a horizontal scanning circuit (column scanning circuit) 12 for controlling column addressing or column scanning, a vertical scanning circuit (row scanning circuit) 14 for controlling row addressing or row scanning, and a communication/timing controller 20 having a function of generating an internal clock.

As indicated by the broken lines in the vicinity of the communication/timing controller 20 in FIG. 1, a clock converter 23, which is an example of a high-speed clock generator, for generating pulses having a clock frequency higher than an input clock frequency may be disposed. The communication/timing controller 20 generates an internal clock based on an input clock (master clock) CLK0 input through a terminal 5a or a high-speed clock generated in the clock converter 23.

The use of a signal based on a high-speed clock generated in the clock converter 23 achieves fast AD conversion processing. The use of a high-speed clock also makes it possible to perform motion extraction or compression that requires fast computation. Parallel data output from the column processor 26 can be converted into serial data and is output to the exterior of the imaging device 1 as video data D1. With this configuration, a fast operation can be implemented with a smaller number of terminals than the number of bits of a digital signal converted from an analog signal.

The clock converter 23 has a built-in multiplier circuit for generating pulses having a clock frequency higher than the input clock frequency. The clock converter 23 receives a low-speed clock CLK2 from the communication/timing controller 20, and generates a clock having a frequency at least twice as high as the low-speed clock CLK2. If k1 is a factor of the low-speed clock CLK2, a k1 multiplier circuit is provided for the clock converter 23, and known various circuits can be used as the multiplier circuit.

In FIG. 1, for simple representation, not all of the rows and columns are shown. In reality, several tens of to several thousands unit pixels 3 are disposed in each row or each column to form the pixel portion 10. Typically, each unit pixel 3 includes a photodiode, which serves as a photodetector (charge generator), and an inter-pixel amplifier having an amplifying semiconductor element (for example, a transistor).

As the inter-pixel amplifier, a floating diffusion amplifier, may be used. For example, a floating diffusion amplifier including four transistors, which are generally used in a CMOS-type sensor, i.e., a floating diffusion amplifier including a read-out selection transistor, which is an example of a charge reader (transfer gate/read-out gate), a reset transistor, which is an example of a reset gate, a vertical selection transistor, and a source-follower amplifying transistor, which is an example of a detector for detecting a potential change of a floating diffusion, can be used.

Alternatively, an inter-pixel amplifier, such as that disclosed in Japanese Patent No. 2708455, including three transistors, i.e., an amplifying transistor connected to a drain line (DRN) to amplify a signal voltage corresponding to signal charge generated by a charge generator, a reset transistor for resetting the charge generator, and a read-out selection transistor (transfer gate) which is scanned by a vertical shift register via a transfer wiring (TRF), may be used.

The pixel portion 10 includes, not only an effective image area (effective portion) 10a, but also a reference pixel area disposed around the effective image area to optically provide a black color. For example, reference pixels for several lines (for example, one to ten lines) that optically provide a black color are disposed above and below the image area 10a, and several to several tens of reference pixels (for example, 3 to 40 reference pixels) that optically provide a black color are disposed at the left and right sides of the effective image area 10a.

The light-receiving surfaces of the reference pixels are shielded so that light does not enter the charge generators, such as photodiodes. Pixel signals from the reference pixels are used as a reference for a black color of a video signal.

In the solid-state imaging device 1, the pixel portion 10 is configured so that color imaging can be implemented. That is, on the light-receiving surface of each charge generator on which electromagnetic waves (light in this example) are incident, one of a plurality of color filters, which are used for capturing color images, forming a color separation filter is disposed.

In the example shown in FIG. 1, a basic color filter having a Bayer pattern is used. That is, in the pixel portion 10, the same pixel pattern repeats in units of 2×2 pixels so that the unit pixels 3 disposed in a square lattice correspond to three color filters, i.e., red (R), green (G), and blue (B) color filters.

For example, first color pixels for sensing a first color (R) are disposed at the odd rows and odd columns; second color pixels for sensing a second color (G) are disposed for the odd row and even columns and even rows and odd columns; and third color pixels for sensing a third color (B) are disposed at the even rows and even columns. In this manner, two different color pixels, i.e., R/G or G/B pixels, are disposed every other line according to the checkerboard pattern.

In such a basic color filter having a Bayer pattern, two patterns of combinations of two colors, i.e., R/G and G/B, alternately repeat in the row direction and in the column direction.

The unit pixels 3 are connected to the vertical scanning circuit 14 through row control lines 15 for selecting rows and are also connected to the column processor 26 through the corresponding vertical signal lines 19. In the column processor 26, a column AD circuit 25 is disposed for each vertical column. The row control lines 15 represent the overall wiring from the vertical scanning circuit 14 to the unit pixels 3.

The horizontal scanning circuit 12 serves as a read-out scanner for reading count values from the column processor 26. The elements forming the drive controller 7, such as the horizontal scanning circuit 12 and the vertical scanning circuit 14, are integrally formed, together with the pixel portion 10, in a semiconductor region, such as single crystal silicon, by using a technique similar to a semiconductor integrated circuit manufacturing technique, and are formed as solid-state imaging elements, which are an example of a semiconductor system.

The horizontal scanning circuit 12 and the vertical scanning circuit 14 include a horizontal decoder 12a and a vertical decoder 14a, respectively, which are discussed below, and start a shifting (scanning) operation in response to control signals CN2 and CN1, respectively, supplied from the communication/timing controller 20. Accordingly, various pulse signals (for example, reset pulse RST, transfer pulse TRF, DRN control pulse DRN, etc.) for driving the unit pixels 3 are transmitted through the row control lines 15.

The communication/timing controller 20 includes a functional block of a timing generator TG, which is an example of a read-out address controller, and a functional block of a communication interface, though they are not shown. The timing generator TG supplies clocks and pulse signals having predetermined timing required for the operation of the elements forming the drive controller 7. The communication interface receives the master clock CLK0 through the terminal 5a or receives data DATA indicating the operation mode through a terminal 5b, and outputs data including information concerning the solid-state imaging device 1.

For example, the communication/timing controller 20 outputs a horizontal address signal to the horizontal decoder 12a or a vertical address signal to the vertical decoder 14a, and the horizontal decoder 12a or the vertical decoder 14a receives the corresponding address signal and selects the corresponding column or row.

In this case, since the unit pixels 3 are disposed in a matrix, the reading of pixel signals and pixel data is facilitated by the following scanning operation. Vertical scanning is first performed such that analog pixel signals generated by a pixel signal generator and output via the vertical signal lines 19 are accessed and read row by row, and then, horizontal scanning is performed such that pixel signals (digital pixel data in this example) are accessed and read in the column direction to the output side. Instead of the above-described scanning operation, random access may be performed by directly addressing the desired unit pixel 3 and by reading information only concerning the required unit pixel 3.

The communication/timing controller 20 supplies a clock CLK1 having the same frequency as the master clock CLK0 input through the terminal 5a and also supplies a low-speed clock which is scaled down to one half the clock CLK1 (i.e., half the frequency the clock CLK1) or lower speed clocks, to, for example, the horizontal scanning circuit 12, the vertical scanning circuit 14, and the column processor 26. Clocks scaled down to one half the master clock CLK0 or lower are collectively referred to as the "low-speed clock CLK2".

The vertical scanning circuit 14 selects rows of the pixel portion 10 and supplies required pulses to the selected rows. The vertical scanning circuit 14 includes the vertical decoder 14a for defining rows of the pixel portion 10 and a vertical drive circuit 14b for supplying pulses to the row control lines 15 corresponding to the rows defined by the vertical decoder 14a to drive the unit pixels 3 of the selected rows. The vertical decoder 14a selects, not only rows from which signals are read, but also, a row used for an electronic shutter.

The horizontal scanning circuit 12 sequentially selects the column AD circuits 25 of the column processor 26 in synchronization with the low-speed clock CLK2, and supplies the signals of the selected column AD circuits 25 to a horizontal signal line (horizontal output lines) 18. The horizontal scanning circuit 12 includes the horizontal decoder 12a for defining columns of the pixel portion 10 (selecting the corresponding column AD circuits 25 of the column processor 26) and a horizontal drive circuit 12b for supplying the signals in the column processor 26 to the horizontal signal line 18 according to the readout addresses defined by the horizontal decoder 12a. The same number of lines forming the horizontal signal line 18 as the number n (n is an integer) of bits handled by the column AD circuits 25 are provided. For example, if the number of bits is 10, the horizontal signal line 18 includes 10 lines.

In the solid-state imaging device 1 configured as described above, pixel signals output from the unit pixels 3 in each vertical column are supplied to the column AD circuit 25 of the corresponding column processor 26 via the vertical signal line 19.

Each column AD circuit 25 of the column processor 26 receives pixel signals for one column and processes them. For example, each column AD circuit 25 has an analog digital converter (ADC) circuit for converting an analog signal into, for example, 10-bit digital data, based on the low-speed clock CLK2.

To perform AD conversion in the column processor 26, analog signals stored in the individual rows are converted into digital signals in parallel by using the corresponding column AD circuits 25 disposed in the column direction. In this case, the single-slope-integrating (or ramp-signal-comparison) AD conversion technique disclosed in, for example, Japanese Patent No. 2532374 or literature "Column-kan FPN no nai column-gata AD-henkanki wo tousaishita CMOS image sensor (CMOS-type Image Sensor with Column-type ADCs without Inter-column FPN)", The Institute of Image Information and Television Engineers, IPU2000-57, pp. 79-84. Since this technique can implement an AD converter with a simple structure, the circuit scale is not increased even if AD converters are disposed in parallel.

The configuration of the ADC circuit is briefly discussed, though details thereof are described later. A subject analog signal is converted into a digital signal based on a time from the start of AD conversion until the voltage of the analog signal coincides with a reference voltage RAMP. The mechanism for implementing this is, in principle, as follows. A ramp reference signal RAMP is supplied to a comparator (voltage comparator), and at the same time, counting is started with clock signals. Counting is continued until a pulse signal is obtained as a result of comparing an analog pixel signal input via the vertical signal line 19 with the reference voltage RAMP.

In this case, by modifying the circuit configuration, for a voltage-mode pixel signal input via the vertical signal line 19, the difference between the signal level (noise level) immediately after resetting the pixel and the true signal level Vsig (based on the quantity of light received) can be calculated in addition to AD conversion. With this arrangement, noise signal components, such as fixed pattern noise (FPN) or reset noise, can be eliminated.

Pixel data digitized in each column AD circuit 25 is transferred to the horizontal signal line 18 via a horizontal selection switch (not shown) driven by a horizontal selection signal supplied from the horizontal scanning circuit 12, and is then input into the output circuit 28. In this case, the number of bits of a digital signal is 10, but this is an example only. The number of bits may be less than 10 (for example, 8) or more than 10 (for example, 14 bits).

With this configuration, from the pixel portion 10 including the photodetectors, which serve as charge generators, disposed in a matrix, pixel signals of the associated vertical columns are sequentially output row by row. Then, an image corresponding to the pixel portion 10, i.e., a frame image, can be represented by a set of pixel signals of the entire pixel portion 10.

Details of Column AD Circuit and Reference Signal Generator

The reference signal generator 27 includes a DA conversion circuit (DA converter (DAC)), which has a function of generating a reference signal for AD conversion, according to the types or pattern of the colors of color filters forming the color separation filter of the pixel portion 10. In this embodiment, the reference signal generator 27 uses a current-output-type DA conversion circuit, and details thereof are given below.

Once the pixel portion 10 to be used is determined, the types or pattern of colors of the color filters forming the color separation filter are determined, and the types of colors of the color filters located at certain positions of the two-dimensional lattice are also uniformly determined. The repeating cycle (same pattern) of the pixels of the color filters in the row direction and in the column direction is also uniformly determined by the pattern of the color filters. In one row to be processed by each column AD circuit 25, not pixel signals having all colors used in the color separation filter, but pixel signals having a combination of a smaller number of predetermined colors determined by the repeating cycle are contained.

In this embodiment, by focusing on this characteristic of the color filters, in an AD conversion circuit including a comparator circuit and a counter, DA conversion circuits, which are functional elements for generating an AD conversion reference signal to be supplied to the comparator circuit and which are an example of color-dependent reference signal output units, are formed in the following manner. Instead of providing DA conversion circuits having the same number of all colors used in the color separation filter, the same number of DA conversion circuits as the number of predetermined colors existing in the repeating cycle of a combination of color filters in one row, which is the unit for reading pixel signals, are provided. With this arrangement, the number of DA conversion circuits becomes smaller than the number of all colors of the color filters existing in the repeating cycles of the color filters in the two-dimensional matrix. When processing a row, if x colors exist (x is a positive integer of two or greater) in that row, it is sufficient if reference signals associated with the x colors are supplied to the comparator circuits, and it is therefore sufficient if x DA conversion circuits are provided.

From the viewpoint of supplying individual reference signals indicating variation characteristics and initial values of the individual colors to the comparator circuits, it is necessary to switch the row to be processed. It is thus preferable that a switching mechanism for supplying a reference signal corresponding to a color to be processed in the column direction, which is orthogonal to the row direction, be provided for each of the x DA conversion circuits.

That is, in the direction different from the row direction, which is the unit for reading pixel signals, i.e., in the vertical column direction, the same number of color-dependent reference signal generators as the predetermined number of colors of a combination of color filters existing in the repeating cycle in the vertical column direction are provided for the corresponding DA conversion circuits (reference signal output units). A reference signal generated by the color-dependent reference signal generator has a variation characteristic (more specifically, the slope) corresponding to the color characteristic of the color pixels and an initial value defined based on black references or circuit offset components, which are irrelevant to the color characteristics. A selector is provided for selecting one of the reference signals generated in the reference signal generators and for supplying the selected reference signal to the comparator circuit.

In this case, if the same color filter exits in the repeating cycle of the two-dimensional color filters, such as in a Bayer pattern, the DA conversion circuits (reference signal output units) may use the single color-dependent reference signal generator for that same color filter.

Regardless of the configuration of the DA conversion circuits, every time a row to be processed is switched, a combination of predetermined colors in that row is also switched. In response to this, each DA conversion circuit switches the variation characteristic (more specifically, the slope) of the reference signal (analog reference voltage) generated by the DA conversion circuit in accordance with the characteristics of the switched color filters, i.e., analog pixel signals, and outputs the switched variation characteristics. The initial values are set based on, for example, black references and offset components, which are irrelevant to the color characteristics.

With this arrangement, the number of reference voltage generators (corresponding to the DA conversion circuits in this embodiment) or the number of wiring patterns extending from the reference voltage generators can be reduced to be smaller than the number of color filters forming the color separation filter. Additionally, selectors (multiplexers) disposed for the individual vertical columns to selectively output analog reference voltages (corresponding to reference signals in this embodiment) supplied from the reference voltage generators, which are necessary in a case where a reference voltage generator is provided for each color filter (see Japanese Unexamined Patent Application Publication No. 2000-152082), becomes unnecessary. As a result, the circuit scale can be reduced. In addition, the number of signal lines for transmitting the reference signals based on the color pixels to the input sides of the comparator circuits can be reduced to be smaller than the number of color components of the color filters.

Alternatively, when a row to be processed is switched, the communication/timing controller 20 may set variation characteristics (slope) corresponding to the color characteristics of the color pixels and the initial value, such as black references and circuit offset components, in accordance with a change in a combination of colors forming the repeating cycle of the color filters. With this modification, the provision of a color-dependent reference signal generator for each DA conversion circuit (reference signal output unit) or the provision of a selector for selecting a color-dependent reference signal generator becomes unnecessary.

That is, in this modification, every time a row to be processed is switched, variation characteristics (slope) and an initial value are set in the corresponding DA conversion circuit in accordance with a change in a combination of colors forming the repeating cycle of the color filters. Then, it is not necessary to provide a color-dependent reference signal generator for each DA conversion circuit or to provide a selector for selecting a color-dependent reference signal generator in accordance with a row to be switched. Then, the scale of the overall reference signal generator 27 can further be reduced. In this case, however, the processing performed by a control system for the reference signal generator 27 may become complicated.

In this embodiment, in the solid-state imaging device 1, a Bayer basic pattern is used. As stated above, the same pattern repeats in units of 2×2 pixels. Pixel signals are read row by row and are input into the corresponding column-parallel-structured column AD circuits 25 via the corresponding vertical signal lines 19. Accordingly, in one row to be processed, pixel signals including only two colors, i.e., R/G or G/B, are contained. Thus, in this embodiment, two DA conversion circuits, i.e., a DA conversion circuit 27a corresponding to the odd columns and a DA conversion circuit 27b corresponding to the even columns, are provided.

Reference signals RAMPa and RAMPb output from the DA conversion circuits 27a and 27b, respectively, are transmitted to a voltage comparator unit 252 via common reference signal lines 251a and 251b (may be collectively referred to as the "common reference signal line 251"), respectively, which are independent of each other. The voltage comparator unit 252 includes a plurality of voltage comparators 252a (for the odd columns) and a plurality of voltage comparators 252b (for the even columns) connected to the common reference signal lines 251a and 251b, respectively.

In this case, the reference signals RAMPa and RAMPb are substantially directly transmitted to the plurality of voltage comparators 252a and 252b, respectively, via the independent common reference signal lines 251a and 251b, respectively. Each of a set of voltage comparators 252a and 252b corresponds to color filters having the same color characteristics. Substantially directly transmitting via the common reference signal lines 251a and 251b means that selectors, such as multiplexers, are not disposed between the common reference signal lines 251a and 251b and the corresponding voltage comparators 252a and 252b. This configuration is very different from that disclosed in Japanese Unexamined Patent Application Publication No. 2000-152082. In this configuration, a reference signal output from each analog reference voltage generator is transmitted to the input side of a comparator provided for each vertical column, and a selector (multiplexer) is provided immediately before the input side of each comparator to selectively output one of the reference signals from the corresponding analog reference voltage generator.

The DA conversion circuits 27a and 27b generate stepped-ramp saw tooth waves (ramp voltages) from initial values indicated by control data CN4 (CN4a and CN4b) supplied from the communication/timing controller 20 in synchronization with count clocks CKdaca and CKdacb (may be the count clock CK0), respectively, output from the communication/timing controller 20, and supplies the generated stepped-ramp saw tooth waves to the corresponding column AD circuits 25 of the column processor 26 as the AD conversion reference signals (ADC reference signals) RAMPa and RAMPb, respectively. It is preferable that a noise suppression filter be provided, though it is not shown.

In this embodiment, when performing AD conversion on a signal component Vsig of a pixel signal Vx located at a predetermined position by using the voltage comparators 252 and counters 254, the DA conversion circuit 27a or 27b sets the initial voltage of the reference signal RAMPa or RAMPb generated by the DA conversion circuit 27a or 27b, respectively, to a value different from that when AD conversion is performed on a reset component $\Delta V$ by reflecting the characteristics of the pixel and variations in the circuit. The DA conversion circuit 27a or 27b also sets the slope $\beta a$ or $\beta b$, respectively, by considering the pattern of the color filters so that the variation characteristics match the pixel characteristics.

More specifically, the initial values Vas and Vbs of the reference signals RAMPa and RAMPb for the signal component Vsig are calculated based on a signal obtained from a plurality of predetermined black references. The pixels for generating black references are pixels covered with a light-shielding layer, such as photodiodes, which serve as photoelectric transducers, forming charge generators disposed around the color pixels. The positions and the number of pixels for generating black references and the type of light-shielding layer are not particularly restricted, and a known technique may be employed.

The initial voltage includes variations unique to the DA conversion circuit 27a or 27b. Generally, the initial voltage Vas or Vbs is set to be lower than the initial voltage Var or Vbr of the reference signal RAMPa or RAMPb for the reset component ΔV by an offset OFFa or OFFb, respectively.

Even if the initial voltages Var and Vbr of the reference signal RAMPa or RAMPb for the reset component ΔV are set to be equal to each other, the initial voltages Vas and Vbs of the reference signals RAMPa and RAMPb for the signal component Vsig become different from each other since the offsets OFFa and OFFb are different.

The initial voltages Vas and Vbs of the reference signals RAMPa and RAMPb for the signal component Vsig may contain offsets other than those contained in pixels for generating black references.

The DA conversion circuits 27a and 27b of the reference signal generator 27 may control the offsets OFFa and OFFb in the following manner. The function of calculating initial values based on a signal obtained from reference pixels for generating a plurality of black references is provided for the communication/timing controller 20, and the communication/timing controller 20 outputs control data CN4 representing initial values. Then, the DA conversion circuits 27a and 27b may control the offsets OFFa and OFFb based on the initial values. Alternatively, the DA conversion circuits 27a and 27b may have the function of calculating the initial values.

Alternatively, instead of providing the function of calculating the initial values of reference voltages for the communication/timing controller 20 or the DA conversion circuits 27a and 27b within the chip forming the imaging device 1, an external system outside the chip may calculate the initial values based on a signal obtained from reference pixels for generating black references, and sends information concerning the calculated initial values to the communication/timing controller 20 through the terminal 5b. Then, the communication/timing controller 20 sends control data CN4 indicating the initial values to the reference signal generator 27.

Stepped reference signals output from the reference signal generator 27, and more specifically, the reference signal RAMPa and the reference signal RAMPb output from the DA conversion circuits 27a and 27b, respectively, can be generated based on a high-speed clock generated by the clock converter 23, for example, a multiplied clock generated by a multiplier circuit. Then, the stepped reference signals can be changed at higher speed than when they are generated based on the master clock CLK0 input via the terminal 5a.

The control data CN4a and CN4b supplied from the communication/timing controller 20 to the DA conversion circuits 27a and 27b, respectively, contain information indicating the slope (the degree by which the voltage is changed, i.e., the amount by which the voltage is changed with respect to the time) of a ramp voltage to be used every time a comparison operation is performed.

Each column AD circuit 25 includes the voltage comparator 252 and the counter 254 and has an n-bit AD conversion function. The voltage comparator 252 compares an analog pixel signal obtained from the unit pixels 3 corresponding to each of the row control lines 15 (V1, V2, . . . , Vv) through the corresponding vertical signal line 19 with the reference signal RAMP generated by the DA conversion circuit 27a or 27b of the reference signal generator 27. The counter 254 counts time until the voltage comparator 252 finishes the comparison operation, and stores the counting result therein.

The communication/timing controller 20 has a function of controlling the counting mode to be used in the counter 254 according to whether the reset component ΔV or the signal component Vsig of the pixel signal is used for a comparison operation in the voltage comparator 252. A mode control signal CN5 for designating whether the counter 254 is operated in a down-counting mode or an up-counting mode is input from the communication/timing generator 20 into the counter 254 of each column AD circuit 25.

The stepped-ramp reference signal RAMP generated in the reference signal generator 27 is input into one input terminal RAMP of each of the voltage comparators 252, and the other input terminals of the voltage comparators 252 are connected to the corresponding vertical signal lines 19 and receive the pixel signal voltages from the pixel portion 10. The output signals from the voltage comparators 252 are supplied to the corresponding counters 254.

The count clock CK0 is input from the communication/timing controller 20 to the clock terminals CK of the counters 254.

Although the configuration of the counter 254 is not shown, the counter 254 can be implemented by changing the wiring arrangement of a data storage unit formed of latches into a synchronous counter, and the internal counting is performed by receiving a single count clock CK0. As in the stepped voltage waveform, the count clock CK0 can also be generated based on a high-speed clock (for example, a multiplied clock) from the clock converter 23 so that it is operated faster than the master clock CLK0 input via the terminal 5a.

The n-bit counter 254 can be implemented by a combination of n latches, and the circuit scale can be reduced to one half the circuit scale of a data storage unit formed of two blocks, each block having n latches. Additionally, the provision of a counter for each column is not necessary, and the overall configuration is much smaller.

Although details of the configuration of the counters 254 are given later, the main feature of the counters 254 is as follows. By the use of the common up/down counter (U/D CNT) regardless of the counting mode, counting can be performed by switching alternately between the down-counting operation and the up-counting operation. As the counter 254, a synchronous counter that outputs counter output values in synchronization with the count clock CK0 is used.

In the case of the synchronous counter, the operations of all flip-flops (counter basic elements) are restricted by the count clock CK0. Thus, if a higher frequency operation is required, the use of an asynchronous counter suitable for the fast operation is preferable since the operation limit frequency is determined only by the limit frequency of the first flip-flop (counter basic element).

A control pulse is input from the horizontal scanning circuit 12 into the counter 254 via a control line 12c. The counter 254 has a latch function of latching a counting result, and latches the counter output value until the control pulse is received via the control line 12c.

The column AD circuit 25 configured as described above is disposed for each of the vertical signal lines 19 (H1, H2, . . . , and Hh) to form the column processor 26, which is a column-parallel structured ADC block.

The output sides of the column AD circuits 25 are connected to the horizontal signal line 18. As described above, the horizontal signal line 18 includes the same n number of signal lines as the n-bit column AD circuit 25, and the signal lines are connected to the output circuit 28 via n sensing circuits (not shown) corresponding to output lines.

With this configuration, during the pixel signal read-out period corresponding to a horizontal blanking period, the column AD circuit 25 performs a counting operation and outputs the counting result at a predetermined time. More specifically, the voltage comparator 252 first compares a ramp waveform voltage output from the reference signal generator 27 with a pixel signal voltage input via the vertical signal line 19, and when the two voltages become equal to each other, the comparator output of the voltage comparator 252 is inverted (in this embodiment, from the H level to the L level).

The counter 254 has already started the counting operation in the down-counting mode or the up-counting mode in synchronization with the ramp waveform voltage input from the reference signal generator 27, and when receiving information indicating that the comparator output is inverted, the counter 254 stops the counting operation and latches (stores) the count value as pixel data. Then, AD conversion is completed.

Thereafter, the counter 254 sequentially outputs the stored pixel data to the outside the column processor 26 or the outside the chip having the pixel portion 10 via an output terminal 5c based on a shift operation of horizontal selection signals CH(i) input from the horizontal scanning circuit 12 via the control line 12c at a predetermined time.

Other various signal processing circuits may be contained in the elements forming the solid-state imaging device 1, though they are not shown since they are not directly related to this embodiment.

Functions of Reference Signal Generator

Figure 2:
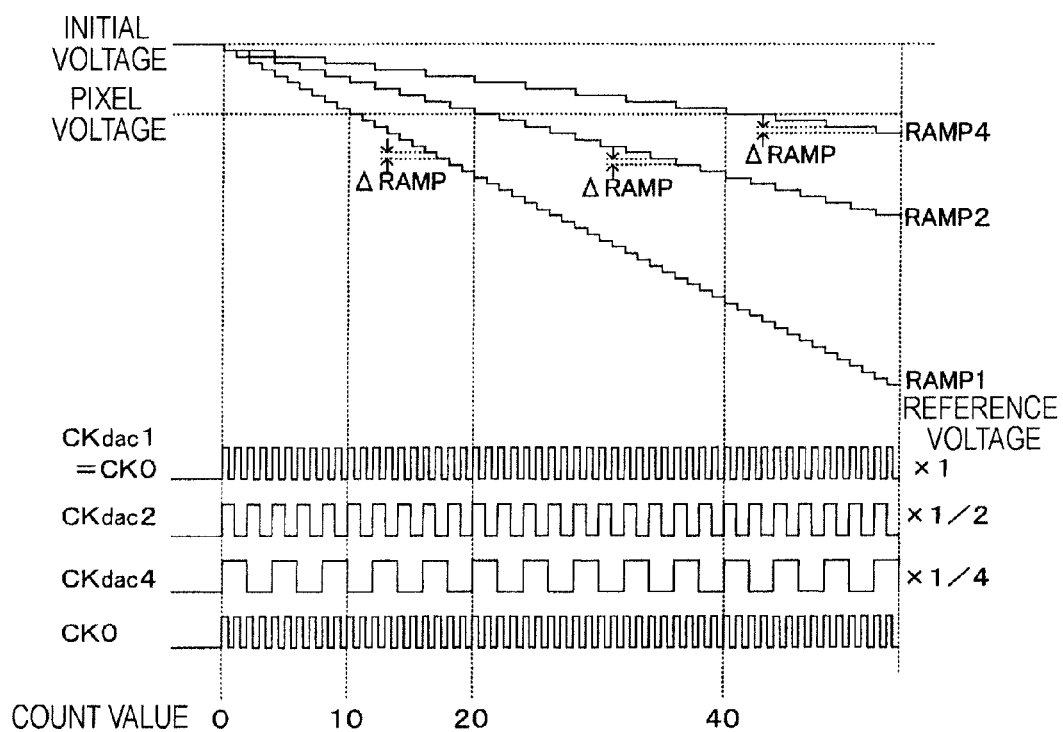
FIG. 2 illustrates functions of a DA conversion circuit of a reference signal generator used in a solid-state imaging device.

FIG. 2 illustrates the functions of the DA conversion circuits (DACs) 27a and 27b of the reference signal generator 27 used in the solid-state imaging device 1.

The DA conversion circuit 27a or 27b receives a count clock CKdaca or CKdacb, respectively, for DA conversion from the communication/timing controller 20, generates a linearly-decreasing stepped-ramp saw tooth wave (ramp waveform) in synchronization with the count clock CKdaca or CKdacb, respectively, and supplies the generated saw tooth wave as an AD conversion reference voltage (ADC reference signal) to the voltage comparators 252 of the individual column AD circuits 25.

The DA conversion circuit 27a or 27b first sets an initial voltage based on information indicating the initial value of a ramp voltage, which is used every time a comparison operation is performed, contained in the control data CN4a or CN4b, respectively. The DA conversion circuit 27a or 27b also sets a voltage change ΔRAMP per clock pulse based on information indicating the slope (degree of change) of the ramp voltage, and changes each count value per unit time (count clock CKdac). In actuality, it is sufficient if the maximum voltage of the maximum count number (for example, 1024 corresponding to 10 bits) of the count clock CKdac is set. Any desired circuit configuration to set initial voltages can be formed.

With this configuration, the DA conversion circuit 27a or 27b reduces the voltage (for example, 3 V) indicating the initial value contained in the control data CN4 by ΔRAMP per clock pulse of the count clock CKdaca or CKdacb.

When setting the factor for a pixel signal (more specifically, a true signal component) output from the unit pixel 3, the communication/timing controller 20 supplies a count clock CKdacm scaled down to 1/m the reference cycle of the count clock CKdac1 having a factor 1 to the DA conversion circuit 27a. The DA conversion circuit 27a reduces the voltage by ΔRAMP per clock pulse of each count clock CKdacm from a voltage (for example, 3 V) indicating the initial value contained in the control data CN4.

Accordingly, the slope of the reference signals RAMPa and RAMPb supplied to the voltage comparators 252 is increased by the factor of 1/m compared with when the reference signals RAMPa and RAMPb are generated with the count clock CKdac1 (=CK0). In the counter 254, the count value is increased by the factor of m for the same pixel voltage. That is, the factor m can be set.

That is, by adjusting the cycle of the count clock CKdaca or CKdacb, the slope of the reference signal RAMPa or RAMPb can be changed. For example, if a clock scaled down to 1/m the reference clock is used, the slope results in 1/m. If the count clock CK0 in the counter 254 is the same, the count value is increased by the factor of m for the same pixel voltage. That is, changing the slope of the reference signal RAMPa or RAMPb can adjust the factor for difference processing, which is described below.

FIG. 2 shows that, as the slope of the reference signal RAMPa or RAMPb becomes larger, the factor applied to the amount of information stored in the unit pixels 3 becomes smaller, and conversely, as the slope becomes smaller, the factor becomes larger. For example, by supplying the count clock CKdac2 scaled down to ½ the reference cycle of the count clock CKdac1, the factor can be set to be 2, and by supplying the count clock CKdac4 scaled down to ¼, the factor can be set to be 4. By supplying the count clock CKdacnm scaled down to n/m, the factor can be set to be m/n.

By adjusting the slope, the analog gain when AD conversion is performed can be controlled. That is, adjusting the factor can change the slope of a reference voltage, and changing the slope of a reference voltage can adjust the amplitude of the reference signal per unit time. Accordingly, the gain for a pixel signal to be compared can be adjusted. By dynamically changing the slope during DA conversion (setting the frequency of a clock higher than CK0 by progressively increasing the slope thereof), AD conversion by reflecting gamma (γ) correction on an analog signal can be conducted.

In this manner, the factor can be set simply and precisely by adjusting the cycle of the count clock CKdacnm supplied to the reference signal generator 27 while changing (reducing in this embodiment) a voltage by ΔRAMP per clock pulse of each count clock CKdacm. The sign (+/−) of the factor can be specified by adjusting the counting operation mode for signal components Vsig of a pixel signal.

The above-described technique for setting the factor by using the slope of the reference signal RAMPa or RAMPb is an example only, and another technique can be used for setting the factor. For example, if the cycles of the count clocks CKdaca and CKdacb supplied to the reference signal generator 27 are fixed, and if the counter output value is x and the slope of the ramp voltage contained in the control data CN4 is β, the potential calculated by the equation y=α (initial value)−β*x is output. In this manner, according to information indicating the slope (rate of change) of a ramp voltage contained in the control data CN4, a change in the voltage ΔRAMP per count pulse of each count clock CKdac can be adjusted. As stated above, the slope β of the ramp voltage can be adjusted by changing the number of pulses of a clock, or may be adjusted by changing the current of a unit current source.

The technique for setting α (initial value) providing an offset or β (factor) providing the slope can be determined in accordance with a circuit configuration for generating a ramp waveform that is changed per clock pulse of each of the count clocks CKdaca and CKdacb. For example, if the circuit for generating a ramp waveform is formed of a set of constant current sources and a selection circuit for selecting one or more constant current sources, α and β can be set by adjusting the current flowing in the selected constant current source.

No matter which technique is used for generating a reference signal, the generated reference signal contains a slope based on the color characteristics of color pixels and also contains an initial value based on non-color characteristics, such as black references or circuit offset components. Then, by using such a reference signal having suitable color characteristics and non-color characteristics, AD conversion can be performed.

Operation of Solid-State Imaging Device

Figure 3:
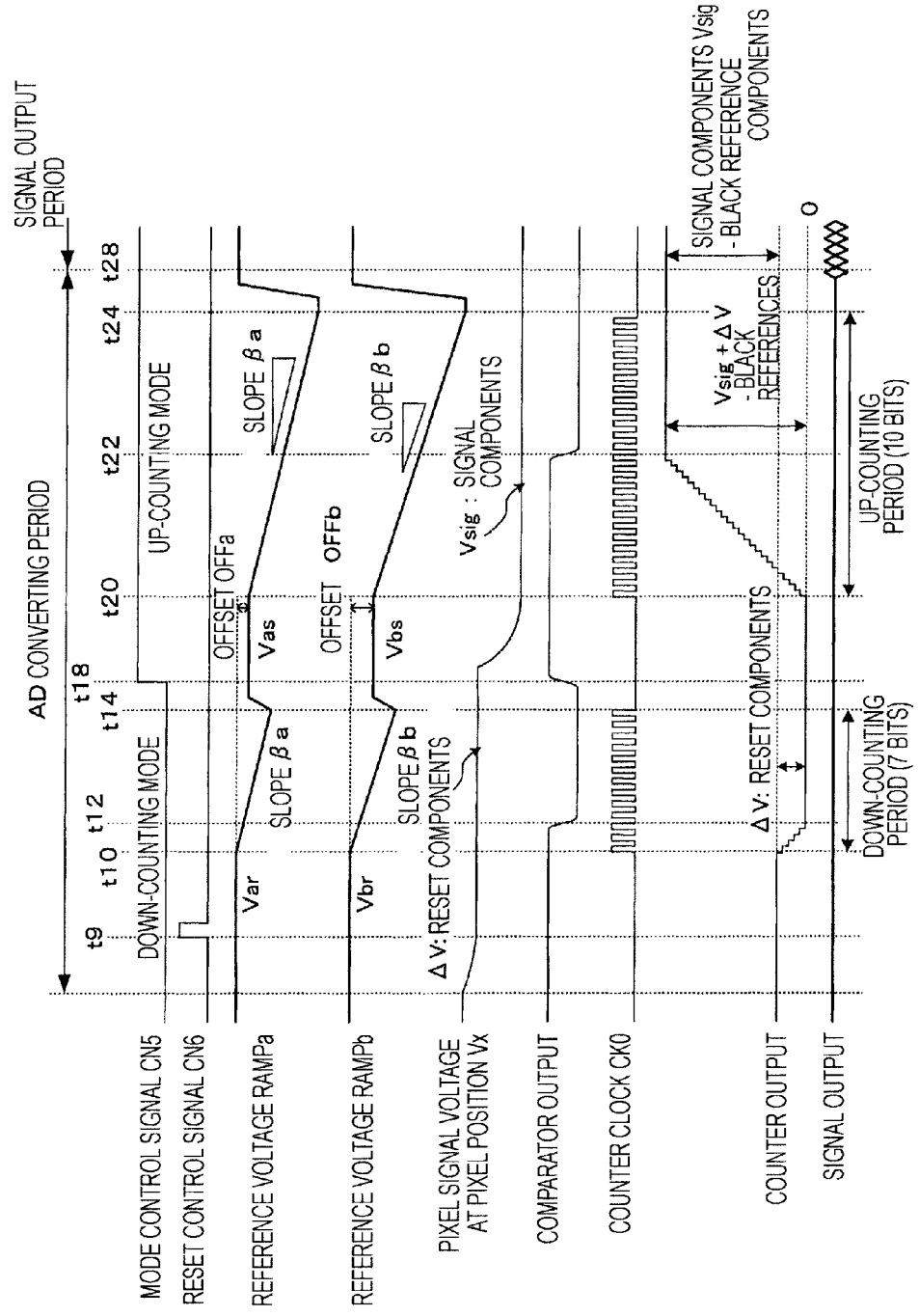
FIG. 3 is a timing chart illustrating signal difference processing, which is a basic operation, in a column AD circuit of the solid-state imaging device shown in FIG. 1.

FIG. 3 is a timing chart illustrating signal difference processing, which is a basic operation, in the column AD circuits 25 of the solid-state imaging device 1 shown in FIG. 1.

The mechanism for converting an analog pixel signal sensed in each pixel unit 3 of the pixel portion 10 into a digital signal is, for example, as follows. The time when the ramp-waveform reference signal RAMP which is progressively reduced with a predetermined slope becomes equal to the voltage of the reference components or the signal components of a pixel signal of the unit pixel 3 is searched. Then, the time from when the reference signal RAMP used for a comparison operation is generated until when an electric signal corresponding to the reference components or the signal components of the pixel signal coincides with the reference signal is counted with count clocks. Then, the count value associated with the level of the reference components or the signal components can be obtained.

For the pixel signal output from the vertical signal line 19, time-sequentially, the signal components Vsig appear after the reset components ΔV, i.e., the reference components, containing noise of the pixel signal. If the first operation is performed on the reference components (reset components ΔV), the second operation is performed on the signal obtained by adding the signal components Vsig to the reference components (reset components ΔV). This operation is specifically discussed below.

For the first read-out operation, the communication/timing controller 20 sets the mode control signal CN5 to the low level so that the counter 254 is set to be in the down-counting mode, and also sets the reset control signal CN6 to be active (in this embodiment, the high level) for a predetermined period so that the count value of the counter 254 is reset to the initial value 0 (t9). After the first read-out operation for reading the pixel signals from a selected row Vα to the corresponding vertical signal line 19 (H0, H1, . . . , Hh) is stabilized, the communication/timing controller 20 supplies the control data CN4a or CN4b for generating the reference signal RAMPa or RAMPb, respectively, to the reference signal generator 27.

Upon receiving the control data CN4a, the DA conversion circuit 27a of the reference signal generator 27 generates and outputs the reference signal RAMPa, as a comparison voltage, having a stepped waveform (RAMP waveform) which has a slope βa based on the color pixel characteristic of one of two sets of colors (i.e., R or G in the odd-numbered columns) in the row Vα and which is changed in the shape of a saw tooth wave (RAMP) over time to one input terminal RAMP of the voltage comparator 252 of the column AD circuit 25 corresponding to an odd column.

Similarly, upon receiving the control data CN4b, the DA conversion circuit 27b of the reference signal generator 27 generates and outputs the reference signal RAMPb, as a comparison voltage, having a stepped waveform (RAMP waveform) which has a slope βb based on the color pixel characteristic of the other set of colors (i.e., G or B in the even-numbered columns) in the row Vα and which is changed in the shape of a saw tooth wave (RAMP) over time to one input terminal RAMP of the voltage comparator 252 of the column AD circuit corresponding to an even column.

The voltage comparator 252 compares the pixel signal voltage of the selected vertical signal line 19 (Vα) supplied from the pixel portion 10 with the RAMP waveform comparison voltage.

Simultaneously with the input of the reference signal RAMPa or RAMPb into the input terminal RAMP of the voltage comparator 252, to measure the comparison time in the voltage comparator 252 by the counter 254, the count clock CK0 is input from the communication/timing controller 20 into the clock terminal of the counter 254 in synchronization with the ramp waveform voltage output from the reference signal generator 27 (t10), and down-counting is started from the initial value 0 as the first counting operation. That is, the counting operation is started in the negative direction.

The voltage comparator 252 compares the pixel signal voltage Vx input via the vertical signal line 19 with the ramp reference signal RAMP supplied from the reference signal generator 27, and when the two voltages become equal to each other, the voltage comparator 252 inverts the comparator output from the H level to the L level (t12). That is, upon comparing the voltage signal corresponding to the reset components Vrst with the reference signal RAMP, the voltage comparator 252 generates an active-low (L) pulse signal after the lapse of the time corresponding to the level of the reset components Vrst, and supplies the generated pulse signal to the counter 254.

Upon receiving this result, the counter 254 stops the counting operation almost at the same time as the inversion of the comparator output, and latches (retains/stores) the corresponding count value as the pixel data. Then, AD conversion is completed (t12). That is, the counter 254 starts down-counting simultaneously with the generation of the ramp reference signal RAMP to be supplied to the voltage comparator 252, and continues counting with the clock CK0 until the active-low (L) pulse signal is received as a result of comparison processing. Then, the count value corresponding to the level of the reset components Vrst is obtained.

After the lapse of a predetermined down-counting period (t14), the communication/timing controller 20 stops supplying the control data CN4 to the voltage comparator 252 and supplying the count clock CK0 to the counter 254. Then, the voltage comparator 252 stops generating the ramp reference signal RAMP.

In this first read-out operation, since the counting operation is performed by detecting the reset level Vrst of the pixel signal voltage Vx by the voltage comparator 252, the reset components ΔV of the unit pixels 3 are read.

The reset components ΔV contain offset noise which varies depending on the unit pixel 3. Generally, however, a variation in the reset components ΔV is small, and the reset level Vrst is generally common for all the pixels. Accordingly, the output value of the reset components ΔV of the pixel signal voltage Vx of the selected vertical signal line 19 is generally known.

Accordingly, in the first read-out operation for the reset components ΔV, by adjusting the RAMP voltage, the down-counting period (comparison period from t10 to t14) can be reduced. In this embodiment, a comparison operation is performed for the reset components ΔV by setting the maximum period for the comparison operation to be a 7-bit counting period (128 clock pulses).

Subsequently, in the second read-out operation, in addition to the reset components ΔV, the electric signal components Vsig for each unit pixel 3 in accordance with the quantity of incident light are read, and an operation similar to the first read-out operation is performed. More specifically, the communication/timing controller 20 first changes the mode control signal CN5 to the high level so that the counter 254 is set to be in the up-counting mode (t18). Then, after the second read-out operation for reading the signal components Vsig from the unit pixels 3 of the selected row Vα to the vertical signal line 19 (H1, H2, . . . , Hh) is stabilized, the communication/timing controller 20 supplies the control data CN4a (containing offset OFFa and slope βa) for generating the reference signal RAMPa to the DA conversion circuit 27a and the control data CN4b (containing offset OFFb and slope (3b) for generating the reference signal RAMPb to the DA conversion circuit 27b to perform AD conversion for the signal components Vsig.

Upon receiving the control data CN4a, the DA conversion circuit 27a of the reference signal generator 27 generates and outputs a stepped waveform (RAMP waveform), as a comparison voltage, which has the slope βa based on the color pixel characteristic of one of the two sets of colors (R or G in the odd-numbered columns) in the row Vα and changes in the shape of a saw tooth (RAMP shape) over time and which is lower than the initial value Var for the reset components ΔV by the offset OFFa to one input terminal RAMP of the voltage comparator 252 corresponding to an odd-numbered column.

Similarly, upon receiving the control data CN4b, the DA conversion circuit 27b of the reference signal generator 27 generates and outputs a stepped waveform (RAMP waveform), as the comparison voltage, which has the slope βb based on the color pixel characteristic of the other set of colors (G or B in the even-numbered columns) in the row Vα and changes in the shape of a saw tooth (RAMP shape) over time and which is lower than the initial value Vbr for the reset components ΔV by the offset OFFb to one input terminal RAMP of the voltage comparator 252 corresponding to an even-numbered column.

The voltage comparator 252 compares the pixel signal voltage of the selected vertical signal line 19 (Vx) supplied from the pixel portion 10 with the RAMP-waveform comparison voltage.

As stated above, the initial values of the reference voltages are calculated based on a signal obtained from pixels for generating a plurality of black references. The initial values of the reference signals RAMPa and RAMPb generated by the DA conversion circuits 27a and 27b, respectively, are different since they contain unique variation components. The initial voltages of the reference signals RAMPa and RAMPb for the signal components Vsig may contain offsets other than those contained in pixels for generating black references.

Simultaneously with the input of the reference signal RAMPa or RAMPb into the input terminal RAMP of the voltage comparator 252, to measure the comparison time in the voltage comparator 252 by the counter 254, the count clock CK0 is input from the communication/timing controller 20 to the clock terminal of the counter 254 in synchronization with the ramp waveform supplied from the reference signal generator 27 (t20), and, in contrast to the first counting operation, in the second counting operation, the counter 254 starts up-counting from the count value corresponding to the reset components ΔV of the unit pixels 3 obtained in the first read-out operation. That is, the counting operation is started in the positive direction.

The voltage comparator 252 compares the pixel signal voltage Vx input via the vertical signal line 19 with the ramp reference signal RAMP supplied from the reference signal generator 27, and when the two voltages become equal to each other, the voltage comparator 252 inverts the comparator output from the H level to the L level (t22). That is, upon comparing the voltage signal corresponding to the signal components Vsig with the reference signal RAMP, the voltage comparator 252 generates the active-low (L) pulse signal after the lapse of the time corresponding to the level of the signal components Vsig, and supplies the generated pulse signal to the counter 254.

Upon receiving this result, the counter 254 stops the counting operation almost at the same time as the inversion of the comparator output, and latches (retains/stores) the corresponding count value as the pixel data. Then, AD conversion is completed (t22). That is, simultaneously with the generation of the ramp reference signal RAMP to be supplied to the voltage comparator 252, the counter 254 starts up-counting, and continues counting with the clock CK0 until the active-low (L) pulse signal is received as a result of comparison processing. Then, the count value corresponding to the level of the signal components Vsig can be obtained.

After the lapse of a predetermined up-counting period (t24), the communication/timing controller 20 stops supplying the control data CN4 to the voltage comparator 252 and supplying the count clock CK0 to the counter 254. Then, the voltage comparator 252 stops generating the ramp reference signal RAMP.

In the second read-out operation, since the counting operation is performed by detecting the signal components Vsig of the pixel signal voltage Vx by the voltage comparator 252, the signal components Vsig of the unit pixels 3 are read.

In this embodiment, as the counting operation by the counter 254, down-counting is performed during the first read-out operation, and then, up-counting is performed during the second read-out operation. Accordingly, the subtraction expressed by equation (1) is executed automatically in the counter 254, and the count value as a result of the subtraction is retained in the counter 254.

$$\text{(Count value in the second comparison period)} - \text{(count value in the first comparison period)} \quad (1)$$

In this case, equation (1) can be modified into equation (2), and as a result, the count value retained in the counter 254 corresponds to the signal components Vsig.

$$\begin{aligned}\text{(Count value in the second comparison period)} - \\ \text{(count value in the first comparison period)} = \\ \text{(signal components } Vsig1 + \text{reset components } \Delta V + \\ \text{offset components in the column } AD \text{ circuit } 25 - \\ \text{(black reference components))} - \text{(reset components } \Delta V + \\ \text{offset components in the column } AD \text{ circuit } 25) = \\ \text{(signal components } Vsig) - \text{(black reference components)}\end{aligned} \quad (2)$$

That is, as stated above, according to the difference processing in the counter 254 by the two read-out operations and two counting operations, such as down-counting during the first read-out operation and up-counting during the second read-out operation, the reset components ΔV containing noise which varies depending on the unit pixel 3 and the offset components depending on the column AD circuit 25 can be eliminated, and only a digital signal obtained by adding black reference components to the signal components Vsig in accordance with the quantity of incident light in each pixel unit 3 can be extracted with a simple configuration. In this case, circuit variations and reset noise can also be eliminated.

Accordingly, the column AD circuit 25 in this embodiment serves as, not only a digital converter for converting an analog pixel signal into digital pixel data, but also as a CDS processing function.

Since the pixel data represented by the count value obtained in equation (2) is a positive signal voltage, it is not necessary to perform complementary computation. Thus, the compatibility with known systems is high.

During the second read-out operation, the electric signal components Vsig based on the quantity of incident light are read. Accordingly, since the level of the quantity of light is determined in a wide range, it is necessary to set the up-counting period (comparison period from t20 to t24) to be long so that the ramp voltage to be supplied to the voltage comparator 252 can be sharply changed.

Accordingly, in this embodiment, the comparison operation is performed for the signal components Vsig by setting the maximum period for the comparison operation to be a 10-bit counting period (1024 clock pulses). That is, the maximum period for the comparison operation for the reset components ΔV (reference components) is set to be shorter than the maximum period for the comparison operation for the signal components Vsig. Instead of setting the maximum period (i.e., the maximum value of the AD conversion period) for the comparison operation for the reset components ΔV (reference components) to be the same as that for the signal components Vsig, the maximum period for the comparison operation for the reset components ΔV (reference components) is set to be shorter than that for the signal components Vsig, thereby decreasing the total AD conversion period of the two operations.

In this case, the number of comparison bits is different for the first operation and the second operation. Then, the control data CN4*a* and CN4*b* are supplied from the communication/timing controller 20 to the reference signal generator 27, and based on the control data CN4*a* and CN4*b*, ramp voltages are generated in the DA conversion circuits 27*a* and 27*b* so that the slopes of the ramp voltages, i.e., the rates of changes, in the reference signals RAMPa and RMAPb, become the same between the first operation and the second operation. It is easy to set the slopes of the ramp voltages to be the same for the first operation and the second operation since the ramp voltages are generated by digital control. Accordingly, the precision of the AD conversion for the first operation can be equal to that for the second operation, thereby making it possible to obtain a correct subtraction result expressed by equation (1) by the up/down counter.

At a predetermined time (t28) after the completion of the second counting operation, the communication/timing controller 20 instructs the horizontal scanning circuit 12 to read out the pixel data. In response to this instruction, the horizontal scanning circuit 12 sequentially shifts the horizontal selection signals CH(i) to be supplied to the counters 254 via the control lines 12*c*.

With this operation, the count values expressed by equation (2) stored/retained in the counters 254, i.e., the pixel data represented by n-bit digital data, are sequentially output to the outside the column processor 26 or the outside the chip having the pixel portion 10 from the output terminal 5*c* via the n lines forming the horizontal signal line 18. Subsequently, the operation is similarly repeated row by row, thereby obtaining the video data D1 representing a two-dimensional image.

As described above, according to the solid-state imaging device 1, the counting operation is performed twice by using the up/down counter and by switching the counting operation mode thereof. Additionally, in association with the unit pixels 3 disposed in a matrix, the column AD circuits 25 are disposed in a column-parallel structure.

Instead of providing DA conversion circuits, which are functional elements for generating AD conversion reference signals to be supplied to the comparators 252, having the same number of all colors used in color filters forming the color separation filter, the same number of DA conversion circuits as the number of predetermined colors existing in the repeating cycle of a combination of color filters, which is determined by the types or pattern of colors, are provided. Additionally, when a row to be processed is switched, the combination of predetermined colors is also changed. In response to this change, the characteristic (more specifically, the slope) or the initial value of a reference signal (analog reference voltage) generated by the DA conversion circuit is switched in accordance with the color filters, i.e., the characteristics of the analog pixel signal.

With this arrangement, the number of DA conversion circuits, which serve as reference voltage generators, or the number of wiring patterns extending from the DA conversion circuits can be reduced to be smaller than the number of color filters forming the color separation filter. Additionally, multiplexers for selectively outputting analog reference voltages (reference signals), which are necessary in a case where a reference voltage generator is provided for each color filter, becomes unnecessary. As a result, the circuit scale can be significantly reduced.

In response to a change in the combination of predetermined colors existing in a row to be processed, the characteristic (more specifically, the slope) of a reference signal generated by the DA conversion circuit is also changed. Accordingly, different reference voltages can be generated in accordance with the characteristics of the color pixels forming the pixel portion 10, and then, comparison processing can be performed by using the generated reference voltages. Thus, when converting an analog pixel signal output from unit pixels into a digital signal, the slope of the reference signal can be adjusted in accordance with each color so that the characteristic of each color can be precisely controlled.

Additionally, the initial value of a reference signal generated by the DA conversion circuit is changed in accordance with variation components generated in the DA conversion circuit and black reference components. Thus, circuit variations can be corrected, and also, analog signals adjusted by black reference components can be converted into digital signals with a simple structure.

The result of the subtraction of the reference components (reset components) from the signal components can be directly obtained for every vertical column as the result of the second counting operation. A memory device for storing the counting result of each of the reference components and the signal components can be implemented by a latch function provided for each of the counters 254. This eliminates the need to provide dedicated memory devices for storing AD converted data separately from the counters 254.

Additionally, a special subtractor for calculating the difference between the reference components and the signal components is not necessary. Accordingly, the circuit scale or circuit area can be reduced compared with that of the related art, and noise can be eliminated and the current consumption or power consumption can be suppressed.

Since each column AD circuit (AD converter) is formed by a comparator and a counter, a counting operation can be controlled by a single count clock for operating the counter regardless of the number of bits and by a control line for switching the counting mode. This eliminates the need to provide signal lines for sending count values of the counters to the memory devices, which are necessary in the configuration of the related art. As a result, noise and power consumption can be suppressed.

That is, in the solid-state imaging device 1 having AD converters mounted on the same chip, a pair of the voltage comparator 252 and the counter 254 forms the column AD circuit 25 as an AD converter, and also, the counter 254 is operated as a combination of a down-counting operation and an up-counting operation, and the difference between reference components (reset component in this embodiment) and signal components of a signal to be processed is calculated as a digital signal. Thus, the circuit scale or circuit area, the power consumption, or the number of interface wiring patterns with other functions can be reduced, and noise or current consumption caused by the provision of interface wiring patterns can be suppressed.

An n-bit data storage unit for storing counting results retained in each counter 254 may be disposed after the counter 254, though it is not shown. A control pulse is input into the data storage unit from the horizontal scanning circuit 12 via the control line 12c. The data storage unit stores the count values read from the counter 254 until an instruction represented by a control pulse is given via the control line 12c. The horizontal scanning circuit 12 serves as a reader scanner for reading a count value stored in each data storage unit while the voltage comparator 252 and the counter 254 are executing corresponding processing. With this configuration, pipeline processing can be implemented.

Before the operation of the counter 254 (t6), the counting result obtained by the processing on the previous row Hx−1 is transferred to the data storage unit based on a memory transfer instruction pulse CN8 from the communication/timing controller 20.

According to the operation shown in FIG. 3, it is difficult to output pixel data to the outside the column processor 26 before completing the second read-out operation, i.e., AD conversion, on a pixel signal to be processed. Accordingly, the read-out operation is restricted. In contrast, if a data storage unit is disposed after the counter 254, the count value indicating the previous subtraction processing can be transferred to the data storage unit before performing the first read-out operation (AD conversion processing) on a pixel signal to be processed. Accordingly, the read-out operation is not restricted.

Thus, with this configuration, a counting operation, i.e., AD conversion, by the counter 254 and a reading operation for reading out signals to the horizontal signal line 18 can be independently controlled, and thus, pipeline processing for independently and simultaneously performing AD conversion and reading signals to the outside the imaging device 1 via the horizontal signal line 18 can be implemented.

Specific Example of Configuration of Reference Signal Generator

Figure 4:
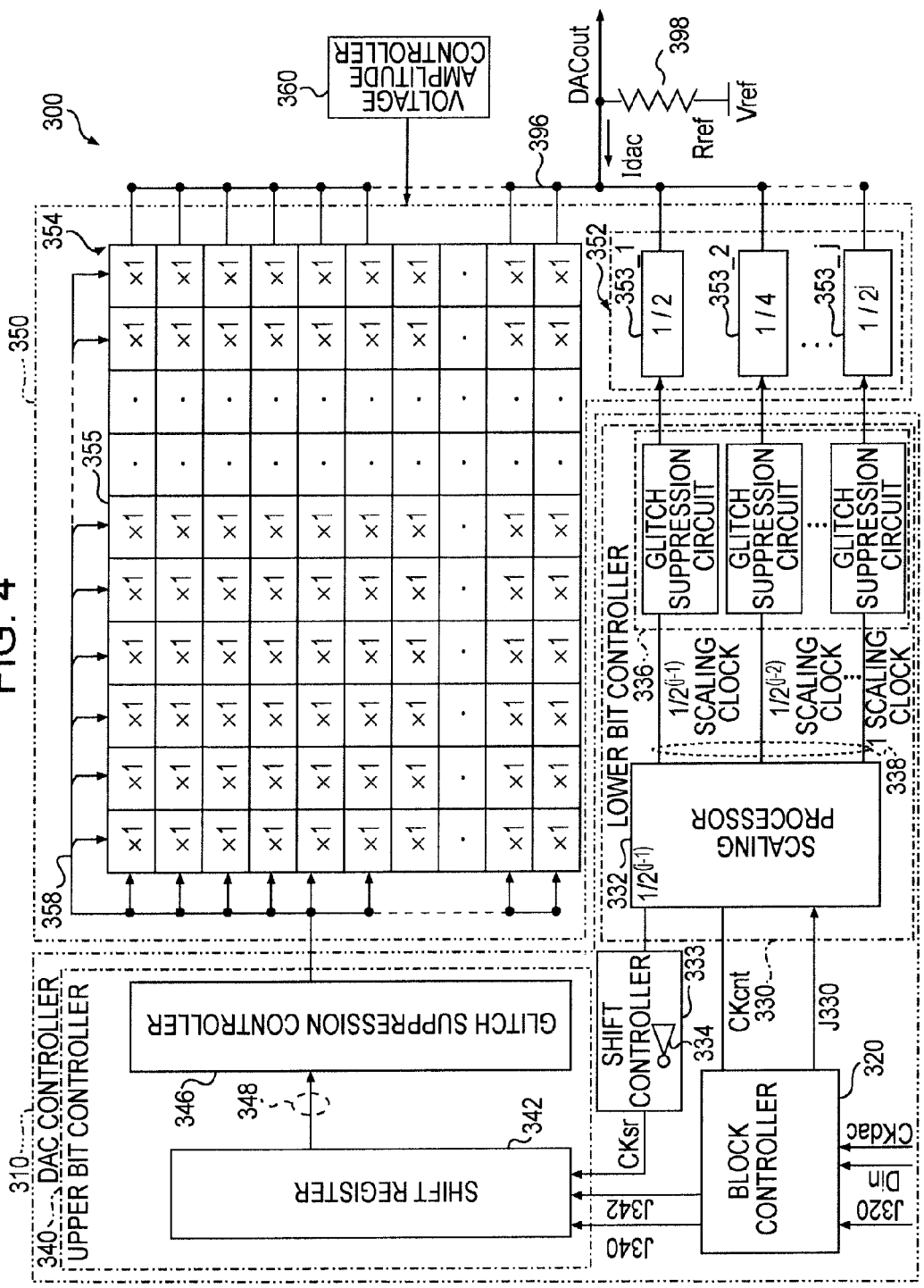
FIG. 4 is a block diagram illustrating a specific configuration of a reference signal generator.

FIG. 4 is a block diagram illustrating the specific configuration of the reference signal generator 27. As discussed above, a current-output-type DA conversion circuit is used as the basic configuration of the reference signal generator 27. The current-output-type DA conversion circuit is a current source cell matrix including cell arrays disposed in a matrix.

As this type of DA conversion circuit, the following DA conversion circuit is known. By using a plurality of current source cells weighted with a predetermined current value to generate the same constant current, current source cells in accordance with the data value of a multi-bit digital input signal are selected from the plurality of current source cells, and then, the constant current outputs of the selected current source cells are added. As a result, an analog current output in accordance with the digital input signal can be obtained.

To select current source cells, various modes, typical examples of which are the decoding mode, binary mode, a composite mode having a combination of the decoding mode and the binary mode, can be employed. Among others, the following mode is widely known in which a multi-bit digital input signal is divided into higher bits and lower bits and the higher bits and the lower bits are then converted into an analog signal (see Japanese Unexamined Patent Application Publication No. 11-17545).

In the composite mode, the higher bits are decoded into a decimal number, and the lower bits are divided into binary bits. The decimal number decoded from the higher bits is latched, and then, current source cells are selected in accordance with the decimal number. Accordingly, if a digital signal is input at high speed, it becomes difficult to simultaneously operate a device used in the decoding mode and a device used in the binary mode and to perform decoding and latching reliably and speedily to select current source cells. As a result, glitch or erroneous coding occurs and it is difficult to obtain stable analog signals.

Accordingly, in this embodiment, a mechanism for solving this problem is employed.

A DA converter 300 forming the reference signal generator 27 (DA conversion circuits 27a and 27b) includes, as shown in FIG. 4, a DAC controller 310 that controls the overall DA converter 300 and serves as a constant current source selection controller, a current source cell unit 350 including a plurality of constant current, and a voltage amplitude controller 360 for controlling the amplitude of a reference signal, which serves as a current setting unit for setting the operation currents of the current source cells in the current source cell unit 350.

The DAC controller 310 includes a block controller 320 for controlling the operation of the elements forming the DAC controller 310, a lower-bit controller 330 disposed at an input stage of an input digital signal Din to control the processing of lower bits, and a higher-bit controller 340 disposed at an input stage of the input digital signal Din to control the processing of higher bits.

The current source cell unit 350 includes a lower-bit current source cell portion 352 having a plurality of lower-bit current source cells 353 for outputting predetermined weighted currents and a higher-bit current source cell portion 354 having higher current source cells 355 disposed in a matrix to output an identical predetermined weighted current.

In the lower-bit current source cell portion 352, the j lower-bit current source cells 353 assigned to the j lower bits of the digital input signal are disposed in parallel. The output terminals of the lower-bit current source cells 353 are connected to a selection output line 396 for combining the output currents of the lower-bit current source cells 353. The selection output line 396 is connected to a DAC output terminal DACout.

The weights applied to the currents of the lower-bit current source cells 353 of the lower-bit current source cell portion 352 are $½, ¼, \ldots, ½^j$ of the current of the higher-bit current source cells 355 of the higher-bit current source cell portion 354. The lower-bit current source cells 353 are individually selected by the lower-bit controller 330 in accordance with the logical levels (1 or 0) of the j lower bits of the input digital signal Din. The output currents of the lower-bit current source cells 353 selected by the lower-bit controller 330 on the basis of the j lower bits of the input digital signal Din are added by a reference resistor 398 connected at one end to a reference voltage Vref via the DAC output terminal DACout.

In the higher-bit current source cell portion 354, at least $2^i$ (more preferably, $2^i+y$ (y is a certain value)) higher-bit current source cells 355 assigned to the i higher bits are disposed in a two-dimensional matrix. Matrix selection lines 358 for selecting the higher-bit current source cells 355 are disposed around the higher-bit current source cells 355 in accordance with the arrangement of the higher-bit current source cells 355.

In the higher-bit current source cell portion 354, the higher-bit current source cells 355 are selected by the higher-bit controller 340 in accordance with the higher bit data of the digital input signal. As in the lower-bit current source cell portion 352, the output currents of the higher-bit current source cells 355 are added in the DAC output terminal DACout. The output voltage of the DAC output terminal DACout is defined by the product of the added current Idac and the resistance Rref of the reference resistor 398.

Within the voltage amplitude controller 360, current source cells for adjusting currents are disposed. The current-adjusting current source cells form a current mirror between the current source cells 353 of the lower-bit current source cell portion 352 and the current source cells 355 of the higher-bit current source cell portion 354. Because of the formation of a current mirror, the operation currents of the current source cells 353 and 355 within the current source cell unit 350 can be set, and a DA conversion circuit that is operable with a certain gain can be implemented. By adjusting the operation current, the gain can be varied in a range from −3 dB to 20 dB. Since the current source cell unit 350 is controlled by digital signals, the DA converter 300 is operable as a DA conversion circuit that can convert an input digital signal Din into an analog signal with a desired gain. This is described in detail below.

The block controller 320 controls the higher-bit controller 340 and the lower-bit controller 330 based on the multi-bit digital signal Din supplied from the communication/timing controller 20. For example, the block controller 320 decodes the i higher bits into a decimal number, and controls shift registers forming a shift register unit 342 based on the decimal number.

The block controller 320 receives various control signals J320 for controlling the DA conversion mode, DA conversion start, DA conversion resolution, etc., and based on the input digital signal Din (for example, decoded value) and control signals J320, the block controller 320 supplies control signals J330 and control signals J340 to the lower-bit controller 330 and the higher-bit controller 340, respectively.

The control signals J330 include a reset signal for resetting an output of a scaling processor 332 to a constant logical level (clear value in this embodiment). The control signals J340 include a reset signal and a set signal for setting an output of the shift register unit 342 to a constant logical level (clear value and full value in this embodiment).

The DA conversion count clock CKdac is input into the block controller 320 from the communication/timing controller 20 as an external clock. The block controller 320 then shapes the count clock CKdac into an internal count clock CKcnt and supplies it to the lower-bit controller 330.

The block controller 320 also supplies control signals J342 to the higher-bit controller 340 to restrict the number of higher-bit current source cells 355 to define the DA digital resolution (for example, "i" of i bits). The control signals J342 include, for example, enable signals for controlling the activation of the shift registers. When the enable signals to be supplied to the output enable (OE) terminals of the shift registers are active, the outputs of the shift registers become enabled, and when the enable signals are inactive, the output of the shift registers become disabled (for example, the non-inverted output terminal Q is maintained at L level and the inverted output terminal xQ is maintained at H level).

For example, it is now assumed that the maximum resolution of the higher-bit current source cells 355 is i bits ($2^i$). If the higher-bit current source cell portion 354 is used with the resolution of x (xi), the activation of the shift registers can be controlled so that only the $2^x$ higher-bit current source cells 355 are activated. In this case, it is sufficient if i control signals J342 (control signals J342_1 through J342_j) are supplied.

The control signal J342_1 activates the first higher-bit current source cell 355 and the control signal J342_2 activates second through $2^2$-th higher-bit current source cells 355. Similarly, the control signals J342_1 through J342_x activate the $1+2^{(x-1)}$-th through $2^x$-th higher-bit current source cells 355. That is, the total number of $2^i$ (may be $2^i+y$) higher-bit current source cells 355 have been divided into x blocks, and only the higher-bit current source cells 355 having a desired digital resolution have been selected.

The lower-bit controller 330 includes the scaling processor 332 and a glitch suppression processor 336. The scaling processor 332 has a counter (i.e., scaler for scaling the clock) for counting the internal count clock CKcnt supplied from the block controller 320. The glitch suppression processor 336 has a plurality of glitch suppression circuits for suppressing glitch occurring in an output of the DA converter 300. The same number of glitch suppression circuits as the number of current source cells 353 disposed in the lower-bit current source cell portion 352 are provided.

The scaling processor 332 can execute DA conversion corresponding to one least significant bit (LSB) during one clock period. More specifically, the scaling processor 332 includes (j−1) scalers for generating currents weighted with 1/two-to-the-power-of-certain-numbers, and supplies a ×1 clock, which is the count clock CKcnt itself, and (j−1)-bit lower binary outputs, i.e., clocks scaled down to ½, ¼, ..., $½^{(j-1)}$ by the scalers, to the corresponding glitch suppression circuits of the glitch suppression processor 336 as selection control signals (details of the scaling operation are described below). That is, clocks scaled down to $½^k$ (k is from 0 to j−1) corresponding to the j lower-bit binary data are supplied to the glitch suppression processor 336_j−k. The scaling processor 332 serves as a selector for the j lower-bit current source cells 353 disposed in the lower-bit current source cell portion 352.

The glitch suppression processor 336 performs glitch suppression processing by using the corresponding glitch suppression circuits and supplies the clocks scaled down to $½^k$ (k is from 0 to (j−1)) to the current source cells 353 having current values $½^{(j-k)}$. For example, the ×1 clock is supplied to the lower-bit current source cell 353_j having a current value $½^j$, the ½-scaled-down clock is supplied to the lower-bit current source cell 353_j−1 having a current value $2^{(j-1)}$, and the ¼-scaled-down clock is supplied to the lower-bit current source cell 353_j−2 having a current value $2^{(j-2)}$. Thereafter, similarly, the $½^{(j-2)}$-scaled-down clock is supplied to the lower-bit current source cell 353_2 having a current value ¼, and the $½^{(j-1)}$-scaled-down clock is supplied to the lower-bit current source cell 353_1 having a current value ½.

The lower-bit controller 330 includes the same number of selection lines 338 as the number of lower-bit current source cells 353 to select the lower-bit current source cells 353 of the lower-bit current source cell portion 352. The lower-bit controller 330 controls the selection lines 338 to select the lower-bit current source cells 353 corresponding to the lower-bit data values of a digital input signal. In this example, the glitch suppression processor 336 is interposed on the selection lines 338 between the scaling processor 332 and the lower-bit current source cell portion 352.

The glitch suppression processor 336 almost simultaneously outputs positive logic output Q and negative logic output xQ (hereinafter also referred to as the "complementary output") from the output terminals based on the scaled-down clocks output from the scaling processor 332. In accordance with the complementary output of the glitch suppression processor 336, two selection lines forming the selection lines 338 are connected to each of the lower-bit current source cells 353 (more specifically, the input terminal of the differential switch of each cell 353). Details of the glitch suppression processor 336 are given below.

The lower-bit controller 330 includes a shift controller 333 for supplying a signal indicating a carry bit or a borrow bit to the shift register unit 342 of the higher-bit controller 340 as a shift clock CKsr. For example, the shift controller 333 includes an inverter 334 having a buffer function of inverting the logical bit of the clock scaled down to $½^{(j-1)}$ of the lower-bit binary outputs of the scaling processor 332 to generate the shift clock CKsr indicating a carry bit. The scaling processor 332 inverts the phase of the clock scaled down to $½^{(j-1)}$ via the inverter 334, and supplies one of the changed edges to the higher-bit controller 340 as the shift clock CKsr.

The above-described configuration of the shift controller 333 is an example only. Alternatively, a carry pulse that can be generated during the up-counting operation may be used as the shift clock CKsr indicating a carry bit, and a borrow pulse that can be generated during the down-counting operation can be used as the shift clock CKsr indicting a borrow bit.

The higher-bit controller 340 includes the shift register unit 342 having the same number of shift registers as the i higher bits ($2^i$) and a glitch suppression processor 346 having a plurality of glitch suppression circuits for suppressing the occurrence of glitch in an output of the DA converter 300. The same number ($2^i$) of glitch suppression circuits as the number of current source cells 355 disposed in the higher-bit current source cell portion 354 are provided. The shift clock CKsr is supplied to the shift register unit 342 from the lower-bit controller 330.

The shift register unit 342 can execute DA conversion corresponding to the i higher bit data values. More specifically, the shift register unit 324 includes cascade-connected shift registers to sequentially handle the higher i-bit digital signals. The shift output terminals of the shift registers are sequentially activated in a predetermined direction based on the shift clock CKsr supplied from the lower-bit controller 330 so that the i higher bits of the input digital signal can be decoded into a decimal number and the decimal number can be output to the shift output terminals.

The shift outputs from the shift registers are supplied as selection control signals to the corresponding glitch suppression circuits of the glitch suppression processor 346 (details thereof are given below). The glitch suppression processor 346 performs glitch suppression processing on the selection control signals by using the corresponding glitch suppression circuits, and supplies the selection control signals to the corresponding higher-bit current source cells 355 of the higher-bit current source cell portion 354.

The higher-bit controller 340 includes the same number of matrix selection lines 348 (corresponding to the matrix selection lines 358) as the number of higher-bit current source cells 355 to select the higher-bit current source cells 355 of the higher-bit current source cell portion 354. The higher-bit controller 340 controls the matrix selection lines 348 to select the corresponding higher-bit current source cells 355 associated with the higher bit data values of the digital input signal.

In this embodiment, the glitch suppression processor 346 is interposed on the matrix selection lines 348 between the shift register unit 342 and the higher-bit current source cell portion 354.

The glitch suppression processor 346 performs complementary output based on the shift outputs from the shift register unit 342. Two selection lines forming the matrix selection lines 358 disposed around the higher-bit current source cell portion 354 in accordance with the outputs Q and xQ of the glitch suppression processor 346 are connected to each of the higher-bit current source cells 355 (more specifically, the input terminal of the differential switch of the cell 355).

In the shift register unit 342, the control signals J342_1 through J342_i for controlling the digital resolution are supplied to the output enable terminals of the shift registers from the block controller 320. If the shift registers are used with the resolution of x ($x \leq i$) bits, the enable signals are output so that only the $2^x$ shift registers are activated.

The control signal J342_1 activates the first shift register and the control signal J342_2 activates second through $2^2$-th shift registers. Similarly, the control signals J342_1 through J342_x activate the $1+2^{(x-1)}$-th through $2^x$-th shift registers. That is, the total number of $2^i$ (may be $2^i+y$) shift registers have been divided into x blocks and only the shift registers corresponding to a desired digital resolution have been selected. Then, only the higher-bit current source cells 355 having a desired digital resolution can be used.

The digital resolution may be controlled in units of bits, as described above. Alternatively, it may be controlled by a certain value z. For example, it is now assumed that z is 34 when i higher bits are 7 bits and a certain value y is 8 and when each block has four shift registers. In this case, a control signal associated with a desired digital resolution is input into every z shift registers.

The higher-bit controller 340 selects the number of higher-bit current source cells 355 associated with the higher-bit data value of a digital input signal to perform DA conversion on the higher-bit data. In this case, control is performed so that only the number of shift registers or higher-bit current source cells 355 associated with the digital resolution can be selected. Then, DA conversion is not conducted after the target digital resolution is reached. That is, the higher-bit controller 340 starts DA conversion on higher-bit data based on the shift clock CKsr supplied from the lower-bit controller 330, and also, automatically stops DA conversion when the target digital resolution is reached.

The shift register unit 342 sequentially activates the shift output terminals of the cascade-connected shift registers in a predetermined direction based on the shift clock CKsr supplied from the lower-bit controller 330. In this case, if the lower-bit controller 330 performs a shift-up operation, the shift clock CKsr indicates a carry bit, and then, the shift register unit 342 performs a shift operation so that one higher-bit current source cell 355 is further activated. On the other hand, if the lower-bit controller 330 performs a shift-down operation, the shift clock CKsr indicates a borrow bit, and then, the shift register unit 342 performs a shift operation so that the final-stage higher-bit current source cell 355 which is being inactivated is further inactivated.

The operation of the DA converter 300 is briefly discussed below. To count bits speedily and reliably, the required number of bits are divided into the i higher bits and j lower bits by using the scaling processor 332, which operates as a clock counter, and the higher-bit controller 340. For the j lower bits, clocks scaled down to 1/two-to-the-power-of-certain-numbers are generated, and the scaling processor 332 selects the j lower-bit current source cells 353 disposed in the lower-bit current source cell portion 352. For the i higher bits, based on the shift clock CKsr supplied from the scaling processor 332, the shift registers of the higher-bit controller 340 are activated or inactivated in a predetermined direction for each clock, and then, the higher-bit current source cells 355 of the higher-bit current source cell portion 354 are selected and driven.

With this configuration, the lower-bit current source cell portion 352 controlled in the binary counter mode and the higher-bit current source cell portion 354 controlled in the decoding mode can be operated in cooperation with each other. Even if a digital signal is input at high speed, two portions divided from the current source cell unit 350 based on the binary mode and the decoding mode can be operated almost simultaneously, and thus, the current source cells 353 and 355 corresponding to the input digital signal can be speedily and reliably selected. As a result, the occurrence of glitch or erroneous coding can be prevented, and the stable DA conversion operation can be implemented.

That is, in the DA converter 300 of this embodiment, an n-bit digital signal is divided into i higher bits and j lower bits (n=i+j). In the case of the i higher bits, the matrix-type higher-bit current source cell portion 354 having the higher-bit current cells 355 which are uniformly weighted to generate the same current value for the higher digital signal is formed, and the higher-bit current source cell portion 354 is controlled by the higher-bit controller 340 in the decoding mode. In the case of the j lower bits, the lower-bit current source cell portion 352 having the parallel-disposed weighted current source cells 353 to generate 1/two-to-the-power-of-certain-numbers currents is formed, and the lower-bit current source cell portion 352 is controlled by the lower-bit controller 330 in the binary counter mode.

By shifting the shift registers built in the higher-bit controller 340 in the direction associated with a carry bit or a borrow bit in the lower-bit controller 330 in association with the shift-up or shift-down operation of the lower-bit controller 330, the selection of the lower-bit current source cells 353 associated with the lower bits of the input digital value and the selection of the higher-bit current source cells 355 associated with the higher bits of the input digital value can be almost simultaneously performed. Details of the functions and operations thereof are specifically described below.

Overview of Overall Operation

Figure 5:
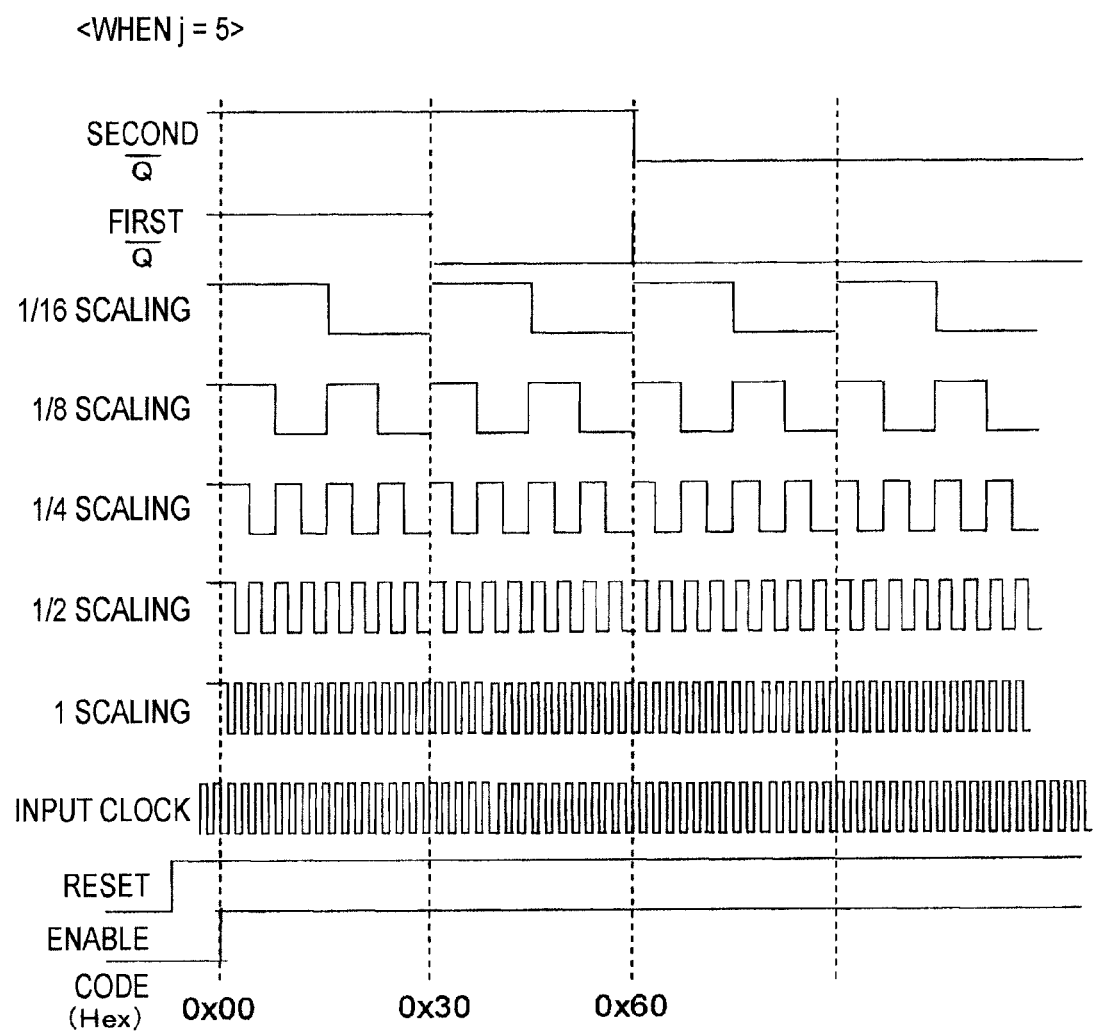
FIG. 5 is a timing chart illustrating the overall operation of a DA converter, mainly a lower-bit controller and a higher-bit controller.

FIG. 5 is a timing chart illustrating an overview of the overall operation of the DA converter 300, mainly the lower-bit controller 330 and the higher-bit controller 340. It is now assumed that the j lower bits are 5 and the $2^i$ higher-bit current source cells 355 are disposed in the higher-bit current source cell portion 354.

In FIG. 5, as well as the scaled-down clocks output from the scaling processor 332 of the lower-bit controller 330 and the shift outputs from the shift register unit 342 of the higher-bit controller 340, digital codes corresponding to the counter values are also shown. Although the digital codes are indicated by hexadecimal (Hex) in FIG. 5, they may be indicated in decimal or binary notation.

It is now assumed that, when the outputs from the scaling processor 332 and the shift register unit 342 are at low level, the lower-bit current source cells 353 and the higher-bit current source cells 355 are turned ON. Accordingly, the initial output values of the scaling processor 332 and the shift register unit 342 are at high level, and all the current source cells 353 and 355 are turned OFF.

When the reset signal is HIGH and the enable signal is HIGH, an input clock can be transmitted to the scaling processor 332. Accordingly, when the reset signal is LOW or the enable signal is LOW, the outputs from all the scaled-down clocks are at high level, and the current source cells 353 and 355 are turned OFF. The operation is started from the initial state (reset state) by the enable signal, and the set signal is used for turning ON some of the shift registers from the reset state.

In the scaling processor 332, when the ×1 clock (the same as CK0) is shifted to high level, the ½ scaler performs the switching operation, and when the ×1 clock is shifted to high level 16 times, the ¹⁄₁₆ scaler performs switching.

In the shift register unit 342, the shift operation is performed by using the shift clock CKsr generated based on the ¹⁄₁₆-scaled-down clock output from the ¹⁄₁₆ scaler of the scaling processor 332. Accordingly, the outputs from the shift registers are sequentially activated every 16 clocks.

In the example shown in FIG. 5, when the ¹⁄₁₆-scaled-down clock is shifted to high level the second time, the non-inverted output of the shift register is shifted to the high level and the inverted output is shifted to the low level, and then, the first higher-bit current source cell 355_1 is turned ON. In this manner, every time the ¹⁄₁₆-scaled-down clock is shifted to the high level, the non-inverted outputs of the shift registers are sequentially shifted to the high level and the inverted outputs are sequentially shifted to the low level, and then, the corresponding k-th lower-bit current source cell 353_$k$ is turned ON. This operation is continued until the final $2^i$-th higher-bit current source cell 355_2$^i$ is turned ON unless the control signals J330 or J340 output a reset signal.

Basic Configuration of Current Source Cell

Figure 6:
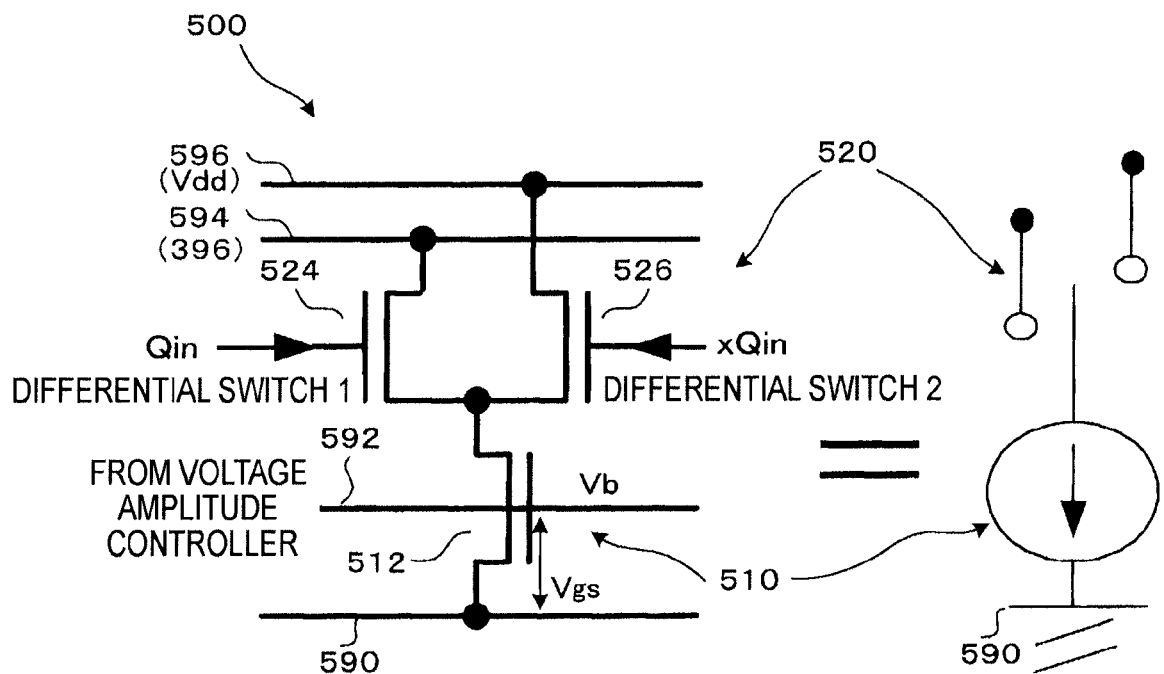
FIG. 6 illustrates a basic configuration of each current source cell disposed in a current source cell portion.

FIG. 6 illustrates the basic configuration of each current source cell 353 or 355 disposed in the current source cell unit 350. A basic current source cell 500 is operated upon receiving complementary signals in accordance with the complementary-output-type lower-bit controller 330 or higher-bit controller 340.

The basic current source cell 500 includes, as shown in FIG. 6, a unit current source 510 and a changeover switch 520 for switching an output current of the unit current source 510.

The unit current source 510 includes an NMOS transistor 512, which serves as a reference current source. The changeover switch 520 includes two NMOS transistors 524 and 526 differentially connected to each other. The NMOS transistor 524 serves as a differential switch 1 and the NMOS transistor 526 serves as a differential switch 2.

The NMOS transistor 512 is connected at a source terminal to an analog ground line 590 and at a drain terminal to the source terminals of the NMOS transistors 524 and 526. A bias voltage Vb, which is applied to all the cells, is applied to the gate terminal of the NMOS transistor 512 from the voltage amplitude controller 360 via a current control line 592 based on the concept of a current mirror, and the current flowing in the NMOS transistor 512 is changed depending on the potential difference Vgs.

In the two NMOS transistors 524 and 526 forming the changeover switch 520, complementary control signals Qin and xQin (x indicates a logical inverted signal) are input into the gate terminals of the NMOS transistors 524 and 526, respectively, and lead lines 594 and 596 are connected to the drain terminals of the NOMS transistors 524 and 526, respectively. For example, the active-high (H) control signal (non-inverted input) Qin is input into the gate terminal of the NMOS transistor 524, and the drain terminal thereof is connected to the lead line 594, and the lead line 594 serves as the current-output selection output line 396. The control signal (inverted input) xQin is input into the gate terminal of the NMOS transistor 526, and the drain terminal thereof is connected to the lead line 596, and the lead line 596 is connected to a power supply Vdd. In the basic current source cell 500, the active-H control signal (non-inverted input) Qin is input into the selection output line 396 to turn ON the NMOS transistor 524, and then, the corresponding current source cell is turned ON.

Details of Current Source Cell Unit

Figure 7:
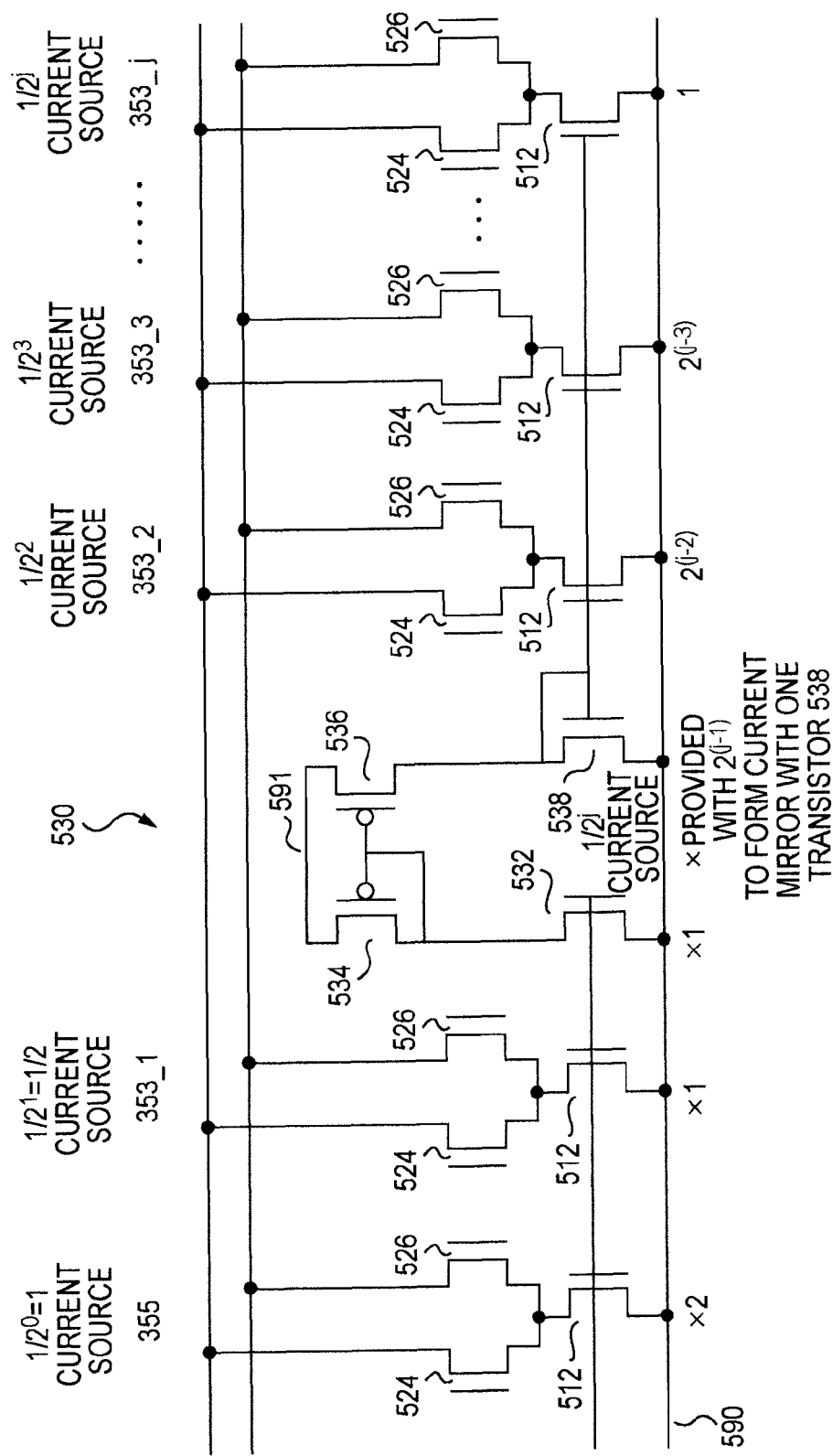
FIG. 7 illustrates a detailed configuration of a current source cell portion.

FIG. 7 illustrates the detailed configuration of the current source cell unit 350. As the individual current source cells, the basic current source cells 500 shown in FIG. 6 are used, and the operation currents to be supplied to the individual current source cells and the number of combinations of the basic current source cells 500 can be adjusted, and then, the current source cells 353 and 355 for generating bit-dependent weighted current values are formed. Basically, the potential applied to the gate of the NOMS transistor 512 is adjusted so that a basic current source having a current value weighted with a predetermined output current is prepared. Then, current source cells that can output a current in proportional to two to the power of certain numbers or 1/two-to-the-power-of-certain-numbers of the potential input into the gate of the NMOS transistor 512 are disposed in accordance with the basic current source.

More specifically, the lower-bit current source cell 353_1 having a ½ current value corresponding to the $½^{(j-1)}$ scaled-down clock is formed by the basic current source cell 500 shown in FIG. 6. The level of the output current (½) is determined by the potential input into the gate of the NMOS transistor 512 and is controlled by the voltage amplitude controller 360, as stated above.

Two cells similar to the lower-bit current source cell 353_1 are disposed in parallel so that the higher-bit current source cell 355 having a current value 1 is formed. The i (or i+y) higher-bit current source cells 355 are prepared so that the higher-bit current source cell portion 354 is formed.

To form the lower-bit current source cells 353_2, . . . , 353_j weighted with ¼, . . . , $½^j$, respectively, the output current (½) of the lower-bit current source cell 353_1 is branched into $½^{j-1}$ based on the concept of a current mirror so that a current source 530 that outputs currents weighted with $½^j$ is formed. Then, the same number of basic current source cells 500 shown in FIG. 6 operating with the current value $½^j$ as the predetermined number of weights are disposed in parallel so that the lower-bit current source cells 353_2, . . . , 353_j for generating constant currents weighted with ¼, . . . , $½^j$ are formed. With this configuration, by using the same size of elements that can exhibit high relative ratio precision, current source cells that can output currents having different weights can be formed with high precision.

The current source 530 includes a transistor 532 having a gate to which the same potential is supplied for the lower-bit current source cell 353_1 and the higher-bit current source cell 355, which is a basic current source, two PMOS transistors 534 and 536, which are connected to each other based on the concept of a current mirror, disposed at the output side (drain terminal) of the transistor 532, and $2^{(j-1)}$ NMOS transistors 538 disposed at the output side (drain terminal) of the transistor 534 and having a gate and a drain connected to each other.

The source terminals of the transistors 532 and 538 are connected to an analog ground line 590, and the source terminals of the transistors 534 and 536 are connected to a power supply line 591. With this configuration, one transistor 538 can serve as a current source for outputting a current weighted with $½^j$. The gates of the parallel-connected MOS transistors 538 are controlled with the same reference voltage so that the MOS transistors 538 can be operated with a constant current, and the plurality of MOS transistors 538 having the same characteristics can form a branched path for the current source cells. Accordingly, a high-precision current branched path can be formed.

One transistor 538 and each of the transistors 512 of the lower-bit current source cells 353_2, . . . , 353_j form a current mirror circuit, and the same number of basic current source cells 500 configured as shown in FIG. 6 having the transistors 512 as the number of weighted current values are disposed in parallel. Then, the lower-bit current source cell 353_2 outputs a current having a weight ¼ ($=½^2$), the lower-bit current source cell 353_3 outputs a current having a weight ⅛ ($=½^3$), the lower-bit current source cell 353_4 outputs a current having a weight 1/16 ($=½^4$), and the lower-bit current source cell 353_j (j=5) outputs a current having a weight 1/32 ($=½^5$).

With this configuration, without the need to use elements of extremely deformed sizes or shapes or to significantly increase the number of elements in the higher-bit current source cell portion 354 corresponding to the higher bits of a digital input signal, current source cells having different weights can be formed with high precision by using the same size of elements that can exhibit high relative ratio precision. The resolution of DA conversion can be enhanced without the need to increase the circuit scale.

In the higher-bit current source cell portion 354, the number associated with the data value (decimal) of the higher bits of a digital input signal is selected, and in the lower-bit current source cell portion 352, the number associated with the lower bit value (bit data itself) of the input signal is selected. Accordingly, the bit resolution can be enhanced with the addition of the lower-bit current source cells.

Additionally, a current value having a ½ weight of a basic current corresponding to the digit number (the weight "1" of the sixth bit in the previous example) of predetermined digits is generated by the lower-bit current source cell 353_1. Then, by branching the output current ½ to 1/two-to-the-power-of-certain-numbers ($½^{j-1}$) to form a branched path (corresponding to the transistor 532), 1/two-to-the-power-of-certain-numbers ($½^j$) currents of the basic current can be extracted. Thus, high-precision current source cells can be formed with the same size of elements.

Current source cells are formed of constant current circuits using MOS transistors, and the current weights of the constant current circuits are determined by the number of parallel-connected MOS transistors having the equal characteristics. Then, the resulting current source cells are not influenced by manufacturing variations and thus exhibit high relative ratio precision.

In this example, the higher-bit current source cells 355 and the lower-bit current source cell 353_1 are formed by using a current source cell that outputs a ½ weighted current value as the basic element, and then, the operation current of the lower-bit current source cell 353_1 is branched to $½^{(j-1)}$ to form the current source 530 that outputs the weighted current value $½^j$ (1/32 since j=5). Then, the remaining lower-bit current source cells 353_2 through 353_j in the lower-bit current source cell portion 352 are formed by using the current source cell that outputs the $½^j$-weighted current value as the basic element. However, this is an example only, and the current source 530 may be configured in any manner as long as it can output a current with a weight $½^j$ with high precision. It should be noted, however, that the current source 530 should be configured so that currents having different weights can be output with high precision, as in the configuration shown in FIG. 7.

Details of Scaling Processor

Figure 8:
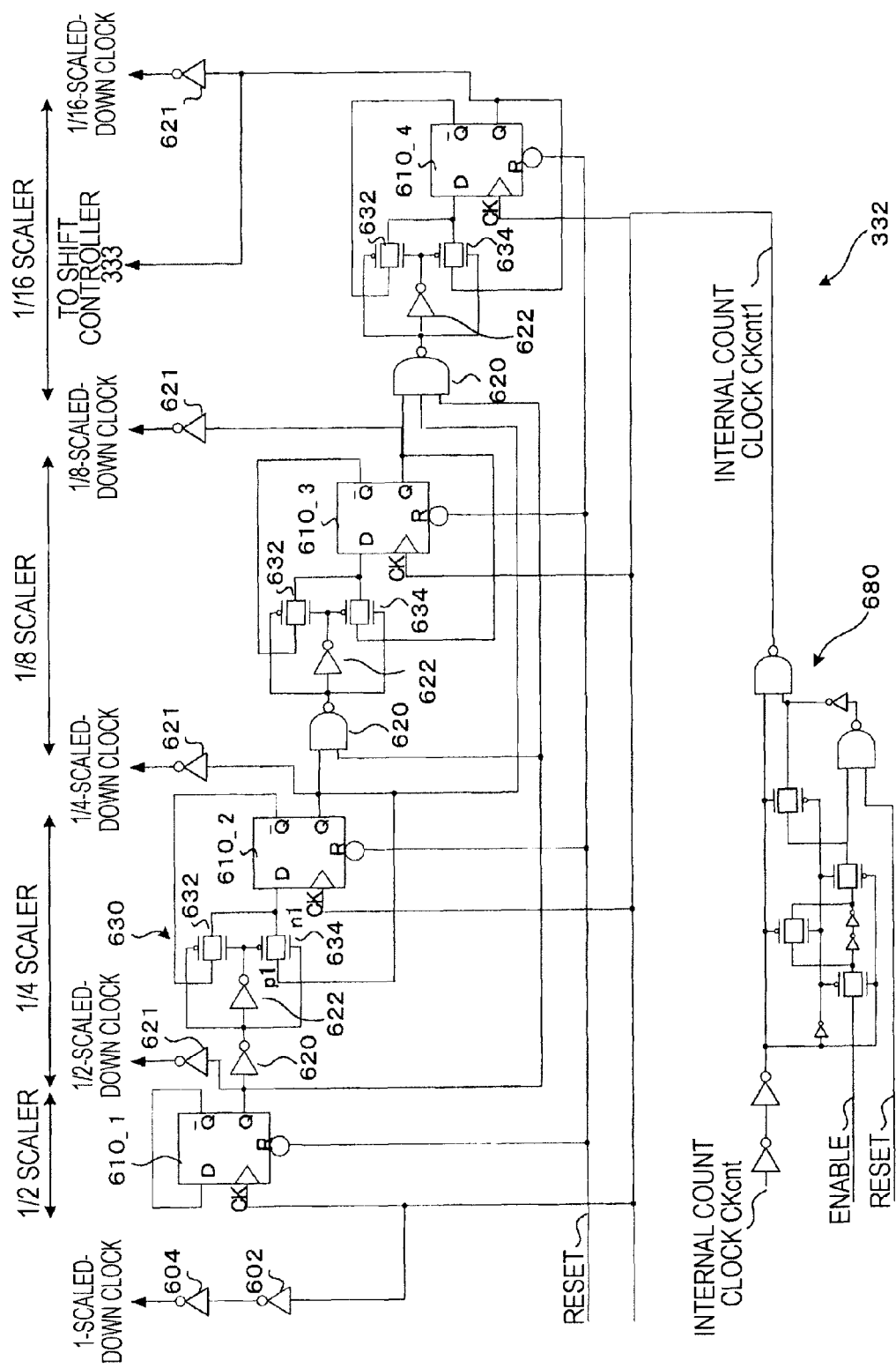
FIG. 8 illustrates a detailed configuration of a scaling processor.

FIG. 8 illustrates the detailed configuration of the scaling processor 332. It is now assumed that the j lower bits are 5 and the scaling processor 332 performs a down-counting operation and outputs scaled-down clocks in synchronization with the internal count clock CKcnt supplied from the block controller 320.

More specifically, as shown in FIG. 8, the scaling processor 332 includes two cascade-connected inverters 602 and 604 for outputting a ×1-scaled-down clock, and also includes four cascade-connected D flip-flops (hereinafter sometimes collectively referred to as the "D-FF") 610 for outputting $\frac{1}{2}, \ldots, \frac{1}{2^j}$-scaled-down clocks. The output of the inverter 604 is input into the glitch suppression processor 336_j as the ×1-scaled-down clock, and the output of the non-inverted output terminal Q of each D-FF 610 is input into the corresponding glitch suppression processor 336_j–k as the $\frac{1}{2^k}$-scaled-down clocks (k is from 1 to j–1).

Between adjacent D-FFs 610, a cascade-connected circuit composed of a gate (inverter or NAND) 620 for receiving the output at least from the non-inverted output terminal Q of the D-FF 610 immediately before and an inverter 622, and a switch circuit 630 combined from transfer gate circuits (one-input one-output switches) 632 and 634 using complementary transistors having opposite polarities are provided. An inverter 621 is connected to the non-inverted output terminal Q of the D-FF 610, and a scaled-down clock is output via the inverter 621. An output signal of the non-inverted output terminal Q of the final-stage D-FF 610_4 is also supplied to the shift controller 333.

The internal count clock CKcnt1 is supplied to the clock input terminals CK of the D-FF 610_1 through 610_4 via a clock gate circuit 680 after it is gated by the clock gate circuit 680, and also, a reset signal (active low) contained in the control signals J330 is supplied to the input terminals R of the D-FF 610_1 through 610_4 from the block controller 320. The clock gate circuit 680 includes various gates, such as inverters, NANDs, and transfer gates. The clock gate circuit 680 gates the internal clock CKcnt based on the reset signal and enable signal and then supplies the internal clock CKcnt1 to the D-FF 610.

The enable signal controls the input of the clock into the D-FF 610, and only when the enable signal is active, the D-FF 610 becomes enabled. As a result, the D-FF 610 operates in synchronization with the internal count clock CKcnt only when the enable signal is active, and the output of the D-FF 610 is maintained unless the D-FF 610 is enabled by the enable signal. That is, the enable signal can control the activation of the D-FF 610, which serves as a scaler.

The number of inputs of the gate 620 is different depending on the stage between the D-FFs 620. The gate 620 between the first stage and the second stage has one input and is actually an inverter. The gate 620 between the second stage and the third stage is a NAND having two inputs, and the non-inverted output Q of the first-stage D-FF 610_1 is input into the second input terminal of the NAND. The gate 620 between the third stage and the fourth stage is a NAND having three inputs, and the non-inverted output Q of the second-stage D-FF 610_2 is input into the second input terminal of the NAND, and the non-inverted output Q of the first-stage D-FF 610_1 is input into the third input terminal of the NAND.

The transfer gate 632 receives the inverted output xQ (indicated by Q with an overbar in FIG. 8) of the D-FF 610 immediately before the transfer gate 632, and the transfer gate 634 receives the non-inverted output Q of the D-FF 610 immediately before the transfer gate 634. The outputs of the transfer gates 632 and 634 are supplied to the D input terminal of the D-FF 610 immediately after the transfer gates 632 and 634.

The transfer gate circuits 632 and 634 are each formed of a CMOS switch formed by connecting the sources or the drains of a P-channel MOS transistor p1 and an N-channel MOS transistor n1. The gates of the MOS transistor p1 and the MOS transistor n1 are simultaneously switched ON or OFF by complementary signals supplied via the inverter 622. The complementary signals are supplied to the transfer gate circuits 632 and 634 in opposite phases so that the transfer gate circuits 632 and 634 are controlled to be ON or OFF in opposite phases.

As the CMOS switch, only one type of transistors, i.e., P-channel MOS transistors p1 or N-channel transistors n1, may be used. In this case, however, the threshold voltage Vth may influence the switching performance. Accordingly, in this embodiment, a CMOS switch using both MOS transistors p1 and n1 is employed so that complementary signals can simultaneously switch ON the transfer gate circuits 632 and 634.

By simultaneously switching ON the MOS transistors p1 and n1, the resistance generated when the MOS transistors are turned ON can be reduced to be smaller than that when only one type of MOS transistors is used. Additionally, even if an open circuit failure occurs in one of the transistors, the CMOS switch still functions as a switch.

With this configuration, when the ×1-scaled-down clock (equal to the internal count clock CKcnt) is shifted to the H level, the switching operation of the ½-scaled-down clock is performed in the D-FF 610_1. Concerning each of the D-FF 610_2 through D-FF 610_4 corresponding to the ¼-scaled-down clock through the $\frac{1}{16}$-scaled-down clock, respectively, when the non-inverted outputs Q of all the previous-stage D-FFs 610 are at the H level, the transfer gate 632 is switched ON and the transfer gate 634 is switched OFF, and the inverted output xQ of the D-FF 610 is supplied to the D input terminal of the same D-FF 610. At this time, if the internal count clock CKcnt is input into the D-FF 610, the logical values of the inverted output Q and the non-inverted output xQ are inverted in synchronization with the rising edge of the internal count clock CKcnt (i.e., when the internal count clock CKcnt is shifted to the H level).

Then, one cycle of the ½-scaled-down clock is completed with two clock pulses of the ×1-scaled-down clock, and the internal count clock CKcnt can be scaled down to ½. Thereafter, similarly, one cycle of the $\frac{1}{2^k}$-scaled-down clock is completed with $2^k$ clock pulses of the ×1-scaled-down clock, and the internal count clock CKcnt can be scaled down to $\frac{1}{2^k}$. As a result, the lower-bit current source cells 353_1 through 353_5 are switched ON or OFF so that the j lower bits can be DA converted.

For example, in the initial state, the supply of the internal count clock CKcnt from the block controller 320 is stopped, and then, the clock input terminal CK is shifted to the L level, and also, the reset signal (active low) contained in the control signals J340 from the block controller 320 is supplied to the reset input terminal R of each D-FF 610. Then, each D-FF 610 is reset so that the non-inverted output terminal Q is set to be the L level and the inverted output terminal xQ is set to be the H level.

Accordingly, in the initial state, the outputs of all the scalers are shifted to the H level and are supplied to the lower-bit current source cells 353 via the glitch suppression processor 336, and then, all the lower-bit current source cells 353 are switched OFF. More specifically, the reset level (the output of the inverter 604 and the L level of the non-inverted output of the D-FF 610) of the $1/2^k$-scaled-down clock (k is from 0 to j−1) is supplied to the lower-bit current source cells 353 via the corresponding glitch suppression processor 336_j−k so that all the lower-bit current source cells 353 are switched OFF.

Then, the ×1-scaled-down clock is output from the inverter 604 in synchronization with the internal count clock CKcnt, and is input into the lower-bit current source cell 353_5 via the glitch suppression processor 336_5. That is, the internal count clock CKcnt itself is supplied to the lower-bit current source cell 353_5, and the lower-bit current source cell 353_5 generates a $1/2^j$ (in this embodiment, $1/32$)-weighted current so that DA conversion for the LSB digital signal can be executed.

Every time the ×1-scaled-down clock is shifted to the H level, the logical level of the output of the first-stage D-FF 610_1 is inverted, and the ½-scaled-down clock output from the non-inverted output terminal Q is input into the lower-bit current source cell 353_4 via the glitch suppression processor 336_4. The lower-bit current cell source 353_4 generates $1/2^{(j-1)}$ (in this embodiment, $1/16$)-weighted current so that DA conversion for the second digital signal can be executed.

The non-inverted output Q of the D-FF 610_1 and the non-inverted output Q and the inverted output xQ of the D-FF 610_2 define the logical state of the D input terminal of the D-FF 610_2, and every time the ½-scaled-down clock is shifted to the H level, the logical level of the output of the second-stage D_FF610_2 is inverted. As a result, since an edge is generated in the D-FF 610_2 in every two cycles of the D-FF 610_1, one higher-bit control can be implemented, and the ON/OFF state of the lower-bit current source cell 353_3 is controlled. That is, the ¼-scaled-down clock output from the non-inverted output terminal Q is input into the lower-bit current source cell 353_3 via the glitch suppression processor 336_3. The lower-bit current cell source 353_3 generates $1/2^{(j-2)}$ (in this embodiment, ⅛)-weighted current so that DA conversion for the third digital signal can be executed.

The non-inverted output Q of the D-FF 610_1, the non-inverted output Q of the D-FF 610_2, and the non-inverted output Q and the inverted output xQ of the D-FF 610_3 define the logical state of the D input terminal of the D-FF 610_3, and every time the ¼-scaled-down clock is shifted to the H level, the logical level of the output of the third-stage D_FF 610_3 is inverted. As a result, since an edge is generated in the D-FF 610_3 in every two cycles of the D-FF 610_2, one higher-bit control can be implemented, and the ON/OFF state of the lower-bit current source cell 353_2 is controlled. That is, the ⅛-scaled-down clock output from the non-inverted output terminal Q is input into the lower-bit current source cell 353_2 via the glitch suppression processor 336_2. The lower-bit current cell source 353_2 generates $1/2^{(j-3)}$ (in this embodiment, ¼)-weighted current so that DA conversion for the fourth digital signal can be executed.

The non-inverted output Q of the D-FF 610_1, the non-inverted output Q of the D-FF 610_2, the non-inverted output Q of the D-FF 610_3, and the non-inverted output Q and the inverted output xQ of the D-FF 610_4 define the logical state of the D input terminal of the D-FF 610_4, and every time the ⅛-scaled-down clock is shifted to the H level, the logical level of the output of the fourth-stage D_FF 610_4 is inverted. As a result, since an edge is generated in the D-FF 610_4 in every two cycles of the D-FF 610_3, one higher-bit control can be implemented, and the ON/OFF state of the lower-bit current source cell 353_1 is controlled. That is, the ⅛-scaled-down clock output from the non-inverted output terminal Q is input into the lower-bit current source cell 353_1 via the glitch suppression processor 336_1. The lower-bit current cell source 353_1 generates $1/2^{(j-4)}$ (in this embodiment, ½)-weighted current so that DA conversion for the fifth digital signal can be executed.

Details of Shift Register Unit

Figure 9:
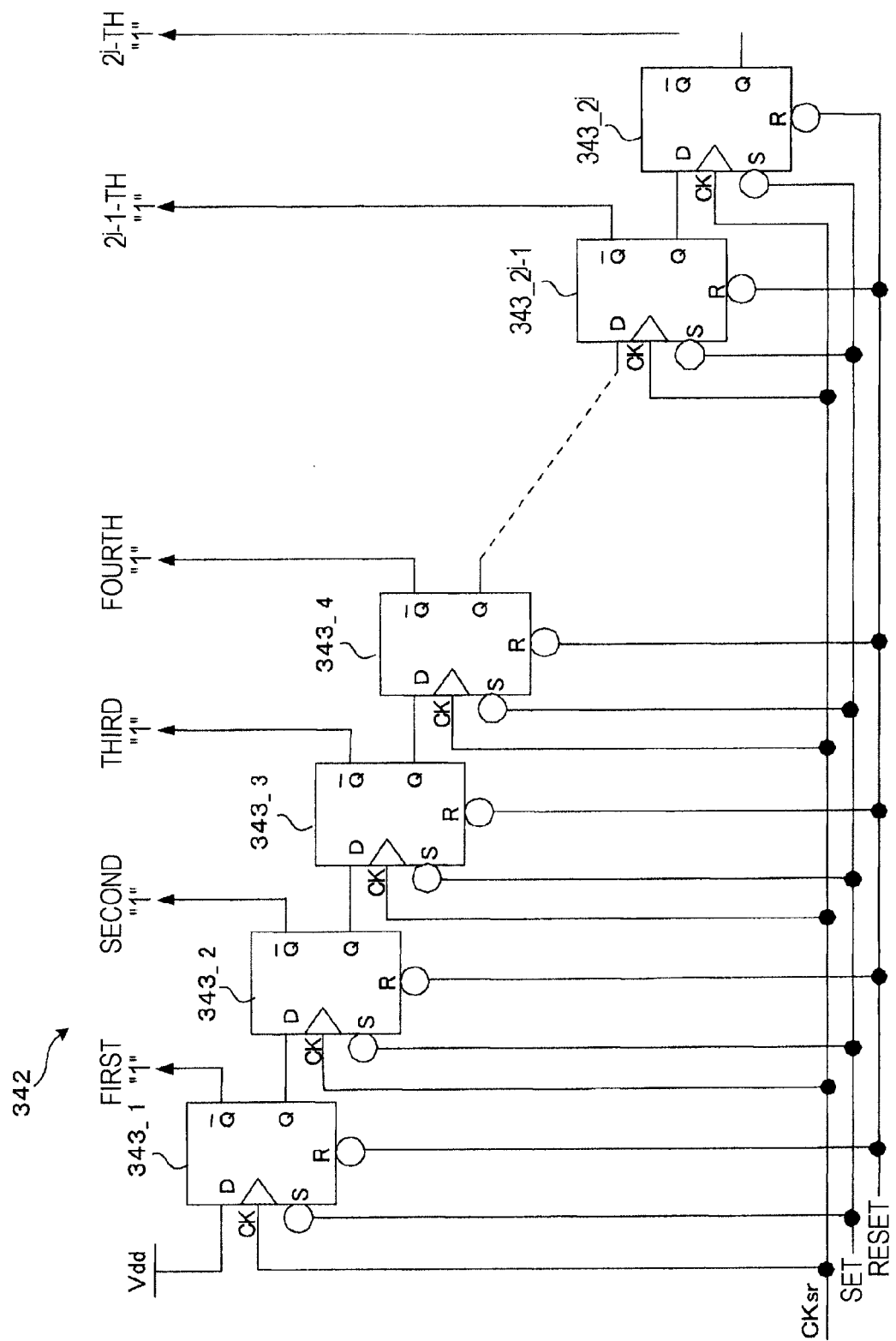
FIG. 9 illustrates a detailed configuration of a shift register unit.

FIG. 9 illustrates the detailed configuration of the shift register unit 342 when the higher-bit current source cells 355 for the i higher bits ($2^i$) for outputting a current value of 1 are disposed in the higher-bit current source cell portion 354.

The shift register unit 342 executes DA conversion on each bit of the i higher bits. More specifically, the shift register unit 342 includes cascade-connected shift registers 343 sequentially corresponding to the i higher bits of the digital signal, and sequentially sets the shift output terminals of the shift registers 343 to be active H based on the shift clock CKsr supplied from the lower-bit controller 330. That is, the shift register unit 342 outputs the data values decoded from the i higher bits of the input digital signal to the shift output terminals of the shift registers 343. The shift outputs of the shift registers 343 are supplied to the corresponding glitch suppression circuits of the glitch suppression processor 346. The glitch suppression processor 346 performs glitch suppression processing on the shift outputs by using the corresponding glitch suppression circuits, and then supplies the resulting outputs to the higher-bit current source cells 355 of the higher-bit current source cell portion 354.

More specifically, as shown in FIG. 9, the shift register unit 342 includes the cascade-connected shift registers 343 provided with the same number of D-FFs as the number of i-higher-bit ($2^i$) current source cells 355. The D input terminal of the first-stage shift register 343_1 is pulled up to the power supply, and the non-inverted output Q of the k-th shift register 343 is supplied to the D input terminal of the (k+1)-th shift register 343.

The shift clock CKsr, for example, the clock inverted from the $1/2^{(j-1)}$-scaled-down clock by the inverter 334, is supplied from the shift controller 333 to the clock input terminals CK Of the shift registers 343, and the shift registers 343 are operated in synchronization with the shift clock CKsr. The reset signal (active low) contained in the control signals J340 is supplied from the block controller 320 to the reset input terminals R of the shift registers 343. The set signal (active low) contained in the control signals J340 is also supplied from the block controller 320 to the set input terminals S of the shift registers 343.

The set signal is a signal supplied only to the shift registers 343. In this embodiment, the set signal is effective only when it is desired that the current source cell connected to the set signal is switched ON in the reset state. For example, the set signal is effective when an offset is provided for the output reference signal.

With this configuration, the shift register unit 342 is reset by the reset signal in the initial state, and is then set by the set signal. Then, a predetermined number of shift registers 343 are activated by the enable signal, and the first through $2^i$-th shift registers 343 are sequentially activated in synchronization with the shift clock CKsr so that the higher-bit current source cells 355 weighted with 1 are sequentially switched ON.

Accordingly, the ×1 (weighted with 1) higher-bit current source cells 355 are activated reliably one by one in synchronization with the shift clock CKsr. Since the shift clock CKsr is information indicating a carry bit or a borrow bit in the lower-bit controller 330, DA conversion performed by the shift register unit 342 and the higher-bit current source cell portion 354 under the control of the shift register unit 342 in synchronization with the shift clock CKsr is started from the (j+1)-th bit.

To define the digital resolution ("x" of x bits) of DA conversion by specifying the number of higher-bit current source cells 355 to be used by the control signals J342, the number of shift registers 343 to be activated is defined. That is, only a predetermined number of shift registers 343 corresponding to the desired digital resolution has been determined so that the only the higher-bit current source cells 355 corresponding to the desired digital resolution can be used.

For example, when an active edge of the shift clock CKsr is input into the clock input terminal CK of the shift register 343, the first shift register 343_1 outputs the H level indicating the state of the D input terminal to the non-inverted output terminal Q, and also sets the inverted output terminal xQ to the L level. The L level indicating the state of the inverted output terminal xQ is supplied to the higher-bit current source cell 355_1 via the corresponding glitch suppression processor 346_1 and switches ON the higher-bit current source cell 355_1.

When an active edge of the subsequent shift clock CKsr is input into the clock input terminal CK of the shift register 343, the second shift register 343_2 outputs the H level indicating the state of the D input terminal (i.e., the state of the non-inverted output terminal Q of the first shift register 343_1) to the non-inverted output terminal Q, and also sets the inverted output terminal xQ to the L level. The L level indicating the state of the inverted output terminal xQ is supplied to the higher-bit current source cell 355_2 via the corresponding glitch suppression processor 346_2 and switches ON the higher-bit current source cell 355_2.

Thereafter, similarly, when an active edge of the subsequent shift clock CKsr is input into the clock input terminal CK of the shift register 343, the k-th shift register 343_k outputs the H level indicating the state of the D input terminal (i.e., the state of the non-inverted output terminal of the (j−1)-th shift register 343_k−1) to the non-inverted output terminal Q, and also sets the inverted output terminal xQ to the L level. The L level indicating the state of the inverted output terminal xQ is supplied to the higher-bit current source cell 355_k via the corresponding glitch suppression processor 346_k and switches ON the higher-bit current source cell 355_k.

The above-described operation is sequentially performed on the activated shift registers 343 so that an analog voltage corresponding to the desired digital resolution can be generated. For the inactivated shift registers 343, even if an active edge of the shift clock CKsr is input into the clock input terminal CK, the non-inverted output terminal Q is maintained at the L level and the inverted output terminal xQ is maintained at the H level regardless of the state of the non-inverted output terminal Q of the previous shift register 343. Accordingly, after the target digital resolution has reached, DA conversion can be terminated.

If the digital resolution is 7 bits, when the $2^7$-th shift register 343 is switched ON, DA conversion performed by the higher-bit controller 340 and the higher-bit current source cell portion 354 is terminated. Alternatively, when the higher bit data of the desired input digital value (digital code) has reached, the supply of the shift clock CKsr from the lower-bit controller 330 may be stopped so that DA conversion for higher bits can be terminated.

Then, when DA conversion is terminated, the output currents of the current source cells 353 and 355 output to the selection output line 396 so far are combined, and the combined current is converted into a voltage by the reference resistor 398. Thus, a reference signal whose voltage level of the DAC output terminal DACout sequentially varies monotonously can be generated. That is, it is possible to provide a DA converter suitable for generating reference signal voltages used for so-called "single-slope-integrating" or (ramp-signal-comparison) AD conversion.

The DA converter 300 of this embodiment can be used, not only as a DA converter for generating reference signal voltages for single-slope-integrating AD conversion, but also as a general DA converter. For example, when a value corresponding to an input digital signal is reached, the voltage level of the DAC output terminal DACout when DA conversion is terminated can be used so that an analog voltage corresponding to the input digital signal can be obtained. That is, DA conversion can be conducted on a multi-bit input digital signal.

Since the timing for terminating DA conversion has been set only for the higher bits, it is difficult to guarantee the precision of the lower bits. For the lower bits, however, when the target data of the higher bits is reached, the supply of the internal count clock CKcnt can also be stopped when the j lower bits of the input digital signal are reached, and then, DA conversion on the lower bits can also be terminated. In this case, by using the voltage level of the DAC output terminal DACout when DA conversion is terminated at the point in which the value corresponding to the multi-bit input digital signal is reached, an analog voltage precisely reflecting the multi-bit input digital signal can be obtained. As a result, high-precision DA conversion on multi-bit input digital signals can be implemented.

Details of Glitch Suppression Processor

Figure 10A:
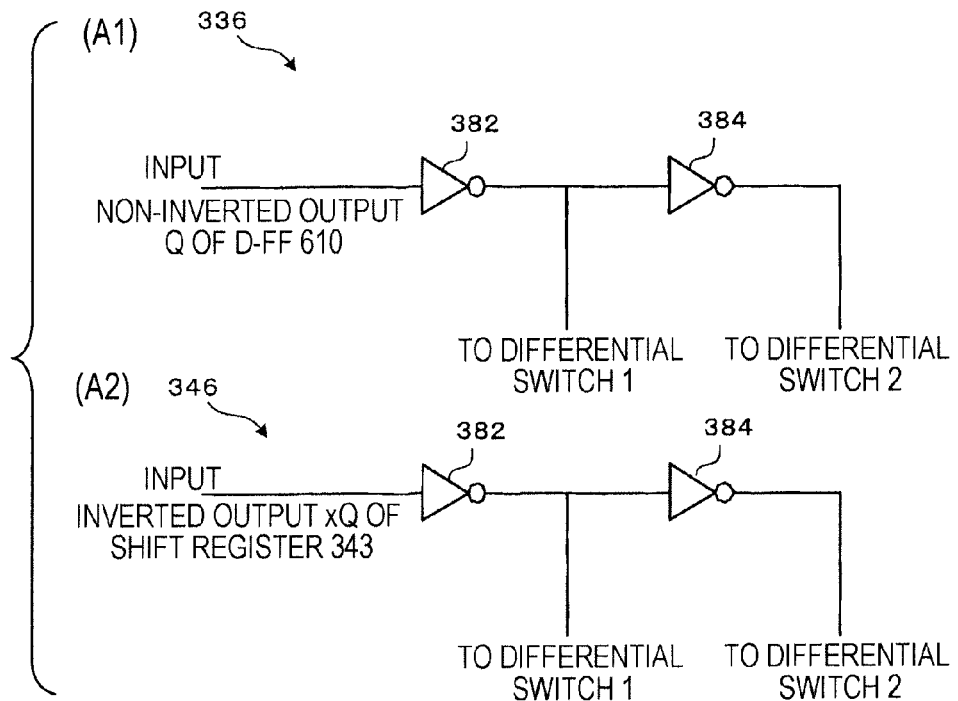
FIGS. 10A and 10B respectively illustrate a detailed configuration and an operation of a glitch suppression processor.
Figure 10B:
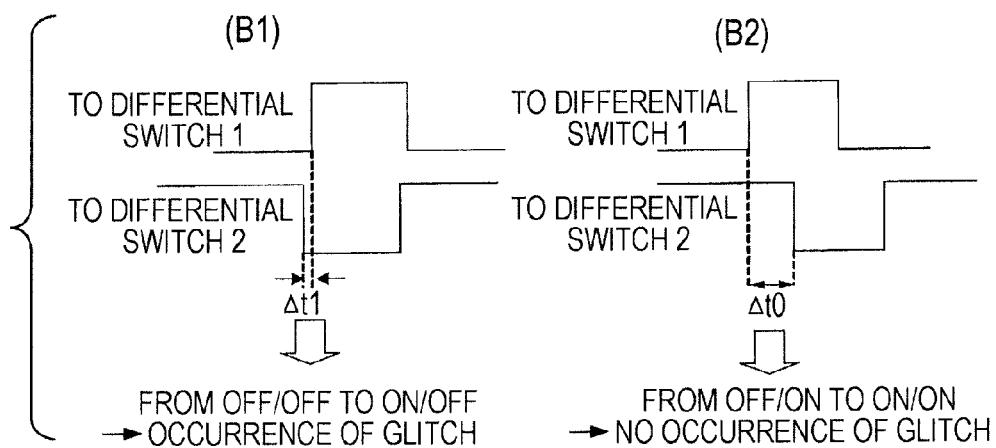

FIGS. 10A and 10B illustrate the detailed configuration of the glitch suppression processors 336 and 346 and the operation thereof. The glitch suppression processors 336 and 346 each include, as shown in FIG. 10A, cascade-connected inverters 382 and 384. The first-stage inverter 382 has a function of inverting the logical state (phase) of an input signal. The second-stage inverter 384 is a delay unit provided with a logical-state (phase) inversion function and a delay function for a delay $\Delta t0$.

The glitch suppression processors 336 and 346 configured as described above each supply, as complementary signals, a selection control signal for the transistor 524 (differential switch 1) which is not delayed by the inverter 384 and an inverted selection control signal for the transistor 526 (differential switch 2) which is delayed by the inverter 384 to the transistors 524 and 526, which form differential switches.

For example, as indicated by (A1) in FIG. 10A, in the glitch suppression processor 336, the output of the inverter 604 of the scaling processor 332 and the non-inverted output Q of the D-FF 610 of the scaling processor 332 are supplied to the inverter 382. Then, the inverted output xQ, which is the output of the inverter 382, is supplied to the gate of the transistor 524 operating as the differential switch 1 of the current source cell 353, and the non-inverted output Q, which is the output of the inverter 384, is supplied to the gate of the transistor 526 operating as the differential switch 2 of the current source cell 353.

As indicated by (A2) in FIG. 10A, in the glitch suppression processor 346, the inverted output xQ of each shift register 343 of the shift register unit 342 of the higher-bit controller 340 is supplied to the inverter 382. Then, the non-inverted output Q, which is the output of the inverter 382, is supplied to the gate of the transistor 524 operating as the differential switch 1 of the current source cell 355, and the inverted output xQ, which is the output of the inverter 384, is supplied to the gate of the transistor 526 operating as the differential switch 2 of the current source cell 355.

Glitch components appearing in the selection output line 396 are likely to occur in the following situation. Due to temporal variations (delay $\Delta t1$) of complementary signals input into the differential switches, as indicated by (B1) in FIG. 10B, the inputs into the transistors 524 and 526 operating as differential switches forming the current source cells 353 and 355 become at the L level and in the OFF state, and then, the transistor 524 subjected to DA conversion in the selection output line 396 is switched ON from the OFF state. In this state, glitch components are likely to occur. More specifically, when both the transistors 524 and 526 are in the OFF state, the output current from the current source cell is zero, and in this state, if the current source cell is activated to suddenly generate an output current, glitch components occur.

In contrast, if the transistors 524 and 526 operating as the differential switches of the current source cell 353 or 355 are controlled via the glitch suppression processor 336 or 346, respectively, as shown in FIG. 10A, the gate input of the transistor 526, which is the output of the inverter 384, is activated (H level) or inactivated (L level), as indicated by (B2) in FIG. 10B, after the delay Δt0 from the output of the inverter 382. Accordingly, in the process of inactivating the transistor 526 after the delay Δt0 after activating the transistor 524, when the transistors 524 and 526 are in the OFF state, it is possible to prevent the transistor 524 from being switched ON. Thus, the occurrence of glitch can be suppressed. This is because the current source cell outputs a current always via one of the switches (transistors 524 and 526).

Summary of Overall Operation

The overall operation of the DA converter 300 is summarized as follows. The DA converter 300 is operated under the control of the count clock CKdac, the input digital signal Din, and the control signals J320 supplied from the communication/timing controller 20 to the block controller 320. The block controller 320 first decodes the input digital signal Din and stops supplying the internal count clock CKcnt to the lower-bit controller 330. The block controller 320 controls DA conversion by manipulating the set signal or the reset signal supplied to the higher-bit controller 340 or the lower-bit controller 330.

More specifically, in the initial state, the block controller 320 inactivates the enable signal to gate the internal count clock CKcnt, and stops the supply of the internal count clock Ckcnt1 to the lower-bit controller 330 so that it can reset all of the D-FFs 610, which serve as scalers, and all of the shift registers 343.

Then, the communication/timing controller 20 switches OFF the reset signal and switches ON the set signal. Then, the block controller 320 activates the enable signal and supplies the internal count clock CKcnt1 to the lower-bit controller 330. As a result, the scaling processor 332 starts counting in synchronization with the internal count clock CKcnt (more specifically, the internal count clock CKcnt1 after being gated by the clock gate circuit 680) so that the outputs (non-inverted outputs Q of the D-FFs 610) of the scalers are supplied to the glitch suppression processor 336. The inverter 382 of the glitch suppression processor 336 inverts the phases and the inverter 384, which serves as a delay unit, controls the timing. Then, two clocks Q and xQ, which are complementary signals, are input into the built-in differential switches (transistors 524 and 526) of the corresponding lower-bit current source cell 353, and the lower-bit current source cell 353 weighted with $1/2^k$ (k is 1 to j) is turned ON.

Simultaneously, after the $1/2^{(j-1)}$-scaled-down clock is shaped into the shift clock CKsr by the shift controller 333, the shift clock CKsr is supplied to the shift register unit 342 of the higher-bit controller 340 and is used for switching the uniformly weighted ×1 higher-bit current source cells 355. For example, when the first shift register 343 is switched ON, the first higher-bit current source cell 355_1 is switched ON, and also, the D input terminal of the second shift register 343 is activated (H level). Then, the second shift register 343 is switched ON in response to the rising edge of the $1/2^{(j-1)}$-scaled-down clock, and thus, the second higher-bit current source cell 355_2 is switched ON.

In this manner, because of the cooperative operation of the lower-bit controller 330 and the higher-bit controller 340 based on the internal count clock CKcnt, the DA converter 300 can function as a DA conversion circuit reliably producing grayscale levels in synchronization with the internal count clock CKcnt, and generates progressively changing reference voltages with high precision.

In the above-described embodiment, to generate progressively increasing reference voltages, the selection of the current source cells 353 and 355 is controlled so that the added currents of the selected current source cells 353 and 355 are increased. However, if the selection of the current source cells 353 and 355 is controlled so that the added currents of the selected current source cells 353 and 355 are decreased, progressively decreasing reference voltages can be generated.

Layout

Figure 11A:
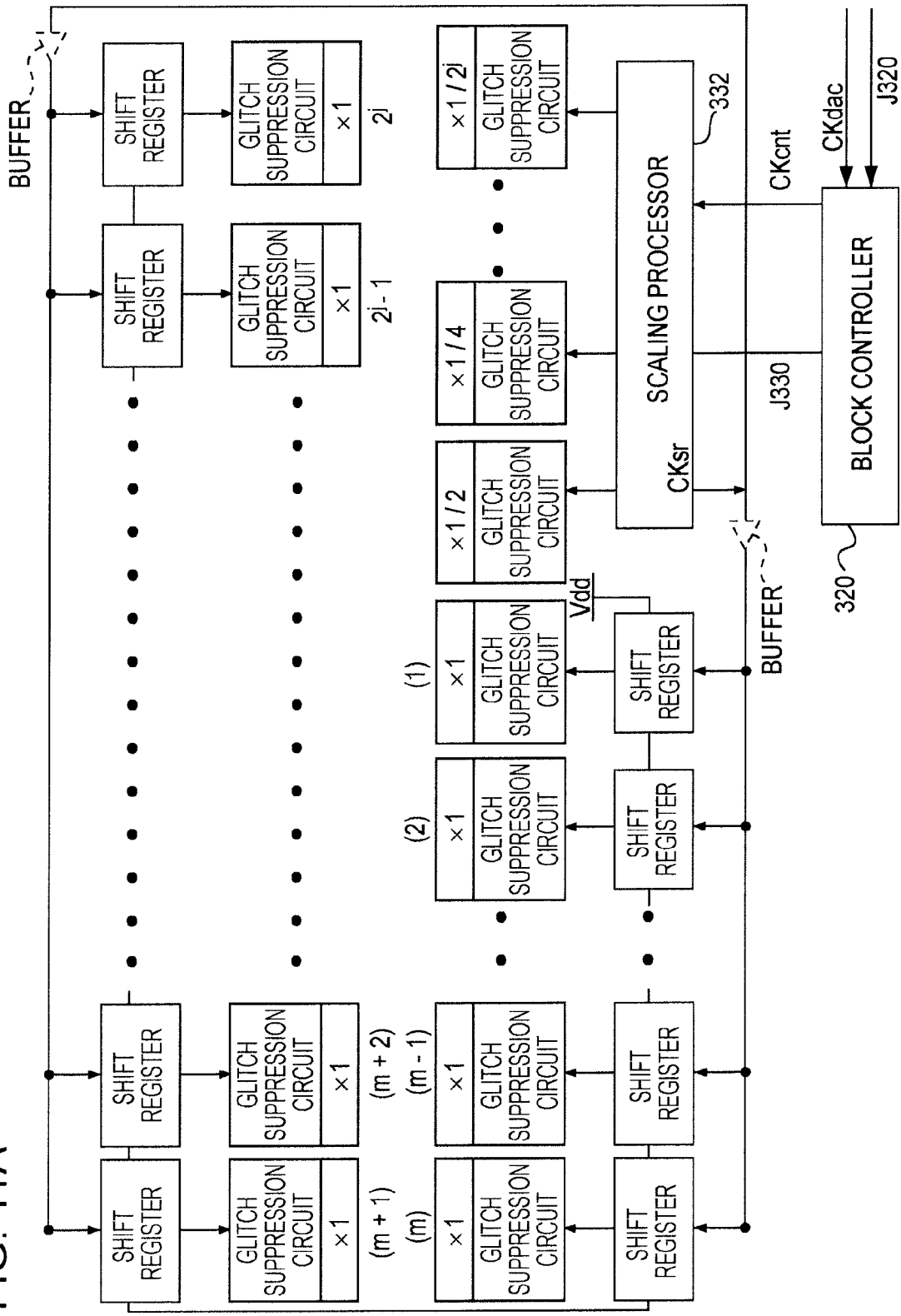
FIGS. 11A and 11B illustrate a first example of the layout of a DA converter.
Figure 11B:
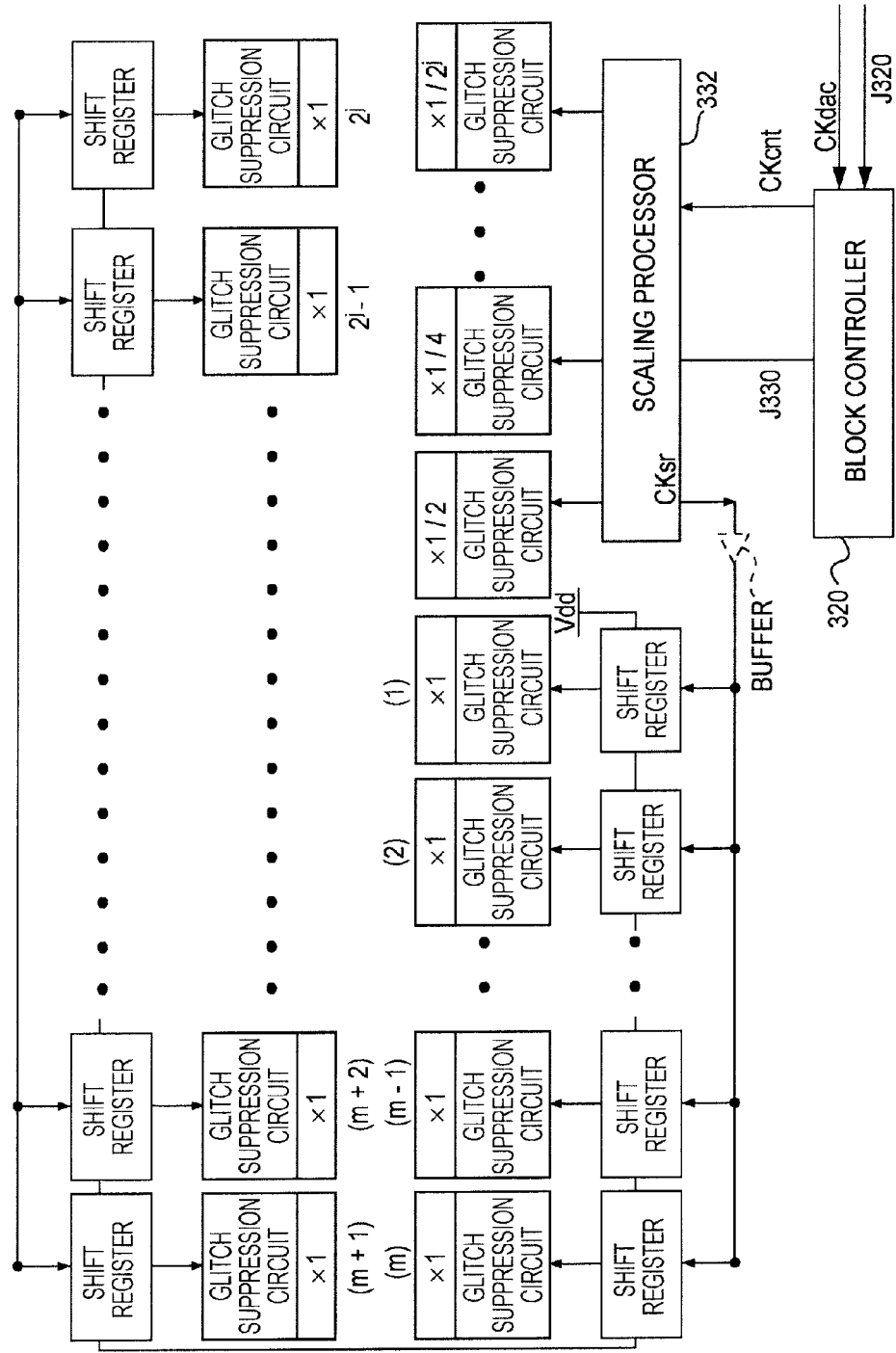

FIGS. 11A and 11B illustrate a first example of the layout of the DA converter 300. When disposing the scaling processor 332, the shift register unit 342, and the current source cells 353 and 355 on a semiconductor substrate to form the DA converter 300, clock supply delay and skewing between the shift registers 343 should be considered.

For example, if skewing occurs in the internal count clock CKcnt supplied to the scalers (in this embodiment, D-FFs 610 and the peripheral circuits thereof) of the scaling processor 332, a timing difference is generated between the scalers, and thus, the differential non linearity (DNL) characteristics are decreased. If skewing occurs in the shift clock CKsr supplied to the $2^i$ shift registers 343, the DNL exceeds one LSB and the precision of the reference voltage is deteriorated.

The occurrence of clock skewing originates from a wiring delay caused by the routing of clock signal lines. Accordingly, a wiring delay of clock signals in a digital signal processing circuit determines the operation limit of the DA converter 300 which operates in synchronization with the internal count clock CKcnt.

If there is a timing displacement in switching the current source cells 353 and 355, the DNL characteristics also decreased. The switching timing displacement originates from a wiring delay caused by the routing of signal lines of signals (scaled-down clocks and shift outputs) for switching the current source cells 353 and 355. Accordingly, as in clock skewing, a wiring delay of the switching signals in a digital signal processing circuit determines the operation limit of the DA converter 300.

Accordingly, it is necessary to consider a layout of the DA converter 300 by giving priority to the wiring of digital signals (scaled-down clocks and shift outputs) when disposing the analog current source cells 353 and 355. More specifically, to increase the speed, the first-stage shift register 343 is disposed at the position closest to the position at which the shift clock CKsr is output from the shift controller 333 of the lower-bit controller 330, and the remaining shift registers 343 are sequentially disposed in a two-dimensional matrix such that they turn around from one line to another line. As a result, clock skewing does not occur between the shift registers 343.

The shift clock CKsr is supplied to the shift registers 343 according to a tree wiring structure. Selection control signals are supplied to the glitch suppression processor 346 and the higher-bit current source cells 355 corresponding to the shift registers 343 according to an isometric wiring pattern. In the tree wiring structure, it is desirable that the lines for the shift registers 343 are routed in the same direction from the output position of the shift clock CKsr.

For example, as shown in FIG. 11A, the scaling processor 332 assigned to the lower bits, the glitch suppression processor 336, and the lower-bit current source portion 352 (lower-bit current source cells 353) are disposed at the bottom right. Then, the shift registers 343 of the shift register unit 342 assigned to the higher bits are sequentially disposed from the right to the left in the bottom line in the order of digital codes (i higher bits), and then turn around to the top line from the left to the right in the order of digital codes (i higher bits). In this manner, the shift registers 343 are disposed in the two lines in the order of digital codes.

The shift registers 343 are disposed so that the shift clock CKsr (in this embodiment, $2^{(j-1)}$-scaled-down clock) generated in the shift controller 333 of the lower-bit controller 330 can be supplied to all of the shift registers 343 in the shortest possible path. More specifically, the shift registers 343 in the bottom line are sequentially disposed from the right to the left in the order of digital codes, while the shift registers 343 in the top line are sequentially disposed from the right to the left in the order reverse to the order of the digital codes in the bottom line. If necessary, the internal count clock CKcnt may be supplied to the shift registers 343 in the bottom line and in the top line via buffers, as indicated by the broken lines in FIG. 11A. In this manner, the delay occurring in the corresponding functions can be substantially the same between the top and bottom lines. The maximum clock delay is defined by the left edge and the right edge of the same line.

In contrast, if the signal lines for the internal count clock CKcnt are routed so that the shift registers 343 are disposed in the order of digital codes both in the bottom line and in the top line, as shown in FIG. 11B, the wiring length between the wiring for supplying the internal count clock CKcnt to the first-stage shift register 343_and the wiring for supplying the internal count clock CKcnt to the final-stage shift register 343_$2^j$ is significantly increased. Accordingly, the delay difference between the two shift registers 343_1 and 343_$2^j$ is considerably increased to such a degree that the maximum clock delay is increased substantially to twice the layout shown in FIG. 11A.

The glitch suppression processor 336 and the lower-bit current source cells 353 are disposed at the bottom right at the positions closer to the corresponding scalers (in this embodiment, D-FFs 610 and the peripheral circuits thereof) of the scaling processor 332 so that the output of the scaling processor 332 can be supplied to the glitch suppression processor 336 in the shortest possible path and so that the output of the glitch suppression processor 336 can be supplied to the corresponding lower-bit current source cells 353 in the shortest possible path.

The glitch suppression processor 346 and the higher-bit current source cells 355 are disposed close to the corresponding shift registers 343 disposed in two lines so that the output of each shift register 343 of the shift register unit 342 can be supplied to the glitch suppression processor 346 in the shortest possible path and so that the output of the glitch suppression processor 346 can be supplied to the corresponding higher-bit current source cells 355 in the shortest possible path. With this arrangement, all of the current source cells 353 and 355 can be disposed in a single well.

Figure 12A:
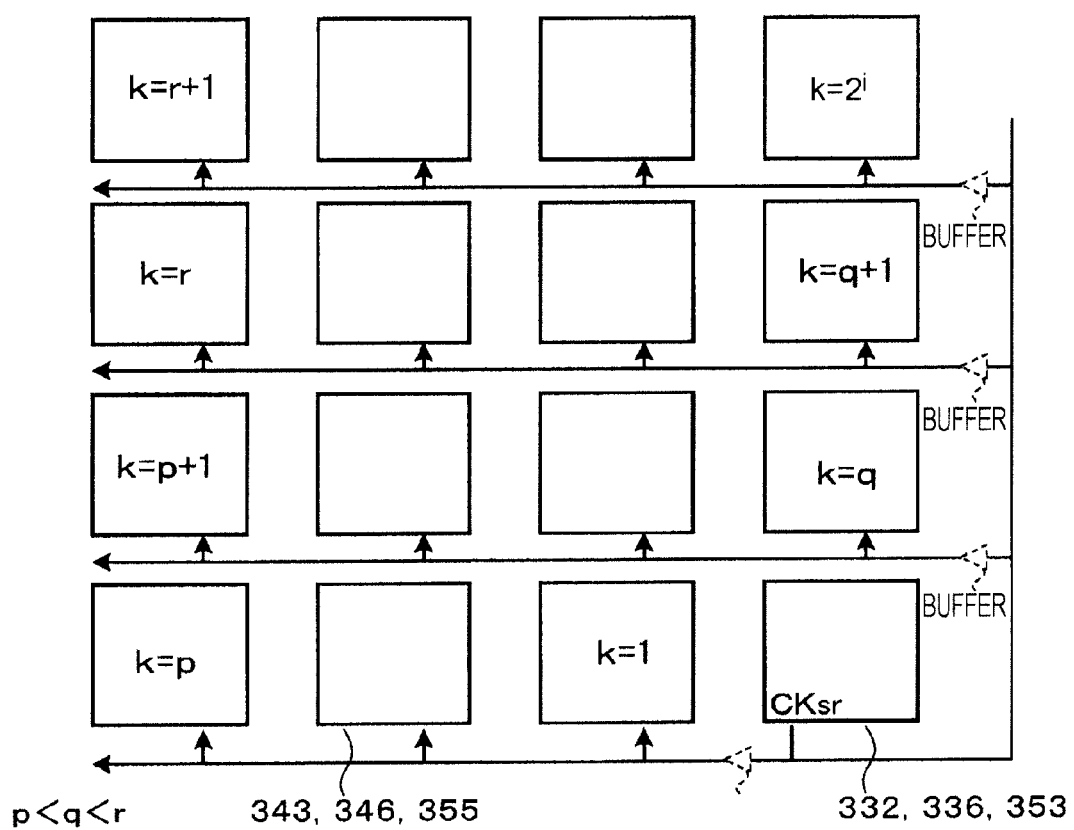
FIGS. 12A and 12B illustrate a second example of the layout of the DA converter.
Figure 12B:
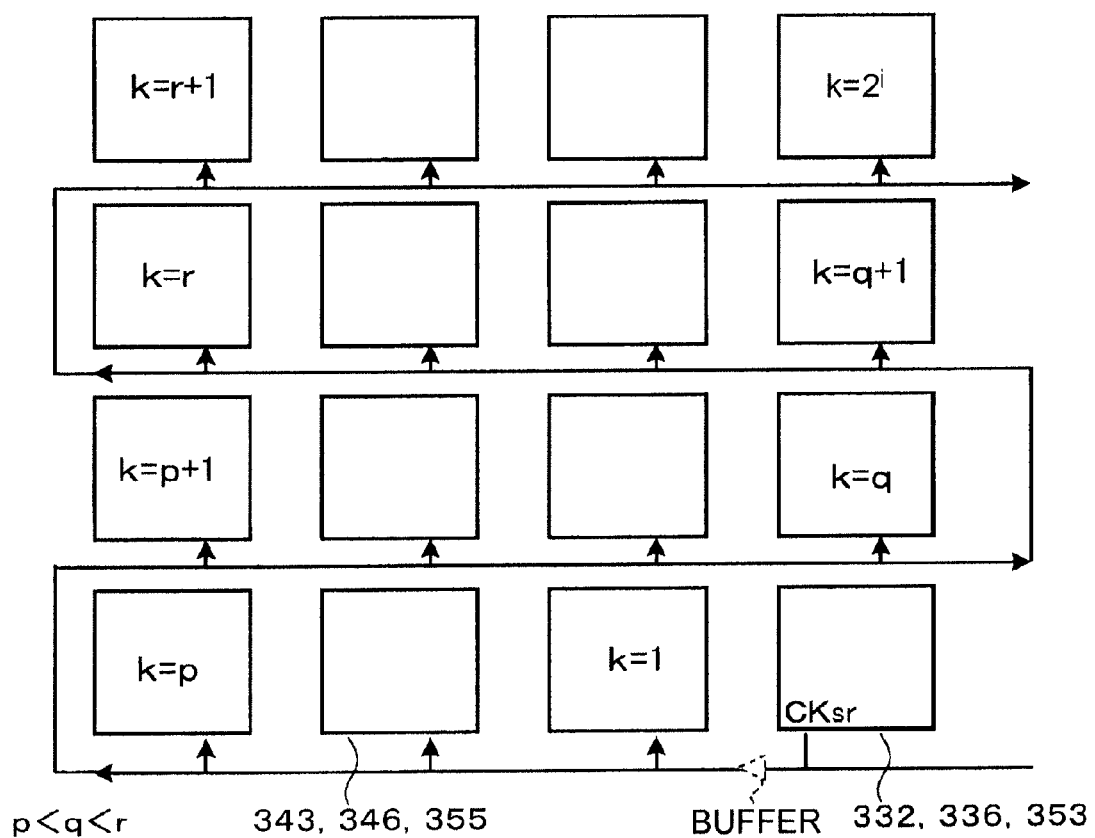

It is not essential that the shift registers 343 are disposed in two lines, and they may be disposed in four lines. FIGS. 12A and 12B illustrate a second example of the layout of the DA converter 300. As shown in FIG. 12A, the scaling processor 332 assigned to the lower bits, and the glitch suppression processor 336 and the lower-bit current source cell portion 352 (lower-bit current source cells 353) are disposed at the bottom right. Then, the shift registers 343 of the shift register unit 342 assigned to the higher bits are disposed from the right to the left in the first line from the bottom in the order of digital codes (k=1 to p), and the shift registers 343 then turn around to the second line from the bottom from the left to the right in the order of digital codes (k=p+1 to q). Then, the shift registers 343 turn around to the third line from the right to the left in the order of digital codes (k=q+1 to r). The shift registers 343 then turn around to the fourth line from the left to the right in the order of digital codes (k=r+1 to $2^i$). In this manner, the shift registers 343 are sequentially disposed in the four lines in the order of digital codes.

With this arrangement, the shift clock CKsr (in this embodiment, $2^{(j-1)}$-scaled-down clock) generated in the shift controller 333 of the lower-bit controller 330 is supplied to all the shift registers 343 in the shortest possible path. More specifically, the internal count clock CKcnt is supplied from the right to the left in each line of the shift registers 343. If necessary, the internal count clock CKcnt may be supplied to each line via a corresponding buffer, as indicated by the broken lines in FIG. 12A. Accordingly, the internal count clock CKcnt can be input into each shift register 343 with the smallest delay. In this manner, the delay occurring in the corresponding functions can be substantially the same between the individual lines. The maximum clock delay is defined by the left edge and the right edge of the same line.

In contrast, if the signal lines for the internal count clock CKcnt are routed so that the shift registers are disposed in the same direction in the order of digital codes in each line, as shown in FIG. 12B, the wiring length between the wiring for supplying the internal count clock CKcnt to the first-stage shift register 343_1 and the wiring for supplying the internal count clock CKcnt to the final-stage shift register 343_$2^j$ is significantly increased. Accordingly, the delay difference between the two shift registers 343_1 and 343_$2^j$ is considerably increased to such a degree that the maximum clock delay is increased substantially to four times the layout shown in FIG. 12A.

In this manner, because of the cooperative operation of the lower-bit controller 330 and the higher-bit controller 340 based on the internal count clock CKcnt, the desired current source cells 353 and 355 can be selected speedily and reliably. It is thus possible to provide a DA conversion circuit that can reliably produce grayscale levels in synchronization with the internal count clock CKcnt and can generate progressively changing reference voltages with high precision.

Thus, the occurrence of glitch or erroneous coding, which is caused by the independent operation for lower bits and higher bits, can be significantly reduced, and stable DA conversion can be implemented.

As a result, high-precision reference voltages, which are necessary for solid-state imaging elements, can be generated speedily. It is possible to provide a DA conversion circuit operating based on a high clock, for example, 200 MHz or 300 MHz. Although the circuit scale is similar to that of the mechanism disclosed in Japanese Unexamined Patent Application Publication No. 11-17545, a DA conversion circuit exhibiting excellent high speed performance (in this case, the reference signal is speedily changed) and DNL characteristics can be implemented.

The occurrence of glitch or a decrease in DNL characteristics presents a problem, in particular, when generating fast reference signals used for single-slope-integrating (or ramp-signal-comparison) AD conversion, which require monotonous changing characteristics (for example, a monotonous increase or a monotonous decrease). In this embodiment, the layout of the DA converter 300 that can suppress a wiring delay is employed, and the glitch suppression processors 336 and 346 are provided. Accordingly, the occurrence of glitch or a decrease in DNL characteristics can be suppressed. For example, a fast DA conversion circuit having 300 MHz can be reliably implemented.

The occurrence of erroneous coding also causes a problem. In this embodiment, however, the higher-bit current source cells 355 generating the same weighted current as the same number as digital codes are provided, and the higher-bit current source cells 355 corresponding to the higher-bit digital data of the input digital signal Din are sequentially switched ON by using the shift registers 343. Accordingly, the output voltage is sequentially changed in accordance with the bit count value, and thus, the occurrence of erroneous coding or glitch can be reliably prevented.

The lower bits of the input digital signal Din are controlled by the binary mode. The same number of current source cells 353 generating the $\frac{1}{2}^j$-weighted current as the lower bits are provided, and the current source cells 353 corresponding to the lower bits of the input digital signal Din are switched ON by using the binary outputs. Accordingly, the output voltage can be sequentially changed in accordance with the binary value, and as in the higher bits, the occurrence of erroneous coding or glitch can be reliably prevented.

That is, the DA converter 300 of this embodiment includes digital blocks using scalers and shift registers, and thus, a high-speed DA conversion circuit that can suppress the occurrence of glitch can be implemented. As a result, a high-speed high-precision operation, such as 300 MHz/12 bits output, can be implemented. The DA converter 300 is very suitable for generating reference signals used for single-slope-integrating AD conversion, which requires high-precision DNL rather than integrating non linearity (INL).

Application to Gamma Correction

Figure 13:
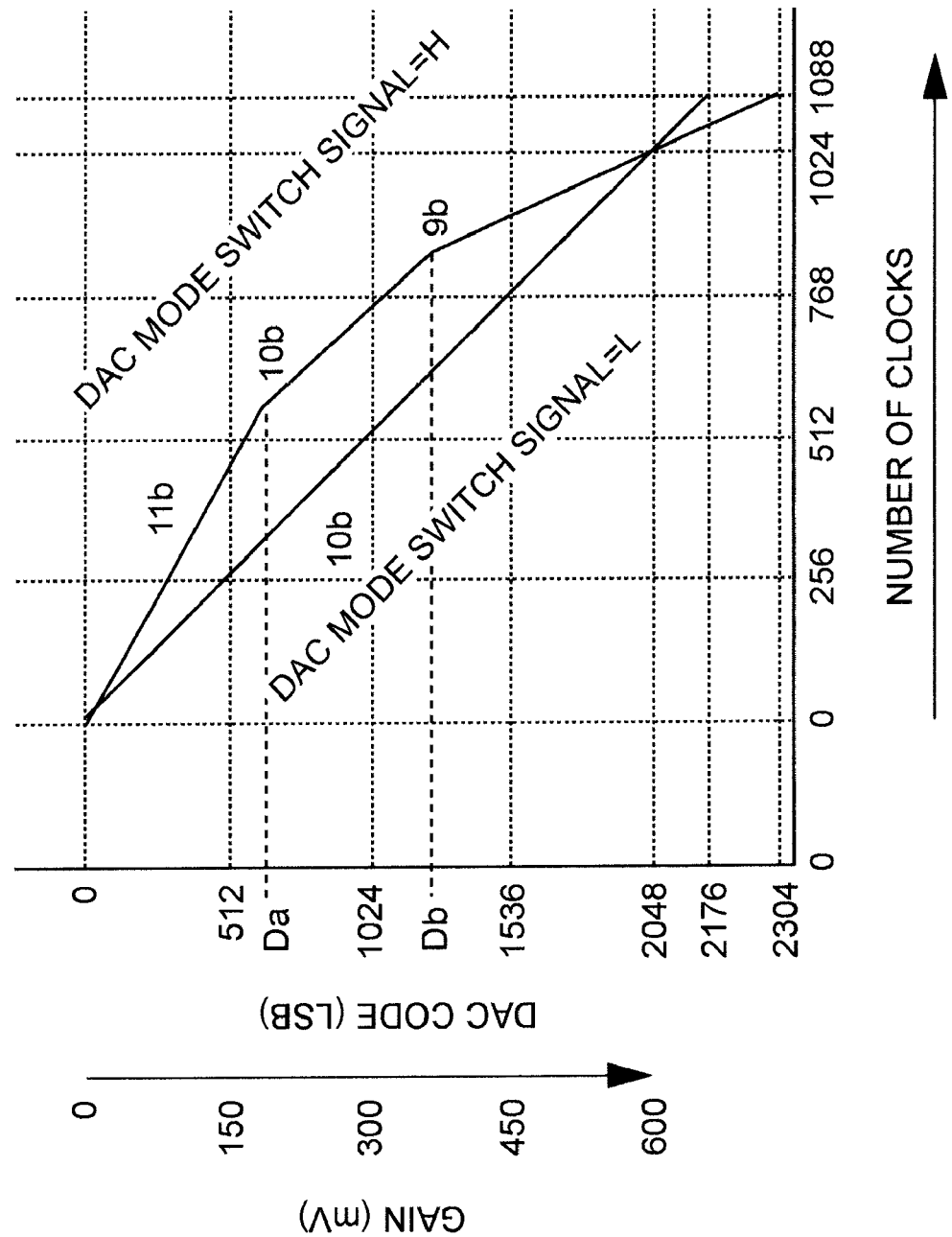
FIG. 13 illustrates the principle that the slope of a reference signal is changed.

FIG. 13 illustrates the principle that the slope of a reference signal is dynamically changed. As briefly discussed with reference to FIG. 5, by changing the clock frequency for operating the DA converter 300, a change characteristic (slope) of the DA output can be adjusted. By utilizing this characteristic, the slope of the DA output is dynamically changed while conducting AD conversion by using a reference signal generated in the DA converter 300, and then, the AD conversion result reflecting gamma (γ) correction can be obtained.

For example, based on the principle shown in FIG. 13, when the DAC mode switch signal contained in the control signal J320 supplied from the communication/timing controller 20 to the block controller 320 is at the L level, the block controller 320 constantly supplies the internal count clock CKcnt (indicated by 10b in FIG. 13) having frequency f1 to the lower-bit controller 330. In contrast, when the DAC mode switch signal is at the H level, the block controller 320 initially supplies the internal count clock CKcnt (indicated by 11b in FIG. 13) having a frequency (for example, f1/2) lower than frequency f1 to the lower-bit controller 330. Accordingly, the DAC output changes more gently (smaller slope) than that when the DAC mode switch signal is at the L level. When a DA output having a smaller slope is used as a reference signal for AD conversion, the resulting AD output data is increased. This means that AD conversion is conducted by increasing the analog gain.

Then, when the DAC code reaches a predetermined value Da, the block controller 320 supplies the internal count clock CKcnt (indicated by 10b in FIG. 13) having frequency f1 to the lower-bit controller 330. In this case, the DA output is changed with the same slope as that when the DAC mode switch signal is at the L level.

Then, when the DAC code reaches a predetermined value Db, the block controller 320 supplies the internal count clock CKcnt (indicated by 9b in FIG. 13) having a frequency (for example, 2×f1) higher than frequency f1 to the lower-bit controller 330. Accordingly, the DA output changes faster (with a larger slope) than that when the DAC mode switch signal is at the L level. When a DA output having a larger slope is used as a reference signal for AD conversion, the resulting AD output data is decreased. This means that AD conversion is conducted by decreasing the analog gain.

In this example, the DA output is progressively changed with linear characteristics. However, the frequency of the internal count clock CKcnt may be changed in more levels (more precisely) so that the DA output can be gradually and continuously changed by using a high-order function, such as a quadratic function.

Figure 14:
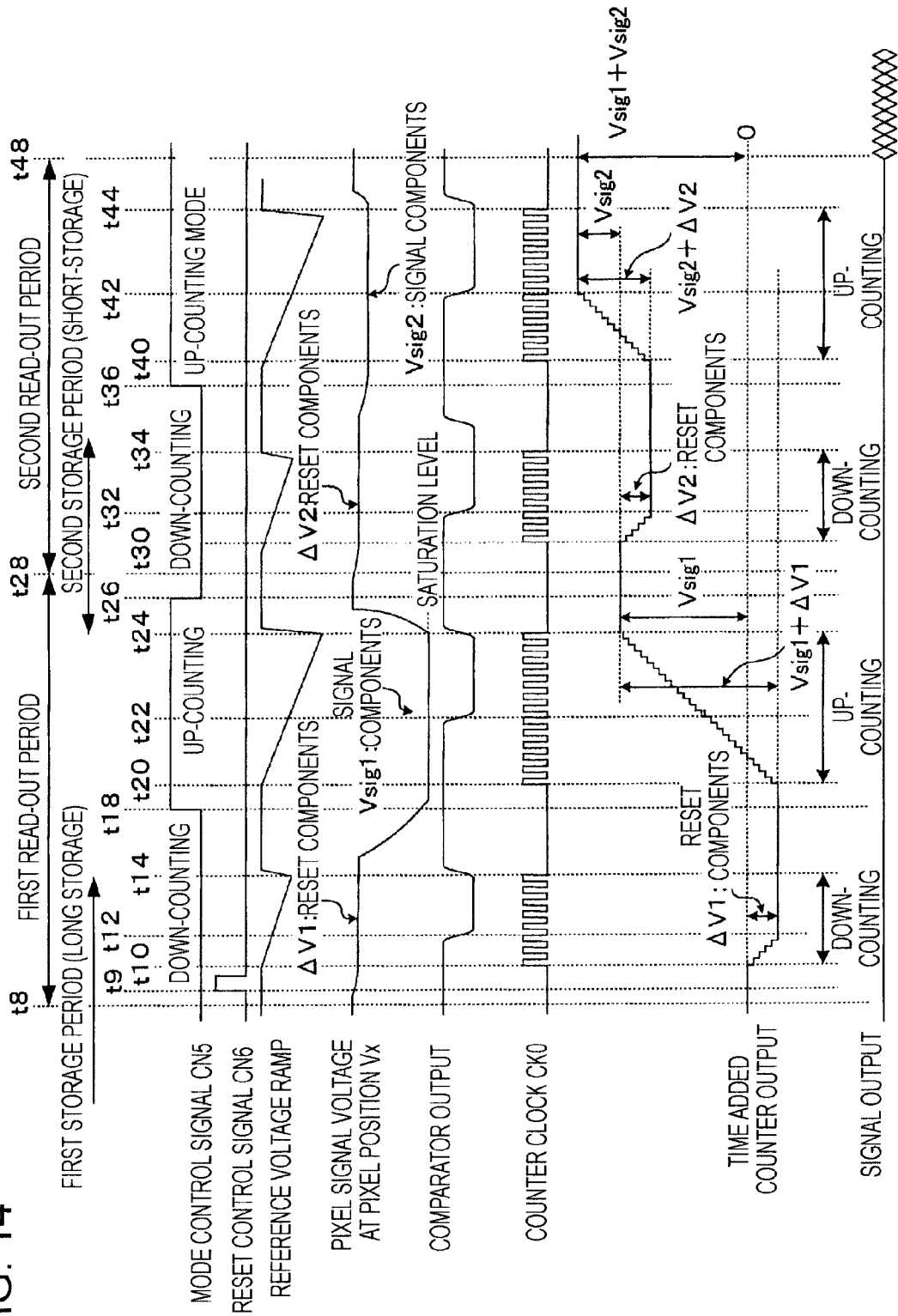
FIG. 14 illustrates an increase in the dynamic range.

FIGS. 14 and 15 illustrate examples of mechanisms based on the principle shown in FIG. 13 in the context that the dynamic range is increased by performing temporal addition processing in the column AD circuits 25 of the solid-state imaging device 1 shown in FIG. 1.

The temporal addition processing described below is characterized in that the dynamic range is increased by performing, as the product-sum operation function, the temporal addition processing. In this case, the temporal addition processing is performed for a plurality of pixel signals captured by different charge storage periods. Accordingly, a composite image as a combination of images having different charge storage periods can be obtained as a processed image. This processed image (composite image) has a wide dynamic range.

For the temporal addition processing, when images having different charge storage periods are handled, pixels subjected to addition processing should be those disposed at the same position. For a charge-storage period range, a long charge storage period is set to be generally one frame period. If an electronic shutter function is used, the long charge storage period can be decreased. In contrast, a short charge storage period is set to be one horizontal period (for example, 64 microseconds) or shorter. The reason for this is as follows. Due to the property unique to the CMOS sensors in which the charge storage period is different depending on the horizontal line due to the scanning, when reading out the pixel signals by scanning each horizontal line (scanning line), after reading the pixel signal stored for the long storage period in the same horizontal period, charge is stored for the shorter charge storage period, and then, the pixel signal stored for the shorter storage period is immediately read.

Even after reading out the n-bit digital value, the counter 254 can retain the digital value therein. In the temporal addition processing, digital addition processing is executed on a plurality of pixel signals by utilizing the retaining characteristic of the counter 254.

When performing the addition computation by using the counter 254, the combination of the counting modes for the reset components ΔV and the signal components Vsig in AD conversion for signals to be processed is set to be the same between read-out operations. That is, when performing the temporal addition processing, after completing the AD conversion for first pixels stored for a comparatively long storage period, without resetting the counter 254, the AD conversion for second pixel signals is performed for the reset components ΔV and the signal components Vsig by the same combination of the counting modes as that for the AD conversion for the first pixels stored for a comparatively long storage period. This is specifically discussed below.

As shown in FIG. 14, for the pixel signal V1 of the first pixel stored for a comparatively long period, by performing down-counting during the first read-out operation and by performing up-counting during the second read-out operation, only the electric signal components Vsig1 in accordance with the quantity of incident light on the unit pixel 3 can be extracted by the difference processing within the counter 254 (t10 to t24). The count value expressed by equation (2) retained in the counter 254 is an n-bit digital value representing the positive signal voltage Vsig1.

Also for the pixel signal V2 of the second pixel stored for a comparatively short period, down-counting is performed during the first read-out operation, and up-counting is performed during the second read-out operation. That is, AD conversion is performed by the same combination of counting modes as that for the first pixel signal V1 (t30 to t44). Accordingly, the subtraction processing expressed by equation (1) is automatically performed in the counter 254, and the resulting count value is retained in the counter 254.

AD conversion for the pixel signal V2 of the second pixel stored for a comparatively short period is performed by the same combination of the counting modes as that for the pixel signal V1 of the first pixel stored for a comparatively long period. Accordingly, the count value retained in the counter 254 becomes the n-bit digital value representing a positive voltage (Vsig2), as expressed by equation (3). Black reference components are omitted in equation (3).

$$\begin{aligned}&(\text{Count value in the second comparison period}) - \\ &\quad (\text{count value in the first comparison period}) = \\ &\quad -(\text{signal components } Vsig2 + \text{reset components } \Delta V2 + \\ &\quad \text{offset components in the column } AD \text{ circuit } 25) + \\ &\quad (\text{reset components } \Delta V2 + \text{offset components in the} \\ &\quad \text{column } AD \text{ circuit } 25) = -(\text{signal components } Vsig2)\end{aligned} \quad (3)$$

Upon completing the second counting operation on the pixel signal V1 of the first pixel stored for a comparatively long period, the first up-counting operation on the pixel signal V2 of the second pixel stored for a comparatively short period is started without resetting the count value retained in the counter 254. Then, the count value expressed by equation (2) is added to the count value expressed by equation (3).

Accordingly, the count value retained in the counter 254 after completing the second counting operation on the pixel signal V2 of the second pixel stored for a comparatively short period is the n-bit digital value representing the addition computation result (Vsig1+Vsig2) between the two pixel signals V1 and V2, as expressed by equation (4).

$$\begin{aligned}&\text{The count value for the first pixel signal} + \\ &\quad (\text{second comparison period}) - (\text{first comparison period}) = \\ &\quad (\text{signal components } Vsig + \text{reset components } \Delta V + \\ &\quad \text{offset components in the column } AD \text{ circuit } 25) + \\ &\quad (\text{reset components } \Delta V + \text{offset components} \\ &\quad \text{in the column } AD \text{ circuit } 25) = \\ &\quad (\text{signal components } Vsig1) + (\text{signal components } Vsig2)\end{aligned} \quad (4)$$

At a predetermined timing (t48) after the completion of the AD conversion for a plurality of pixel signals having different charge storage periods, the communication/timing controller 20 instructs the horizontal scanning circuit 12 to read out the pixel data. In response to this instruction, the horizontal scanning circuit 12 sequentially shifts the horizontal selection signals CH(i) to be supplied to the counters 254 via the control lines 12c.

Then, the count value expressed by equation (4) stored/retained in the counter 254, i.e., the n-bit digital data representing the addition result (Vsig1+Vsig2) between the two pixel signals V1 and V2, can be sequentially output to the outside the column processor 26 or the outside the chip having the pixel portion 10 from the output terminal 5c via the n horizontal signal lines 18. Thereafter, the operation is similarly repeated for pixel signals of another row. As a result, computed data D2 representing the two-dimensional addition image indicating the addition computation result between a plurality of pixel signals having different storage periods can be obtained.

It is now assumed that the dynamic range of the image sensor is 60 dB and that the long charge storage period is set to be about one frame period, for example, about $1/15$ milliseconds, and the short charge storage period is set to be one horizontal period or shorter, about $1/15$ microseconds. In this case, the sensor output with respect to the light quantity for the long storage period changes up to three orders of magnitudes in accordance with a change in the light quantity. The sensor output with respect to the light quantity for the short storage period also changes up to three orders of magnitudes. However, the light quantity detected by the pixels stored for the short storage period differs from that by the pixels stored for the long storage period by three orders of magnitudes.

According to the addition processing result (Vsig1+Vsig2) obtained by adding the outputs in the first and second different storage periods, the dynamic range of six orders of magnitudes, i.e., 120 dB, can be implemented. For example, an image having saturated portions detected by the long storage period can be compensated for by an image detected by the short storage period. Thus, the image portions at the saturation level or higher that are difficult to output only by one storage period can be reproduced.

The "one field period" is a period in which an image is read by two-dimensionally scanning the imaging plane (more specifically, one vertical scanning period), and the "one frame period" is a period necessary for forming an image by all pixels on the imaging plane. When sequential scanning (progressive scanning) for scanning all rows is performed in the vertical direction, the "one field period" is equal to the "one frame period". In contrast, when interlaced scanning is performed in which some rows are sequentially scanned in the vertical direction in the first vertical scanning operation and the remaining rows are scanned in the vertical direction in the second vertical scanning operation, "k fields" are equal to "one frame". "k" indicates the number of scanning operations, and normally, k is 2. Regardless of the progressive scanning or the interlaced scanning, one vertical scanning period for reading an image by two-dimensionally scanning the imaging plane may be referred to as "one frame" in a broad sense. In this specification, the frame in the following description means the frame in a broad sense.

In actuality, if addition processing, such as that shown in FIG. 14, is simply performed, it is difficult to achieve the ideal knee characteristic in which the sensor output with respect to the light quantity matches the luminosity. That is, the sensor output does not match the human visual characteristic in which the brightness is identified in proportion to the logarithm of the light quantity.

To solve this problem, it is preferable that, by considering the luminosity, the amount by which the reference signal used for comparison processing is changed over time is adjusted so that the coefficient for image signals subjected to addition processing is set. Particularly, it is preferable that the amount by which the reference signal is changed over time is adjusted for images obtained under a comparatively short storage period. Then, the luminosity can be adjusted without causing saturation of high level signals that would be saturated under the condition of a normal storage period.

More specifically, when conducting AD conversion for pixel signals stored for the short storage period, as shown in FIG. 15, the slope of the reference signal RAMP generated by the reference signal generator 27 is preferably changed in several levels instead of being changed linearly. Alternatively, instead of changing the slope of the reference signal RAMP in different levels while maintaining the linearity, it may be continuously and progressively changed by using a high-order function, such as a quadric function.

In this case, in accordance with the logarithmic characteristic of the human eye, the grayscale precision in a dark place is maintained so that the human eye is sensitive to a change in the brightness in a dark place, and the grayscale precision in a bright place is decreased so that the human eye is dull to a change in the brightness in a bright place. More specifically, it is preferable that the slope of the reference potential RAMP is set to be smaller at the initial stage of the AD conversion so that the factor can be large (higher gain), and as the AD conversion proceeds, the slope of the reference potential RAMP is increased. With this arrangement, the knee characteristic in which a high luminance range is compressed in accordance with the luminous characteristic of the human can be achieved.

To achieve this characteristic, for example, the cycle of the count clock CKdac to be supplied to the DA conversion circuit 27a of the reference signal generator 27 is progressively facilitated while the DA conversion circuit 27a reduces the voltage for each clock pulse by ΔRAMP. For example, the communication/timing controller 20 supplies a clock which is scaled down from the reference clock CKdac by the factor of 1/ma (for example, ½) to the reference signal generator 27 from time t40 to time Ta so that a potential having a straight line y1 (corresponding to 11b in FIG. 13) with a factor ma (for example, 2) is supplied. Then, from time Ta to time Tb, the communication/timing controller 20 supplies the reference count clock CKdac so that a potential having a straight line y2 (corresponding to 10b in FIG. 13) is supplied, and after time Tb, the communication/timing controller 20 supplies a clock which is scaled up from the reference count clock CKdac by the factor of mb (for example, 2) so that a potential having a straight line y3 (corresponding to 9b in FIG. 13) with a factor 1/mb (for example, ½) is supplied.

Alternatively, while setting the cycle of the count clock CKdac supplied to the DA conversion circuit 27a of the reference signal generator 27 to be constant, the counter output value x and the slope (rate of change) β contained in the control data CN4 are progressively adjusted. For example, from time t40 to time Ta, the potential calculated by $y1=\alpha1$ (initial value)$-\beta1^*x$ is output. From time Ta to time Tb, the potential calculated by $y2=a2$ (initial value)$-\beta2^*x$ is output. After time Tb, the potential calculated by $y3=a3$ (initial value)$-\beta3^*x$ is output. It should be noted that $\alpha1<a2<\alpha3$, for example, ½:1:2, and $\beta1<\beta2<\beta3$.

With this arrangement, γ correction is conducted by providing high gain components in the short storage period and by providing low gain components in the high luminance range, that is, the knee characteristic in which the high luminance range can be compressed in accordance with the luminous characteristic of the human can be achieved.

Although in any of the above-described examples the reference signal RAMP is changed linearly or by polygonal lines, it may be changed non-linearly, such as exponentially or by using a quadric function.

As described above, as the application of the temporal addition processing, the following operation is performed. When conducting AD conversion by performing the counting operation for a plurality of pixel signals having different charge storage periods at the same position, digital data obtained for one of the pixel signals is used as the initial value for the counting operation for the other pixel signal (pixel signal to be subjected to the second counting operation). Accordingly, after conducting AD conversion by performing the counting operation for the other pixel signal, n-bit digital data indicating the addition computation result for all the pixel signals can be automatically obtained and output as the computed data D2. In this embodiment, as the computed data D2, a signal output which is not easily saturated for a larger light quantity can be obtained, and data that can increase the dynamic range can be obtained. The bit width of the digital image data can be maintained to n bits while implementing a wide dynamic range, in other words, the bit width can be compressed. Accordingly, an image having a wide dynamic range in accordance with the light quantity while suppressing the overexposed highlight or the underexposed shadow can be obtained.

Without additional circuits, such as an adder and a line memory device, digital-value addition processing for a plurality of pixel signals having different charge storage periods at the same position can be performed according to the on-chip method. Since images having different storage periods can be combined as a digital value, the wide dynamic range can be implemented with a simple structure without the need to add external circuits, such as a frame memory, or internal circuits.

In the same horizontal period, after reading out a pixel signal stored for a long storage period, charge is stored for a short storage period, and then, the pixel signal stored for the short storage period is read. Accordingly, the long-period storage signal and the short-period storage signal are sequentially output substantially at the same timing, thereby eliminating the need to provide a memory for synchronizing the two signals with each other.

Since the dynamic range is increased by combining two pixel signals having different storage periods (if necessary, the number of pixel signals having different storage periods may be increased), a device having a normal pixel structure can be used without the need for a dedicated pixel structure, such as an inter-pixel memory. Thus, the type of sensor device is not restricted.

As described above, if the slope of the reference signal RAMP generated by the reference signal generator 27 is progressively changed when single-slope-integrating AD conversion is conducted, a wide dynamic range can be implemented by combining different storage periods, and also, γ correction can be made to the sensitivity characteristic, thereby implementing a more natural composite image. The difference in the sensitivity caused by the different storage periods can be naturally compensated for, and a more natural image can be synthesized.

It should be understood by those skilled in the art that various modifications, combinations, sub-combinations and alterations may occur depending on design requirements and other factors insofar as they are within the scope of the appended claims or the equivalents thereof.

For example, in the foregoing embodiment, although AD conversion functions are disposed in the column regions located at positions to read out signals from the pixel portion 10, they may be provided at another portion. For example, analog pixel signals may be output to the horizontal signal line 18, and then, they are converted into digital signals and are delivered to the output circuit 28.

In the aforementioned embodiment, the counting operation after switching the counting modes is started from the final count value before switching the counting modes. In this case, a special arrangement is not necessary for switching the modes if an up/down counter for outputting the count value in synchronization with the count clock CK0 is used.

However, if an asynchronous up/down counter suitable for a fast operation since the operation limit frequency is determined by only the limit frequency of the first flip-flop (counter basic element) is used, the count value is lost when switching the counting modes, and thus, it is difficult to perform the correct counting operation while maintaining the same value before and after switching the counting modes. Accordingly, an adjustment processor for allowing the counting operation after switching the counting modes to start from the count value before switching the counting modes is preferably disposed. Details of the adjustment processor are not given here. If addition processing between a plurality of signals is performed, the counting modes are the same for the first and second counting operations, and thus, the above-described arrangement is not necessary.

In the above-described embodiment, concerning a pixel in which the signal components Vsig appear after the reset components $\Delta V$ (reference components) in the time sequential order, and the second-stage processor processes a signal having a positive sign (a signal having a higher level has a greater positive value), and then, true components of the pixel are determined. In this case, as the first processing operation, the comparison processing and the down-counting operation are performed for the reset components $\Delta V$ (reference components), and as the second processing operation, the comparison processing and the up-counting operation are performed for the signal components Vsig. However, regardless of the time-sequential order in which the reference components and the signal components appear, the combination of the signal components and the counting mode and the processing order are arbitrary. Depending on the processing order, the digital data obtained as a result of the second operation may be a negative value. In this case, sign inversion or correction computation can be performed.

According to the device architecture of the pixel portion 10 in which the reset components $\Delta V$ (reference components) should be read after the signal components Vsig and in which the second-stage processor processes signals having positive signs, it is more efficient to perform the comparison processing and the down-counting operation for the signal components Vsig as the first operation and to perform the comparison processing and the up-counting operation for the reset components $\Delta V$ (reference components) as the second operation.

In the foregoing embodiment, assuming that signal components Vsig appear after reset components $\Delta V$ (reference components) for the same pixel, difference processing for finding true signal components is performed when performing the addition computation between a plurality of pixel signals having different storage periods. If only signal components Vsig can be subjected to the processing without considering the reset components $\Delta V$ (reference components), the difference processing for finding the true signal components can be omitted.

In the aforementioned embodiments, regardless of the operation mode, the up/down counter is used in common to perform the counting operation by switching the operation modes. The counter is not restricted to an up/down counter that can switch the modes as long as it performs the counting operation by a combination of the down-counting mode and the up-counting mode.

In the foregoing embodiments, NMOS or PMOS unit pixels disposed in a matrix are used for a sensor. However, the sensor is not restricted to this type, and a line sensor may be used, in which case, operations and advantages similar to those of the above-described embodiments can be achieved.

In the above-described embodiments, as a solid-state imaging device that can selectively read signals from desired unit pixels by address control, a CMOS sensor provided with a pixel portion that generates signal charge by receiving light is used. The generation of signal charge is not restricted to light, but may be to electromagnetic waves in general, such as infrared, ultraviolet, or X rays. The above-described features disclosed in the foregoing embodiment can be applied to a semiconductor device having unit elements in which many devices for outputting an analog signal in accordance with the quantity of electromagnetic waves are disposed.

The solid-state imaging device described above may be a one-chip type or a module type obtained by a combination of a plurality of chips and having an imaging function. In addition, the solid-state imaging device may be used for an electronic apparatus, such as a camera or a cellular telephone, having an imaging function.

By using a one-chip type or a module type, when implementing a function of generating image signals, the functions necessary for controlling the operations of the comparators and the counters can be collectively handled, thereby facilitating the handling or management of the components. Additionally, since the elements necessary for AD conversion are integrated as an IC or a module, the manufacturing of electronic apparatuses as finished products can be facilitated.

A CMOS-type solid-state imaging device which is responsive to electromagnetic waves, such as light or radiation, input from an external source, has been discussed by way of example. However, the mechanism discussed in the foregoing embodiment can be applied to any type of device that detects a physical quantity distribution. The mechanism for converting analog signals into digital signals can be used for a device for detecting a physical quantity distribution other than light, for example, for a fingerprint authentication device (see, for example, Japanese Unexamined Patent Application Publication Nos. 2002-7984 and 2001-125734) that detects fingerprint images based on fingerprint information in accordance with a change in electric characteristics or optical characteristics caused by a pressure.

What is claimed is:
1. A digital-to-analog conversion device comprising:
a higher-bit current source cell portion including a plurality of higher-bit current source cells that are uniformly weighted to generate an identical constant current;
a lower-bit current source cell portion including a plurality of lower-bit current source cells that are weighted to generate constant currents which are 1/two-to-the-power-of-certain-numbers of the constant current generated by the higher-bit current source cells; and a constant current source selection controller operable to select the higher-bit current source cells of the higher-bit current source cell portion and the lower-bit current source cells of the lower-bit current source cell portion in accordance with a data value of a digital input signal, wherein the constant current source selection controller includes a lower-bit controller and a higher-bit controller, and the lower-bit controller includes a scaler that performs a scaling operation based on an input count clock and uses clocks scaled down to 1/two-to-the-power-of-certain-numbers obtained by the scaling operation as a selection control signal to select the lower-bit current source cells weighted with current values corresponding to the clocks scaled down to 1/two-to-the-power-of-certain-numbers, and the higher-bit controller includes the same number of shift registers as the number of the higher-bit current source cells and uses, as a shift clock, a signal indicating a carry bit or a borrow bit used in the scaling operation controlled by the lower-bit controller to sequentially activate shift outputs of the shift registers, and uses the shift outputs as a selection control signal to select the higher-bit current source cells, and wherein constant current outputs of the selected lower-bit current source cells and the higher-bit current source cells are added and output so that an output current corresponding to the digital input signal is obtained.

2. The digital-to-analog conversion device according to claim 1, wherein the higher-bit current source cell portion includes the number of the higher-bit current source cells corresponding to the data value of the higher bits of the digital input signal, and the lower-bit current source cell portion includes the number of the lower-bit current source cells corresponding to the bit number of the lower bits of the digital input signal.

3. The digital-to-analog conversion device according to claim 2, wherein the higher-bit controller stops a shift operation performed by the shift registers when the shift output of the shift register reaches the data value of the higher bits of the digital input signal.

4. The digital-to-analog conversion device according to claim 3, wherein the lower-bit controller stops the scaling operation performed by the scaler when the clock scaled down to 1/two-to-the-power-of-certain-number reaches the bit number of the lower bits of the digital input signal.

5. The digital-to-analog conversion device according to claim 1, wherein each of the lower-bit current source cells and the higher-bit current source cells includes a constant current source and a differential switch that switches an output current of the constant current source based on a complementary signal, and at least one of the higher-bit controller and the lower-bit controller includes delay means for inverting the logical level of an input signal to generate an inverted signal and for delaying the inverted signal by a predetermined period, and means for supplying the input signal that is not delayed by the delay means and the inverted signal that is delayed by the delay means to the differential switch as the complementary signal.

6. The digital-to-analog conversion device according to claim 1, wherein the shift register at a first stage is disposed near a position at which the shift clock is output from the lower-bit controller, and the remaining shift registers are disposed in a two-dimensional matrix such that they turn around from one line to another line.

7. The digital-to-analog conversion device according to claim 6, wherein the length of a wiring pattern between each of the shift registers and the other shift registers is the same according to an isometric wiring pattern.

8. An analog-to-digital conversion device comprising:

a reference signal generator operable to generate a reference signal for converting an analog signal into a digital signal;

a comparator operable to compare the analog signal with the reference signal generated by the reference signal generator; and a counter operable to perform a counting operation with a predetermined count clock, simultaneously with a comparison operation performed by the comparator, and to store a count value at a time when the comparison operation is finished, wherein the reference signal generator includes a higher-bit current source cell portion including a plurality of higher-bit current source cells that are uniformly weighted to generate an identical constant current, a lower-bit current source cell portion including a plurality of lower-bit current source cells that are weighted to generate constant currents which are 1/two-to-the-power-of-certain-numbers of the constant current generated by the higher-bit current source cells, and a constant current source selection controller operable to select the higher-bit current source cells of the higher-bit current source cell portion and the lower-bit current source cells of the lower-bit current source cell portion in accordance with a data value of a digital input signal, wherein the constant current source selection controller includes a lower-bit controller and a higher-bit controller, and the lower-bit controller includes a scaler that performs a scaling operation based on an input count clock and uses clocks scaled down to 1/two-to-the-power-of-certain-numbers obtained by the scaling operation as a selection control signal to select the lower-bit current source cells weighted with current values corresponding to the clocks scaled down to 1/two-to-the-power-of-certain-numbers, and the higher-bit controller includes the same number of shift registers as the number of the higher-bit current source cells and uses, as a shift clock, a signal indicating a carry bit or a borrow bit used in the scaling operation controlled by the lower-bit controller to sequentially activate shift outputs of the shift registers, and uses the shift outputs as a selection control signal to select the higher-bit current source cells, and wherein constant current outputs of the selected lower-bit current source cells and the higher-bit current source cells are added and output so that an output current corresponding to the digital input signal is obtained.

9. A physical-quantity-distribution detecting semiconductor device comprising:

an effective area including, in a unit element, a charge generator that generates charge in response to an incident electromagnetic wave and a unit signal generator that generates an analog unit signal corresponding to the charge generated by the charge generator;

a reference signal generator operable to generate a reference signal for converting the analog unit signal into a digital signal;

a comparator operable to compare the analog signal with the reference signal generated by the reference signal generator; and a counter operable to perform a counting operation with a predetermined count clock, simultaneously with a comparison operation performed by the comparator, and to store a count value at a time when the comparison operation is finished, the reference signal generator, the comparator, and the counter operating as function elements for converting the analog unit signal into the digital signal, wherein the reference signal generator includes a higher-bit current source cell portion including a plurality of higher-bit current source cells that are uniformly weighted to generate an identical constant current, a lower-bit current source cell portion including a plurality of lower-bit current source cells that are weighted to generate constant currents which are 1/two-to-the-power-of-certain-numbers of the constant current generated by the higher-bit current source cells, and a constant current source selection controller operable to select the higher-bit current source cells of the higher-bit current source cell portion and the lower-bit current source cells of the lower-bit current source cell portion in accordance with a data value of a digital input signal, wherein the constant current source selection controller includes a lower-bit controller and a higher-bit controller, and the lower-bit controller includes a scaler that performs a scaling operation based on an input count clock and uses clocks scaled down to 1/two-to-the-power-of-certain-numbers obtained by the scaling operation as a selection control signal to select the lower-bit current source cells weighted with current values corresponding to the clocks scaled down to 1/two-to-the-power-of-certain-numbers, and the higher-bit controller includes the same number of shift registers as the number of the higher-bit current source cells and uses, as a shift clock, a signal indicating a carry bit or a borrow bit used in the scaling operation controlled by the lower-bit controller to sequentially activate shift outputs of the shift registers, and uses the shift outputs as a selection control signal to select the higher-bit current source cells, and wherein constant current outputs of the selected lower-bit current source cells and the higher-bit current source cells are added and output so that an output current corresponding to the digital input signal is obtained.

\* \* \* \* \*